United States Patent
Colles et al.

(10) Patent No.: US 12,149,048 B2
(45) Date of Patent: Nov. 19, 2024

(54) CONFIGURABLE HIGH-FREQUENCY PULSED LASER DIODE DRIVER CAPACITOR REFRESH CIRCUIT

(71) Applicant: Silanna Asia Pte Ltd, Singapore (SG)

(72) Inventors: Joseph H. Colles, Bonsall, CA (US); Steven E. Rosenbaum, San Diego, CA (US); Stuart B. Molin, Carlsbad, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 18/392,406

(22) Filed: Dec. 21, 2023

(65) Prior Publication Data

US 2024/0146022 A1 May 2, 2024

Related U.S. Application Data

(63) Continuation of application No. 17/653,349, filed on Mar. 3, 2022, now Pat. No. 11,894,656.

(51) Int. Cl.
*H01S 5/042* (2006.01)
*H03K 17/687* (2006.01)
*H03K 19/20* (2006.01)

(52) U.S. Cl.
CPC ....... *H01S 5/0428* (2013.01); *H03K 17/6871* (2013.01); *H03K 19/20* (2013.01)

(58) Field of Classification Search
CPC .................................................. H01S 5/06216
USPC ....................................................... 372/38.02
See application file for complete search history.

(56) References Cited

U.S. PATENT DOCUMENTS

| | | |
|---|---|---|
| 3,944,854 A | 3/1976 | Keller |
| 4,075,536 A | 2/1978 | Stevens |
| 4,146,830 A | 3/1979 | Foster |
| 5,287,375 A | 2/1994 | Fujimoto |
| 5,895,984 A | 4/1999 | Renz |
| 5,978,393 A | 11/1999 | Feldman et al. |
| 8,564,252 B2 | 10/2013 | Raimar et al. |

(Continued)

FOREIGN PATENT DOCUMENTS

| | | |
|---|---|---|
| JP | 2016096221 A | 5/2016 |
| KR | 20150105889 A | 9/2015 |

OTHER PUBLICATIONS

International Search Report and Written Opinion dated Dec. 10, 2021 for PCT Patent Application No. PCT/IB2021/058143.

(Continued)

*Primary Examiner* — Tuan N Nguyen
(74) *Attorney, Agent, or Firm* — MLO, a professional corp.

(57) ABSTRACT

A pulsed laser diode driver includes a refresh circuit configured to generate a refresh current using a received input voltage. A current amplitude of the refresh current is controlled by the refresh circuit based on a voltage level of a source voltage received by the refresh circuit. A source capacitor of the pulsed laser diode driver is configured to receive the refresh current and to develop the source voltage therefrom. An inductor of the pulsed laser diode driver has a first terminal that is directly electrically connected to the source capacitor. One or more switches of the pulsed laser diode driver are configured to control a current flow through the inductor to produce a high-current pulse through a laser diode that corresponds to a peak current of a resonant waveform developed at an anode of the laser diode.

12 Claims, 39 Drawing Sheets

(56) References Cited

U.S. PATENT DOCUMENTS

| | | |
|---|---|---|
| 9,048,675 B2 | 6/2015 | Yang et al. |
| 9,368,936 B1 | 6/2016 | Lenius et al. |
| 10,008,941 B1* | 6/2018 | Radic ............... H02M 1/32 |
| 2003/0016711 A1 | 1/2003 | Crawford |
| 2004/0202216 A1 | 10/2004 | Fairgrieve |
| 2005/0185428 A1 | 8/2005 | Crawford et al. |
| 2005/0243879 A1 | 11/2005 | Horiuchi et al. |
| 2009/0161707 A1 | 6/2009 | Champion et al. |
| 2010/0283322 A1 | 11/2010 | Wibben |
| 2011/0085576 A1 | 4/2011 | Crawford et al. |
| 2011/0291578 A1 | 12/2011 | Philippbar et al. |
| 2012/0189028 A1* | 7/2012 | Hoffman ............ H01S 5/0428 |
| | | 372/38.07 |
| 2014/0009952 A1 | 1/2014 | Nomura et al. |
| 2016/0344156 A1 | 11/2016 | Rothberg et al. |
| 2017/0085057 A1 | 3/2017 | Barnes et al. |
| 2017/0223788 A1 | 8/2017 | Jämsä et al. |
| 2017/0244212 A1 | 8/2017 | Burkholder |
| 2018/0261975 A1 | 9/2018 | Pavlov et al. |
| 2018/0278017 A1 | 9/2018 | Mignoli et al. |
| 2018/0323576 A1 | 11/2018 | Crawford et al. |
| 2019/0386460 A1 | 12/2019 | Barnes et al. |
| 2020/0067269 A1 | 2/2020 | Eggermont |
| 2020/0119518 A1* | 4/2020 | Crawford ............. H03K 17/691 |
| 2021/0050708 A1 | 2/2021 | Yu et al. |
| 2021/0066885 A1 | 3/2021 | Kuo et al. |
| 2021/0305770 A1 | 9/2021 | Colles et al. |

OTHER PUBLICATIONS

International Search Report and Written Opinion dated Jul. 19, 2021 for PCT Patent Application No. PCT/IB2021/052368.

International Search Report and Written Opinion dated Jun. 1, 2023 for PCT Patent Application No. PCT/IB2023/051638.

Notice of Allowance and Fees dated Sep. 14, 2021 for U.S. Appl. No. 17/301,009.

Notice of Allowance and Fees dated Sep. 28, 2023 for U.S. Appl. No. 17/653,349.

* cited by examiner

| | $M_{BP}$ | $M_{DL}$ | |
|---|---|---|---|
| Precharge$^n$ | OFF | OFF | ← 301 |
| Preflux$^n$ | ON | ON | ← 302 |
| Pulse Generation$^n$ | OFF | ON | ← 303 |
| Discharge$^n$ | ON | ON | ← 304 |
| Precharge$^{n+1}$ | OFF | OFF | ← 305 |

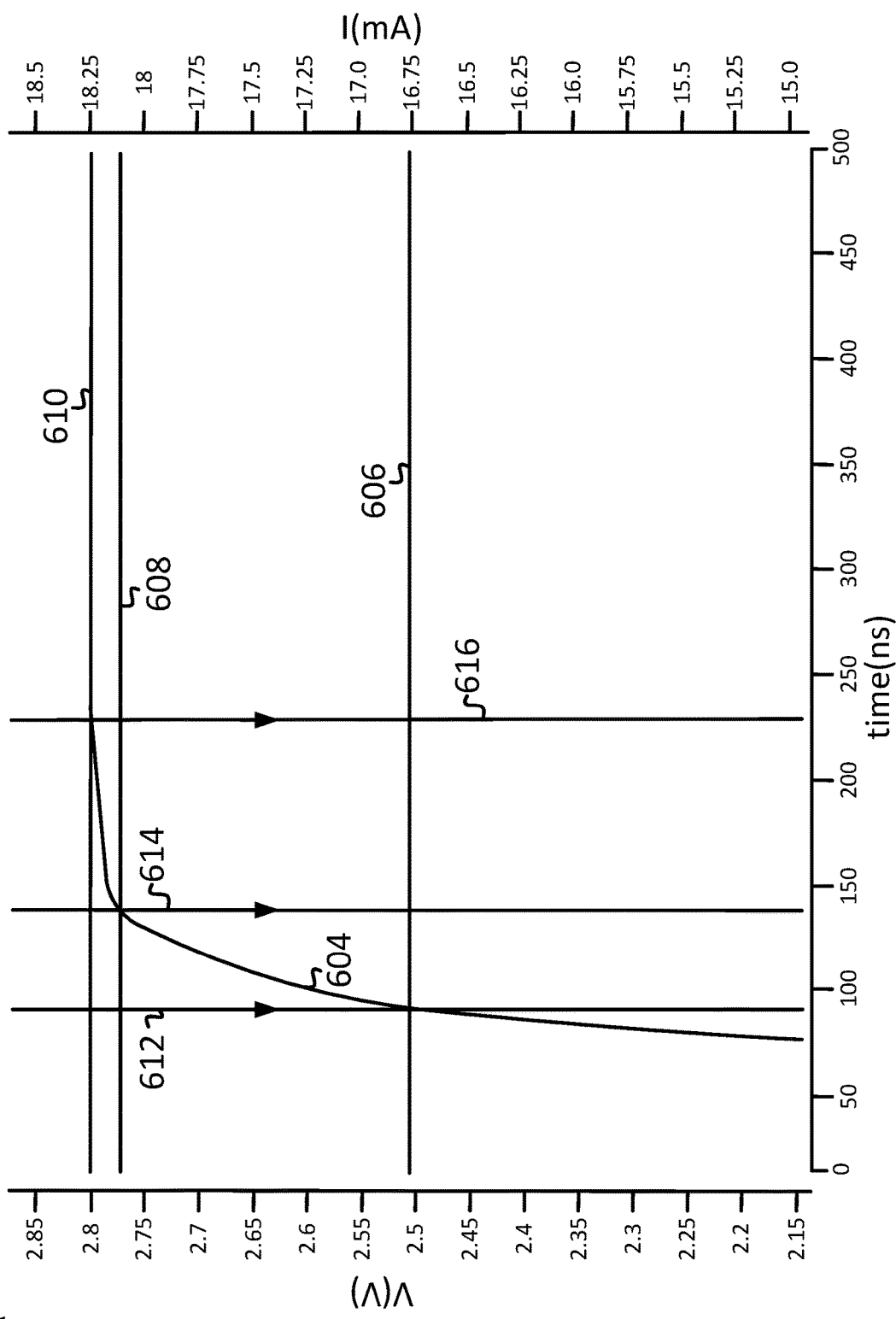

CONFIGURABLE HIGH-FREQUENCY PULSED LASER DIODE DRIVER CAPACITOR REFRESH CIRCUIT

RELATED APPLICATION

This application is a continuation of U.S. patent application Ser. No. 17/653,349, filed Mar. 3, 2022, all of which is incorporated herein in its entirety by reference for all purposes.

BACKGROUND

Laser-based ranging systems, such as Lidar, often use a pulsed laser diode driver circuit to generate a short, high-current pulse, which is passed through a laser diode to emit a corresponding pulse of laser light. Reflected pulses of laser light are received by the Lidar system and used to determine a distance between the Lidar system and the point of reflection. Spatial resolution of Lidar systems is determined in part by the width of the pulse of laser light. Thus, it is usually desirable to generate a pulse of light having a width of about 5 ns or less. However, parasitic inductances of the pulsed laser diode driver circuit and the laser diode typically must be overcome to achieve the desired short pulse width. For example, many laser diodes have at least one bond wire which can contribute 1 nH of inductance, thereby limiting a slew rate of the current pulse unless there is a very high voltage. Thus, some conventional pulsed laser diode driver circuits use a high source voltage, often greater than 40V-100V, to achieve the desired pulse width. Switching devices, such as GaN field-effect transistors (FET) are often used in conventional pulsed laser diode driver circuits as they can withstand such high voltages.

There are a wide range of applications and design requirements for pulsed laser diode drivers. For example, some high-frequency applications of a pulsed laser diode may require a pulse repetition frequency (PRF) of 5-10 MHz or higher. In such high-frequency applications, an energy storage capacitor used by a pulsed laser diode driver needs to be refreshed quickly to a maximum target voltage between pulses to meet given pulse repetition frequency and pulse amplitude requirements.

SUMMARY

In accordance with some embodiments, a pulsed laser diode driver includes a refresh circuit configured to receive a DC input voltage and to generate a refresh current using the DC input voltage. A current amplitude of the refresh current is controlled by the refresh circuit based on a voltage level of a source voltage received by the refresh circuit. A first source capacitor of the pulsed laser diode driver has i) a first terminal directly electrically connected to the refresh circuit to receive the refresh current and to develop the source voltage therefrom, and ii) a second terminal electrically coupled to ground. A first inductor of the pulsed laser diode driver has a first terminal that is directly electrically connected to the first terminal of the first source capacitor. One or more switches of the pulsed laser diode driver are configured to control a current flow through the first inductor to produce a high-current pulse through a first laser diode, the high-current pulse corresponding to a peak current of a resonant waveform developed at an anode of the first laser diode.

BRIEF DESCRIPTION OF THE DRAWINGS

FIG. 3 is a portion of an example switching sequence for operation of the pulsed laser diode drivers shown in FIGS. 1A-1C, in accordance with some embodiments.

FIGS. 6A-6B show simplified plots of signals related to operation of the refresh circuit shown in FIGS. 4A-4B, in accordance with some embodiments.

DETAILED DESCRIPTION

Figure 1A:
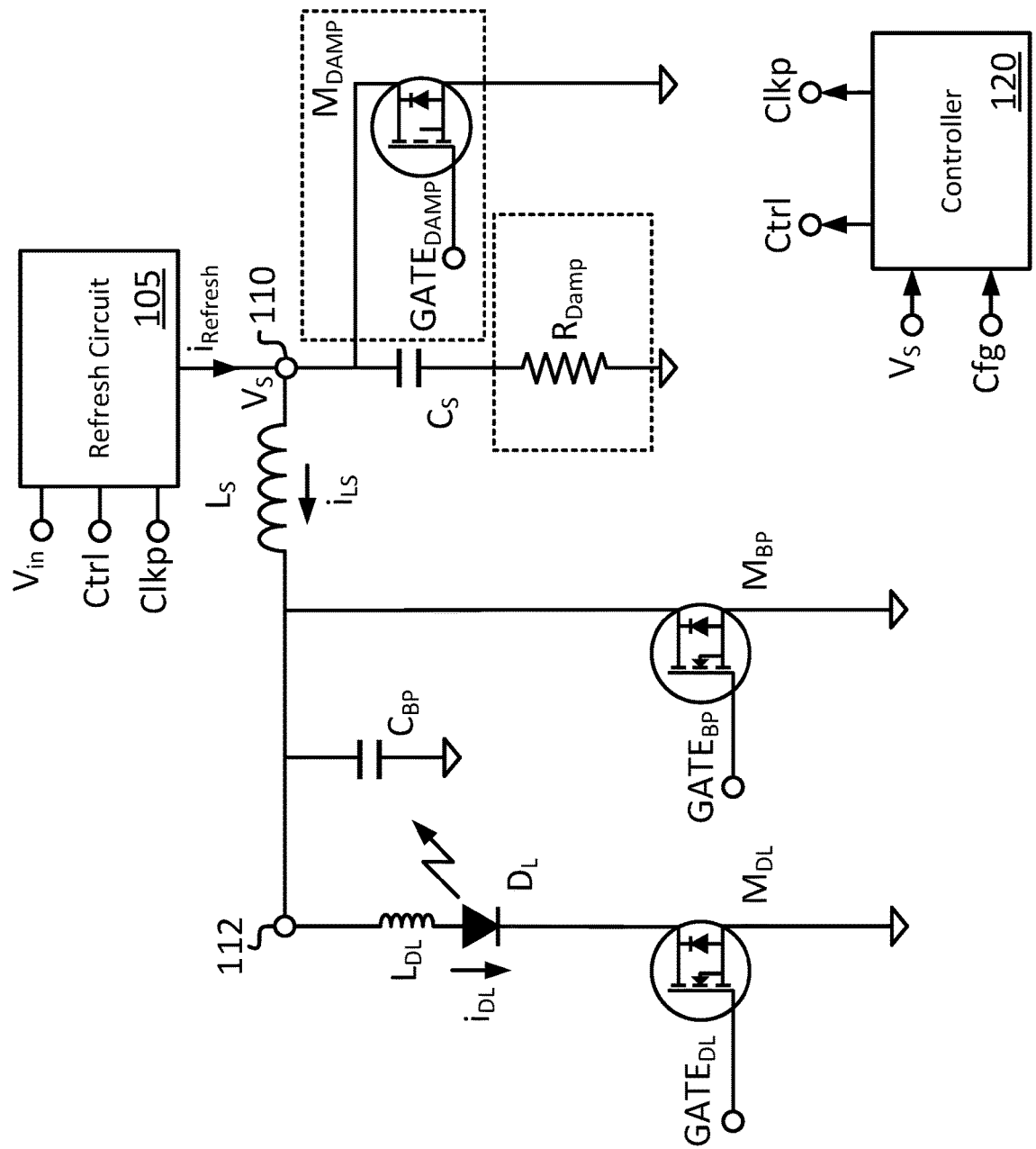
FIGS. 1A-1C are simplified circuit schematics of pulsed laser diode drivers of a first general topology, in accordance with some embodiments.

Laser-based ranging systems, such as Lidar, may use a pulsed laser diode driver circuit to generate a short, high-current pulse, which is passed through a laser diode to emit a corresponding pulse of laser light. Reflected pulses of laser light are received by the Lidar system and used to determine a distance between the Lidar system and the point of reflection. Spatial resolution of Lidar systems is determined in part by the width of the pulse of laser light, thus it is usually desirable to generate a pulse of light having a width of about 5 ns or less. However, parasitic inductances of the pulsed laser diode driver circuit and the laser diode typically must be overcome to achieve the desired short pulse width. For example, many laser diodes have at least one bond wire which can contribute 1 nH of inductance, thereby limiting a slew rate of the current pulse unless there is very high voltage.

Additionally, some high-frequency applications of a pulsed laser diode may require a pulse repetition frequency (PRF) of 5-10 MHz or higher. In such high-frequency applications, an energy storage capacitor (a "source capacitor") used by a pulsed laser diode driver needs to be charged quickly to a target voltage between pulses to meet given pulse repetition frequency and amplitude requirements. However, the capacity of the source capacitor may vary from design to design, and the pulse amplitude requirements and repetition rate requirements may vary even during normal use.

Configurable high-frequency repetition rate pulsed laser diode driver circuits disclosed herein quickly and accurately refresh (i.e., charge) one or more source capacitors thereof to advantageously meet pulse repetition frequency requirements and pulse amplitude requirements while at the same time minimizing or eliminating voltage overshoot for the source capacitor(s).

The configurable high-frequency pulsed laser diode driver circuits ("pulsed laser diode drivers") disclosed herein generate high-current (e.g., 40 Amp) ultra-short pulses (e.g., 1-5 ns) to emit a laser pulse from a laser diode using a tunable resonant circuit, as compared to conventional solutions that rely on fixed, and often unavoidable, parasitic capacitances and inductances of a circuit. The tunable resonant circuit provides easily tunable parameters which control a pulse width, a peak current, a charge time, a recovery time, a decay time, and other tunable parameters of the pulsed laser diode driver. Embodiments of a switching sequence to drive the pulsed laser diode drivers disclosed herein are operable to generate a resonant waveform at an anode of the laser diode to produce the high-current pulse through the laser diode, a voltage level of the resonant waveform being advantageously sufficient to support the high-current pulse and not of a voltage level that exceeds the voltage required to generate the high-current pulse.

Embodiments of such pulsed laser diode drivers can advantageously generate the high-current pulses using a low input voltage (e.g., 6V, 9V, 15V, etc.) and can thereby use Silicon-based switches, rather than GaN-based switches which are used by many conventional solutions. Any of the pulsed laser diode drivers disclosed herein can therefore be integrated into a single semiconductor die. Embodiments of pulsed laser diode drivers disclosed herein advantageously use a discrete inductor (e.g., a through-hole or surface-mounted component) intentionally added to the pulsed laser diode driver to generate a resonant waveform rather than relying on parasitic inductances (e.g., of the laser diode, of bond wires, or inter-circuit connections) of the pulsed laser diode driver. As a result, embodiments of the laser drivers disclosed herein are easily tunable and have a reproducible architecture. By contrast, conventional pulsed laser diode drivers often use a variety of techniques to overcome the effects of parasitic inductances of the pulsed laser diode driver and of the laser diode itself and therefore teach away from intentionally adding yet additional inductance to the pulsed laser diode driver. In addition to such intentionally added inductors, the pulsed laser diode drivers disclosed herein advantageously include a bypass capacitor that may be used by a designer to easily tune a desired pulse width emitted by the laser diode, as compared to conventional solutions which only have an energy storage capacitor, or that only consider non-tunable parasitic capacitances of the pulsed laser diode driver. Once again, such conventional solutions teach away from adding yet additional capacitance to the pulsed laser diode driver.

Because conventional solutions rely on parasitic capacitances and inductances of the conventional laser driver, modifying parameters such as a pulse width might require a redesign or re-layout of the conventional solution. By comparison, parameters, such as a pulse width, of the pulsed laser diode drivers disclosed herein can be tuned by simply changing a component value.

Additionally, multi-channel laser diodes are conventionally produced on a single monolithic substrate housed in a laser diode package. Conventionally, a single pin of the laser diode package is connected to all of the laser diode cathodes as a group (i.e., "common cathode"), whereas each laser diode anode is individually connected to a respective pin of the laser diode package. Pulsing each laser diode independently conventionally requires a switch in the laser diode anode current path to select which laser diode fires. However, an N-type switch conventionally requires a bootstrap circuit to level-shift a gate drive of that switch when the laser diode current path is enabled. Such bootstrap circuitry adds complexity and cost to a pulsed laser diode driver design. Thus, disclosed herein are embodiments of a multi-channel pulsed laser diode driver circuit for independently driving laser diodes of a common cathode multi-channel laser diode package advantageously using N-type switches without any bootstrap circuitry.

A repetition rate of a multi-channel laser diode driver, as well as of each of the pulsed laser diode drivers described herein, is limited by a charging time of each channel's source capacitor (i.e., an energy storage capacitor) which is described below. The pulsed laser diode drivers described herein create narrow (e.g., 1-5 nsec) high-current pulses (e.g., 40 amp) through a driven laser diode. The instantaneous power in the driven laser diode is therefore high (e.g., in the order of hundreds of watts). For many applications (e.g., Lidar), the duty cycle of the pulse is generally 0.01% or less to limit a total power dissipated in the laser diode, which results in an upper limit to a repetition rate. In conventional pulsed laser diode driver applications, a resistor is used to charge an energy storage capacitor during each cycle. In such conventional solutions, an RC time constant of charging circuits is typically not an issue because the duty cycle is so low. However, for applications that require a higher repetition rate for laser pulses, the RC time constant of conventional charging circuits creates an undesirable limitation. A configurable refresh circuit disclosed herein is operable to achieve high-frequency pulse repetition frequencies of 5-10 MHz or higher while advantageously preventing voltage overshoot of each channel's energy storage capacitor.

Still additionally, typical resonant driver designs require a damping resistor to minimize ringing duration. However, the added damping resistor dissipates power which lowers the overall power efficiency of the design. Thus, in some embodiments, a pulsed laser diode driver is disclosed that advantageously switches a damping resistor into the resonant circuit during portions of a switching sequence during which the damping resistor critically damps ringing, and switches the damping resistor out of the resonant circuit during portions of the switching sequence when the damping resistor is not providing a positive benefit to the resonant circuit, thereby increasing an overall power efficiency of the pulsed laser diode driver as compared to one that includes a damping resistor for the entirety of a switching sequence.

For some applications, the amplitude of a high-current pulse delivered by a pulsed laser diode driver, such as any of those disclosed herein, may need to be adjusted in amplitude from pulse to pulse. Thus, in some embodiments, any of the pulsed laser diode drivers disclosed herein may be advantageously configured to adjust an amplitude of the high-current pulse delivered to one or more laser diodes on a pulse-to-pulse basis.

Figure 1B:
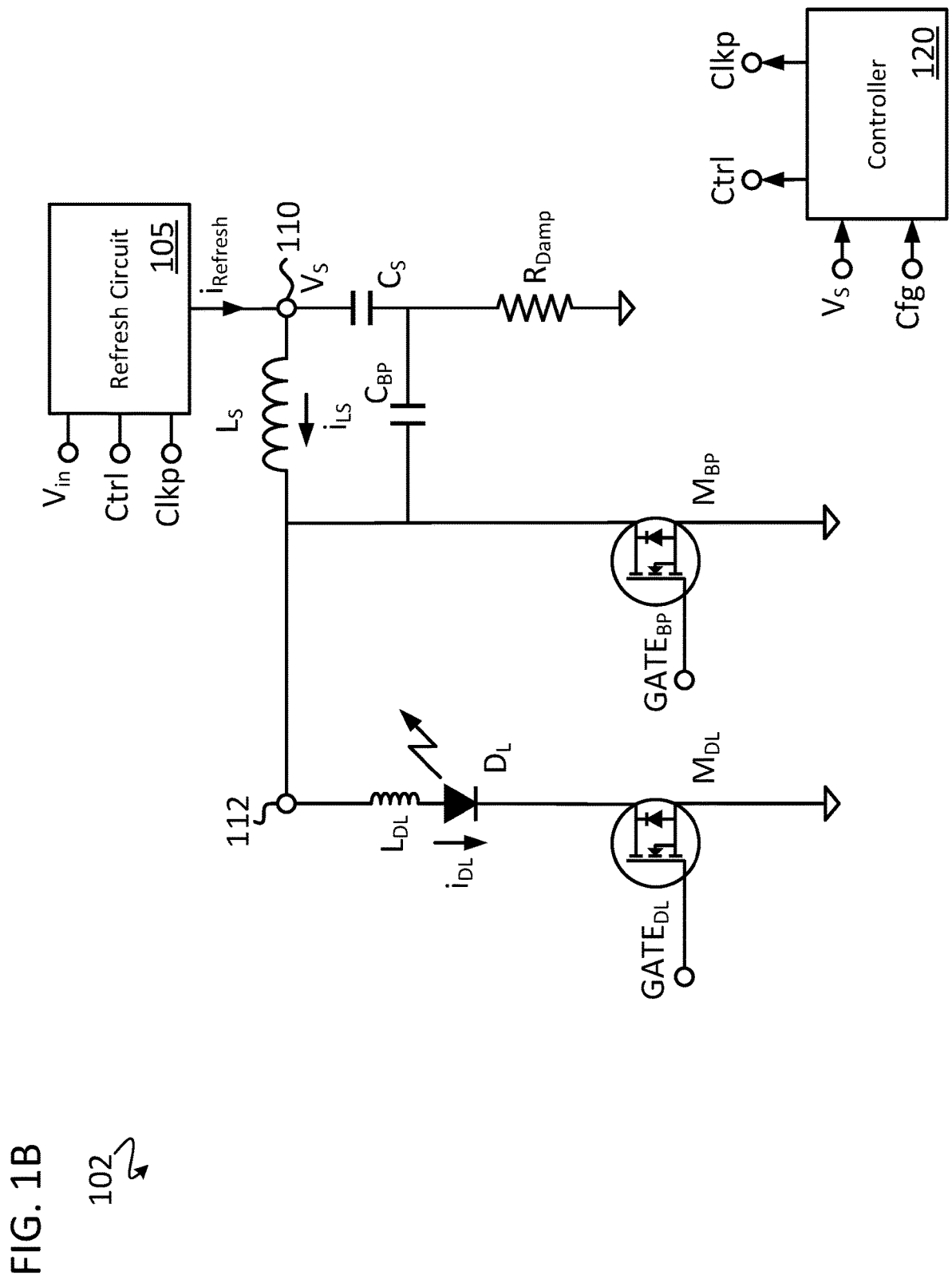
Figure 1C:
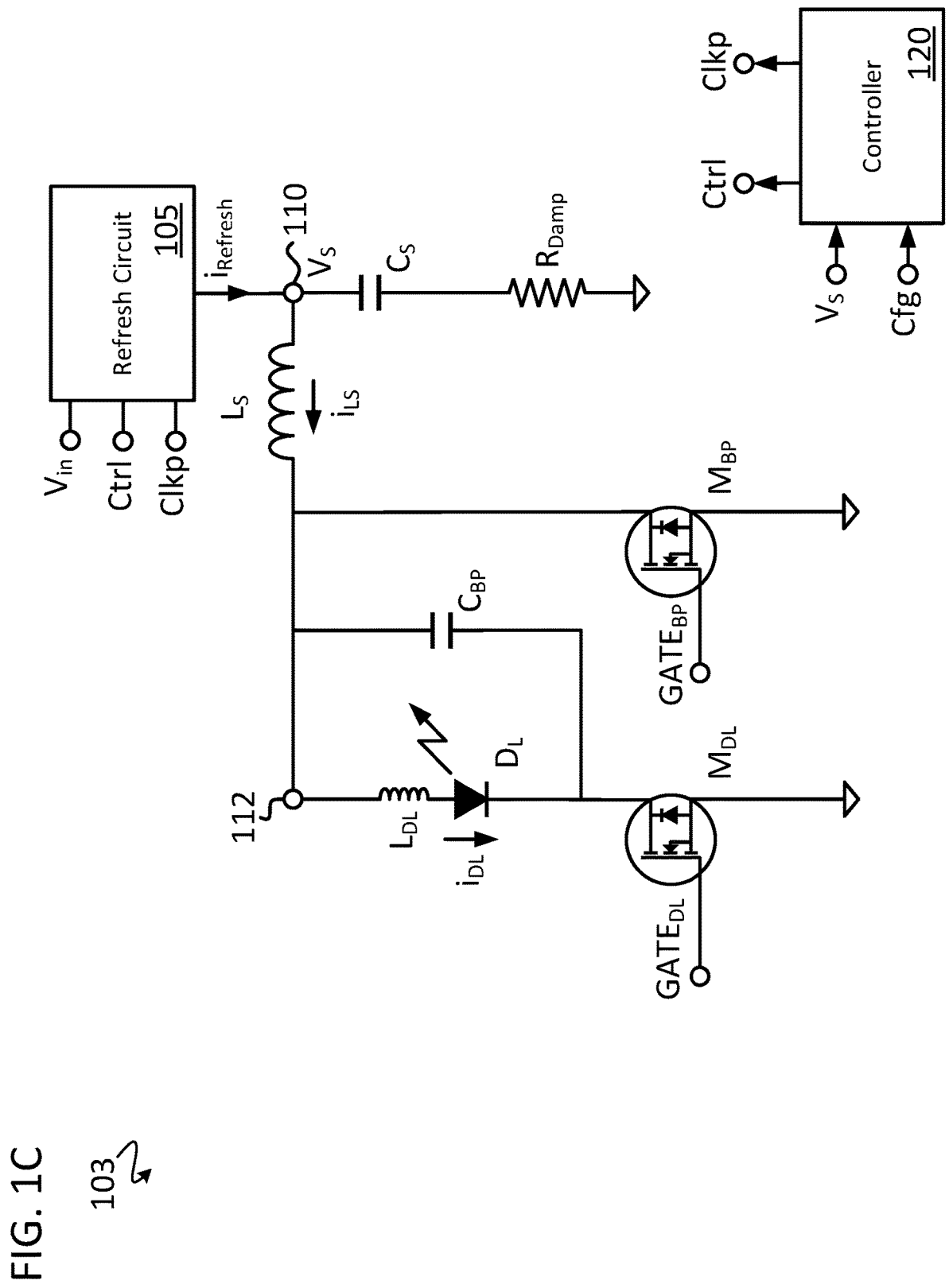

FIGS. 1A-C are simplified circuit schematics of pulsed laser diode drivers 101-103 of a first general topology to drive a laser diode using a low-side switch, in accordance with some embodiments. The pulsed laser diode drivers 101-103 each generally include an energy storage capacitor "source capacitor" $C_S$ (i.e., a physical component that is not representative of a parasitic capacitance of another component), a refresh circuit 105, a damping resistor $R_{Damp}$, an inductor $L_S$ (i.e., a physical component that is not representative of a parasitic inductance of another component), a bypass capacitor $C_{BP}$ (i.e., a physical component that is not representative of a parasitic capacitance of another component), a laser diode $D_L$, a bypass switch $M_{BP}$, and a laser diode switch $M_{DL}$. The laser diode switch $M_{DL}$ is configured as a low-side switch. Also shown is a controller 120, nodes 110, 112, a refresh current $i_{Refresh}$, a parasitic inductance $L_{DL}$ of the laser diode $D_L$, a DC input voltage $V_{in}$, a source voltage $V_s$ at the source capacitor $C_S$, a current $i_{LS}$ through the inductor $L_S$, a current $i_{DL}$ through the laser diode $D_L$, a bypass switch gate driver signal $GATE_{BP}$, and a laser diode switch gate driver signal $GATE_{DL}$.

As shown in FIG. 1A, in some embodiments, the pulsed laser diode drivers disclosed herein include an optional discharge switch $M_{DAMP}$ that is connected in parallel to the one or more source capacitors $C_S$ thereof so as to rapidly discharge the source capacitors $C_S$ when the discharge switch $M_{DAMP}$ is enabled via the discharge switch gate driver signal $GATE_{DAMP}$. In such embodiments, the damping resistor $R_{DAMP}$ may advantageously be excluded, and the source capacitor $C_S$ is instead connected directly to ground instead of being coupled to ground through the damping resistor $R_{DAMP}$.

The refresh circuit 105 controls a current amplitude of the refresh current $i_{Refresh}$ in response to a charge level ($V_s$) of the source capacitor $C_S$. The amplitude of the refresh current $i_{Refresh}$ in turn controls how quickly or slowly the source capacitor $C_S$ is charged, or "refreshed". While it is desirable that the source capacitor $C_S$ be charged as quickly as possible, such rapid charging may result in undesirable voltage overshoot at the source capacitor $C_S$. Thus, one role of the refresh circuit 105 is to optimize a charge rate of the source capacitor $C_S$ while at the same time preventing voltage overshoot. As described below, the charge rate of the source capacitor $C_S$ may be optimized by the refresh circuit 105 by configuring internal threshold voltages that control individual charge segments and by configuring internal switch groupings that control a respective current amplitude of the refresh current $i_{Refresh}$ per charge segment. In some embodiments, the controller 120 is operable to configure the refresh circuit 105 using a fixed configuration setting, or to adaptively configure the refresh circuit 105 between one or more pulse emissions of one or more laser diodes. For example, in some embodiments, the controller 120 may transmit a control signal Ctrl to the refresh circuit 105 that includes high-level information, such as an indication of a maximum target voltage $V_{max}$ that the source capacitor $C_S$ should be charged to, and a specified pulse repetition frequency for the laser diode driver circuit. In such embodiments, the refresh circuit 105 uses the high-level information included in the control signal Ctrl to configure threshold voltages and switch groupings internally to achieve the maximum target voltage $V_{max}$ without overshoot and to achieve the specified pulse repetition frequency. In other embodiments, the controller 120 determines low-level configuration settings for the refresh circuit 105, such as specific voltage levels for the threshold voltages and specific switch groupings, and transmits such low-level configuration settings to the refresh circuit 105 to configure the refresh circuit 105. In such embodiments, the controller 120 may determine, based on a measured charge-rate of the source capacitor $C_S$, that an achieved pulse repetition frequency of the pulsed laser diode driver circuit is not equal to the specified pulse repetition frequency and may accordingly transmit updated low-level configuration settings to the refresh circuit 105 to change one or more of the voltage levels of the threshold voltages and/or to change the specific switch groupings. Similarly, in some embodiments, the controller 120 may determine, based on a measured or compared voltage amplitude of the source voltage $V_S$, that voltage overshoot has occurred at the source capacitor $C_S$ and may accordingly transmit updated low-level configuration settings to the refresh circuit 105 to change one or more of the voltage levels of the threshold voltages and/or to change the specific switch groupings.

In some embodiments, the refresh circuit 105 or the controller 120 may select the initial or ongoing voltage levels of the threshold voltages and/or the switch groupings based on using determined or specified information about the particular source capacitor or source capacitors used within the pulsed laser diode driver circuit, and/or an on-resistance of the switches within the refresh circuit 105 as an input to an RC time-constant equation, T=RC, as is known in the art.

In other embodiments, the refresh circuit 105 itself is operable to determine, based on a measured charge-rate of the source capacitor $C_S$, that the pulse repetition frequency of the pulsed laser diode driver circuit is not equal to the specified pulse repetition frequency and to accordingly change one or more of the voltage levels of the threshold voltages and/or to change the specific switch groupings to control an amplitude of the refresh current $i_{Refresh}$. Similarly, in some embodiments, the refresh circuit 105 may determine, based on a measured or compared voltage amplitude of the source voltage $V_S$, that a voltage overshoot has occurred at the source capacitor $C_S$ and may accordingly change one or more of the voltage levels of the threshold voltages and/or change the specific switch groupings.

Topologies of the pulsed laser diode drivers 101-103 vary with respect to the placement of the bypass capacitor $C_{BP}$. In each of the topologies of the pulsed laser diode drivers 101-103, the refresh circuit 105 is configured to be directly electrically connected to the DC input voltage $V_{in}$. The DC input voltage $V_{in}$ may be a fixed voltage from a fixed voltage source or may be a voltage from a variable voltage source, such as from a digital-to-analog converter (DAC) (not shown). A voltage level of the DC input voltage $V_{in}$ may be set by the fixed or variable voltage source in accordance with a desired amplitude of a laser pulse emitted by the respective pulsed laser diode driver.

A first terminal of the source capacitor $C_S$ is directly electrically connected to the refresh circuit 105, and a second terminal of the source capacitor $C_S$ is directly electrically connected to a first terminal of the damping resistor $R_{Damp}$. A second terminal of the damping resistor $R_{Damp}$ is directly electrically connected to a bias voltage node such as ground. Thus, the second terminal of the source capacitor $C_S$ is electrically coupled to the bias voltage node. A first terminal of the inductor $L_S$ is directly electrically connected to the refresh circuit 105 and to the first terminal of the source capacitor $C_S$. The refresh current $i_{Refresh}$ flows from the refresh circuit 105 to the source capacitor $C_S$ to thereby develop the source voltage $V_S$ at the source capacitor $C_S$. A drain node of the bypass switch $M_{BP}$ is directly electrically connected to a second terminal of the inductor $L_S$, and a source node of the bypass switch $M_{BP}$ is directly electrically connected to the bias voltage node. An anode of the laser diode $D_L$ is directly electrically connected to the second terminal of the inductor $L_S$, and a cathode of the laser diode $D_L$ is directly electrically connected to a drain node of the laser diode switch $M_{DL}$. A source node of the laser diode switch $M_{DL}$ is directly electrically connected to the bias voltage node.

The bypass switch $M_{BP}$ is configured to receive the bypass switch gate driver signal $GATE_{BP}$ at a gate node, the bypass switch gate driver signal $GATE_{BP}$ being operable to turn the bypass switch $M_{BP}$ on or off based on a voltage level of the bypass switch gate driver signal $GATE_{BP}$. Similarly, the laser diode switch $M_{DL}$ is configured to receive the laser diode switch gate driver signal $GATE_{DL}$ at a gate node, the laser diode switch gate driver signal $GATE_{DL}$ being operable to turn the laser diode switch $M_{DL}$ on or off based on a voltage level of the laser diode switch gate driver signal $GATE_{DL}$. In some embodiments, the pulsed laser diode driver circuits disclosed herein include one or more bootstrap circuits or other level-shifting circuits to drive one or more high-side switches. Either or both of the bypass switch $M_{BP}$ and the laser diode switch $M_{DL}$ can be implemented as N-type switches or P-type switches. In some embodiments, the bypass switch $M_{BP}$ and the laser diode switch $M_{DL}$ are implemented as Silicon-based or Silicon-Carbide-based field-effect transistors (FETs). Two or more components described herein as having terminals that are directly electrically connected have a DC current path between the respective terminals of the two or more components. For example, a first and second component are not directly electrically connected via a capacitor or inductor connected in series between the first component and the second component.

As shown in the simplified circuit schematic of the pulsed laser diode driver 101 of FIG. 1A, in some embodiments a first terminal of the bypass capacitor $C_{BP}$ is directly electrically connected to the second terminal of the inductor $L_S$ and to the anode of the laser diode $D_L$. In such embodiments, a second terminal of the bypass capacitor $C_{BP}$ is directly electrically connected to the bias voltage node. As shown in the simplified circuit schematic of the pulsed laser diode driver 102 of FIG. 1B, in some embodiments, the first terminal of the bypass capacitor $C_{BP}$ is directly electrically connected to the second terminal of the inductor $L_S$ and to the anode of the laser diode $D_L$. The second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 103 of FIG. 1C, in some embodiments, the first terminal of the bypass capacitor $C_{BP}$ is directly electrically connected to the second terminal of the inductor $L_S$ and to the anode of the laser diode $D_L$. In such embodiments, the second terminal of the bypass capacitor $C_{BP}$ is directly electrically connected to the drain terminal of the laser diode switch $M_{DL}$ and to the cathode of the laser diode $D_L$.

In some embodiments, the pulsed laser diode drivers 101-103 are configured to receive the DC input voltage $V_{in}$ having a voltage range from about 10V to 20V, which is advantageously lower than an input voltage used by many conventional pulsed laser diode drivers. The inductor $L_S$ is a physical component added to the pulsed laser diode drivers 101-103 (i.e., as opposed to a representation of a parasitic inductance caused by components or interconnections such as bond wires). Similarly, the bypass capacitor $C_{BP}$ is a physical component added to the pulsed laser diode drivers 101-103 (i.e., as opposed to a representation of a parasitic capacitance). One advantage of using physical inductor and capacitor components rather than using parasitic inductances is that values of the inductor $L_S$ and the bypass capacitor $C_{BP}$ can be easily modified by a designer or even an end-user. By comparison, conventional designs that rely on parasitic reactances may require re-design and/or re-layout to change an operating parameter.

As disclosed herein, values of the DC input voltage $V_{in}$, the inductance of the inductor $L_S$, the capacitance of the source capacitor $C_S$, the resistance of the damping resistor $R_{Damp}$, and the capacitance of the bypass capacitor $C_{BP}$ can advantageously be selected ("tuned") to achieve a desired operation of the pulsed laser diode drivers 101-103 (e.g., a charge time, a pulse width, a pulse voltage, a pulse current). For example, a pulse width of the current $i_{DL}$ flowing through the laser diode $D_L$ can be tuned by adjusting the capacitance value of the bypass capacitor $C_{BP}$. A peak current level of the pulse of current $i_{DL}$ flowing through the laser diode $D_L$ can be tuned by adjusting the source voltage $V_S$ on the source capacitor $C_S$. A capacitance value of the source capacitor $C_S$ can be tuned to adjust a timing delay of the current pulse and an upper range of the current $i_{DL}$ through the laser diode $D_L$. Resistance values of the damping resistor $R_{Damp}$ are dependent on the capacitance value of the source capacitor $C_S$ and can be tuned within a range of values such that at a lower resistance, a lower frequency resonance of the pulsed laser diode drivers disclosed herein is underdamped (e.g., at about $R_{Damp}=0.1$ Ohm), or is critically damped (e.g., at about $R_{Damp}=0.4$ Ohm). The damping resistor $R_{Damp}$ is operable to prevent current of the generated resonant waveform from becoming negative which could thereby enable a body diode of the bypass switch $M_{BP}$ or the laser diode switch $M_{DL}$. Although a resulting maximum current level of the current $i_{DL}$ through the laser diode $D_L$ is lower for the critically damped case, the current level can be easily adjusted by raising the voltage level of the DC input voltage $V_{in}$. In other embodiments, the damping resistor $R_{Damp}$ is removed entirely from the design (i.e., the second terminal of the source capacitor $C_S$ is directly electrically connected to the bias voltage node). In yet other embodiments, the resistance value of the damping resistor $R_{Damp}$ is set to zero Ohms.

In some embodiments, the DC input voltage $V_{in}$ is about 15V, the inductance of the inductor $L_S$ is about 6 nH, the capacitance of the source capacitor $C_S$ is about 100 nF, the resistance of the damping resistor $R_{Damp}$ is about 0.1 Ohms, and the capacitance of the bypass capacitor $C_{BP}$ is about 1 nF. In some embodiments, a voltage at the first terminal of the damping resistor $R_{Damp}$ is received by the controller 120 to provide an indication of a current flow through the damping resistor $R_{Damp}$.

In some or all of the embodiments disclosed herein, to produce around a 40 A high-current pulse through the laser diode (or laser diodes) $D_L$, the DC input voltage $V_{in}$ may range from 10-15 volts. In some such embodiments, the inductance of inductor $L_S$ may range from 5-10 nH, the value of which determines the amount of flux delay to produce the required current. In some such embodiments, the inductance of the inductor $L_S$ is selected to be an order of magnitude greater than a parasitic inductance of a printed circuit board (PCB) in which the pulsed laser diode driver is implemented. In some embodiments, the resistance of the damping resistor $R_S$ ranges from 100-200 mOhms. A capacitance of the bypass capacitor $C_{BP}$ determines the pulse width of the high-current pulse through the laser diode(s) $D_L$, and in some embodiments ranges in capacitance from 1-5 nF. In some such embodiments, a capacitance of the source capacitor $C_S$ ranges from 25-100 nF depending on a peak current of the high-current pulse through the laser diode(s) $D_L$ that is required or desired. The smaller the source capacitor $C_S$, the higher the DC input voltage $V_{in}$ is needed to get the required or desired peak current of the high-current pulse through the laser diode(s) $D_L$. In some such embodiments, a smallest capacitance value of the source capacitor $C_S$ that can still deliver the needed or desired peak current of the high-current pulse through the laser diode(s) $D_L$ is selected because all the remaining energy after the high-current pulse is shunted to ground and is wasted, thereby lowering a power efficiency of the pulsed laser diode driver.

The controller 120 may be integrated with any embodiment of the pulsed laser diode drivers disclosed herein, or it may be a circuit or module that is external to any embodiment of the pulsed laser diode drivers disclosed herein. The controller 120 is operable to generate one or more gate drive signals having a voltage level that is sufficient to control one or more laser diode switches $M_{DL}$ and one or more bypass switches $M_{BP}$. Additionally, the controller 120 is operable to sense a voltage and/or current at any of the nodes 110 and 112 and at nodes that are similar to, or the same as, the nodes 110 and 112 as described herein, or at still other nodes of the pulsed laser diode drivers disclosed herein. The controller 120 may include one or more timing circuits, look-up tables, processors, memory, or other modules to control the pulsed laser diode drivers, as well as to control the refresh circuit 105, disclosed herein. In some embodiments, the controller 120 and the refresh circuit 105 are integrated together as a single circuit. In other embodiments, the controller 120 and the refresh circuit 105 are separate circuits that are communicably connected. Operation of the pulsed laser diode drivers 101-103 is explained in detail with respect to simplified plots 201-207 of FIGS. 2A-D and an example switching sequence 300 is shown in FIG. 3.

FIGS. 2A-2D show simplified plots 201-207 of signals related to operation of the pulsed laser diode driver 101 shown in FIG. 1A, in accordance with some embodiments. However, signals related to the operation of the other pulsed laser diode drivers disclosed herein are similar to, or are the same as, those shown in the simplified plots 201-207.

The simplified plot 201 illustrates a voltage plot of the bypass switch gate driver signal $GATE_{BP}$ 220, a voltage plot of the laser diode switch gate driver signal $GATE_{DL}$ 221, a current plot of the current $i_{LS}$ through the inductor $L_S$ 222, a current plot of the current $i_{DL}$ through the laser diode $D_L$ 223, and a voltage plot of the source voltage $V_S$ 224 at the source capacitor $C_S$, all over the same duration of time. Details of these signals are described below. The voltage plots of the bypass switch gate driver signal $GATE_{BP}$ 220 and the laser diode switch gate driver signal $GATE_{DL}$ 221 have been level-shifted for readability, but are, in actuality, low voltage inputs. Additionally, the voltage plots of the bypass switch gate driver signal $GATE_{BP}$ 220 and the laser diode switch gate driver signal $GATE_{DL}$ 221 assume that the laser diode switch $M_{DL}$ and the bypass switch $M_{BP}$ are N-type FET devices. However, if P-type FET devices are used instead, the polarity of the bypass switch gate driver signal $GATE_{BP}$ 220 and the laser diode switch gate driver signal $GATE_{DL}$ 221 are inverted.

Upon receiving (e.g., from the controller 120) an asserted level of the bypass switch gate driver signal $GATE_{BP}$ 220 at the gate node of the bypass switch $M_{BP}$, the bypass switch $M_{BP}$ is enabled (i.e., transitioned to an ON-state). Similarly, upon receiving (e.g., from the controller 120) an asserted level of the laser diode switch gate driver signal $GATE_{DL}$ 221 at the gate node of the laser diode switch $M_{DL}$, the laser diode switch $M_{DL}$ is enabled. As highlighted in the plot 202, when the bypass switch $M_{BP}$ is enabled, the rising current $i_{LS}$ 222 begins to flow through the inductor $L_S$, thereby building magnetic flux at the inductor $L_S$. When the current $i_{LS}$ 222 has reached a desired level (e.g., as determined by the controller 120 using sensed current, voltage, a timer circuit, or as determined by design constraints), a de-asserted level of the bypass switch gate driver signal $GATE_{BP}$ 220 is received (e.g., from the controller 120) at the gate node of the bypass switch $M_{BP}$, thereby disabling the bypass switch $M_{BP}$ (i.e., transitioned to an OFF-state). As highlighted in the plot 203, when the bypass switch $M_{BP}$ is disabled, the current $i_{LS}$ 222 which has built up through the inductor $L_S$, having no other current path, is redirected through the laser diode $D_L$, causing a short (e.g., 1 ns-5 ns), high-current (e.g., >30 A) pulse to flow through the laser diode $D_L$, thereby causing the laser diode $D_L$ to emit a pulse of laser light. Because energy in the form of flux has been stored at the inductor $L_S$, the high-current pulse $i_{DL}$ that flows through the laser diode $D_L$ can be significantly greater than the current $i_{LS}$ that flows through the inductor $L_S$. Values of the reactive components of the laser diode drivers disclosed herein can be advantageously selected to generate a desired current amplitude of the high-current pulse $i_{DL}$.

After emission from the laser diode $D_L$, the bypass switch $M_{BP}$ is reenabled by an asserted level of the bypass switch gate driver signal $GATE_{BP}$ 220, and the laser diode switch $M_{DL}$ is maintained in an enabled state by an asserted level of the laser diode switch gate driver signal $GATE_{DL}$ 221. As highlighted in the plot 204, the bypass switch $M_{BP}$ and the laser diode switch $M_{DL}$ are both advantageously maintained in the enabled state as the source voltage $V_S$ 224 stored at the source capacitor $C_S$ is discharged. As highlighted in the plot 205, while the bypass switch $M_{BP}$ and the laser diode switch $M_{DL}$ are maintained in the enabled state, the current $i_{DL}$ 223 through the laser diode $D_L$ (and importantly, through the parasitic inductance $L_{DL}$ of the laser diode $D_L$) diminishes to zero. Thereafter, both the bypass switch $M_{BP}$ and the laser diode switch $M_{DL}$ are disabled by de-asserted levels (e.g., from the controller 120) of the bypass switch gate driver signal $GATE_{BP}$ 220 and the laser diode switch gate driver signal $GATE_{DL}$ 221. Because the laser diode switch $M_{DL}$ is not disabled until a current through the parasitic inductance $L_{DL}$ of the laser diode $D_L$ has diminished to zero, a high voltage spike advantageously does not develop at the anode of the laser diode $D_L$ as there is no rapid change in current through the parasitic inductance $L_{DL}$. Because such high voltage spikes are advantageously mitigated, the laser diode switch $M_{DL}$ does not need to be selected to withstand high voltages, thereby simplifying the design and reducing the cost of the pulsed laser diode drivers disclosed herein as compared to conventional solutions. Additionally, because such high voltage spikes are mitigated, the pulsed laser diode drivers disclosed herein do not require voltage snubbing circuits that are commonly used in conventional solutions, thereby further simplifying the design and reducing the cost of the pulsed laser diode drivers disclosed herein as compared to conventional solutions.

The high-current pulse 223 is a first and largest peak of the resonant waveform developed by reactive components of the pulsed laser diode driver circuit. These reactive components include the source capacitor $C_S$, the inductor $L_S$, the parasitic inductance $L_{DL}$ of the laser diode $D_L$, and the bypass capacitor $C_{BP}$. In addition to the advantages described above, the bypass switch $M_{BP}$ also reduces subsequent resonant waveform "ringing" of the resonant waveform after the high-current pulse 223 is generated. As shown in the plot 206, if a bypass switch gate driver signal $GATE_{BP}$ 220' is not asserted after a high-current pulse $i_{DL}$ 223' is generated, ringing occurs on the current $i_{LS}$ 222' through the inductor $L_S$, on the current $i_{DL}$ 223' through the laser diode $D_L$, and on the source voltage $V_S$ 224' at the source capacitor $C_S$. As shown, the high-current pulse 223 through the laser diode $D_L$ corresponds to a peak (e.g., maximum, or local maximum, amplitude) current of a resonant waveform of current $i_{DL}$ 223' developed at the anode of the laser diode $D_L$.

As previously described, values of the source capacitor $C_S$, the inductor $L_S$ and the bypass capacitor $C_{BP}$ may be advantageously selected or "tuned" by a designer to meet desired performance criteria of the pulsed laser diode driver disclosed herein. For example, a capacitance value of the bypass capacitor $C_{BP}$ may be selected based on a desired pulse width of the current $i_{DL}$ through the laser diode $D_L$. The plot 207 shows the high-current pulse 223 generated when the capacitance of the bypass capacitor $C_{BP}$ is equal to 1 nF, and a pulse 223" generated when the capacitance of the bypass capacitor $C_{BP}$ is equal to 4 nF. In use cases where a wider pulse, such as the pulse 223", is desired, the source voltage $V_S$ may be raised accordingly. Additionally, in some embodiments, the width of the de-asserted portion of the bypass switch gate driver signal $GATE_{BP}$ 220 is widened to accommodate a wider pulse.

Figure 2A:
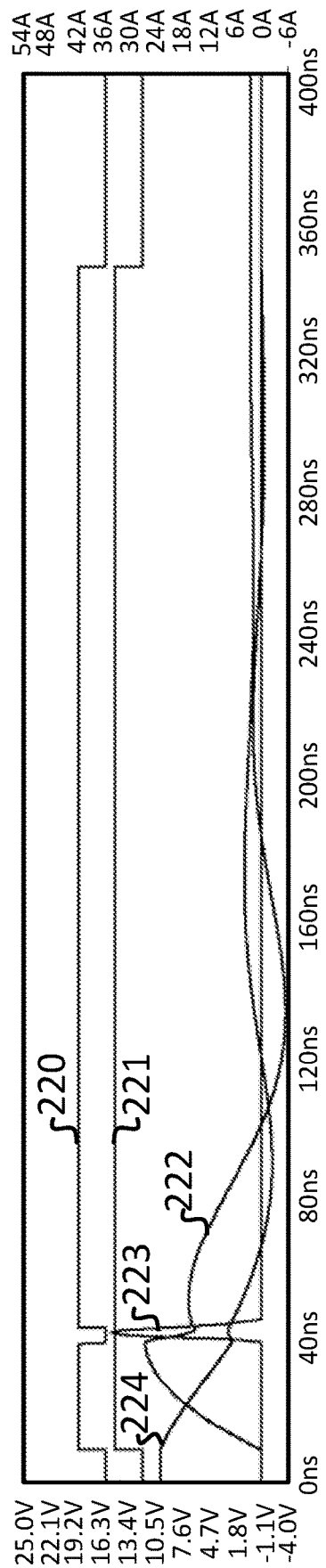
FIGS. 2A-2D show simplified plots of signals related to operation of the pulsed laser diode driver shown in FIG. 1A, in accordance with some embodiments.
Figure 2A:
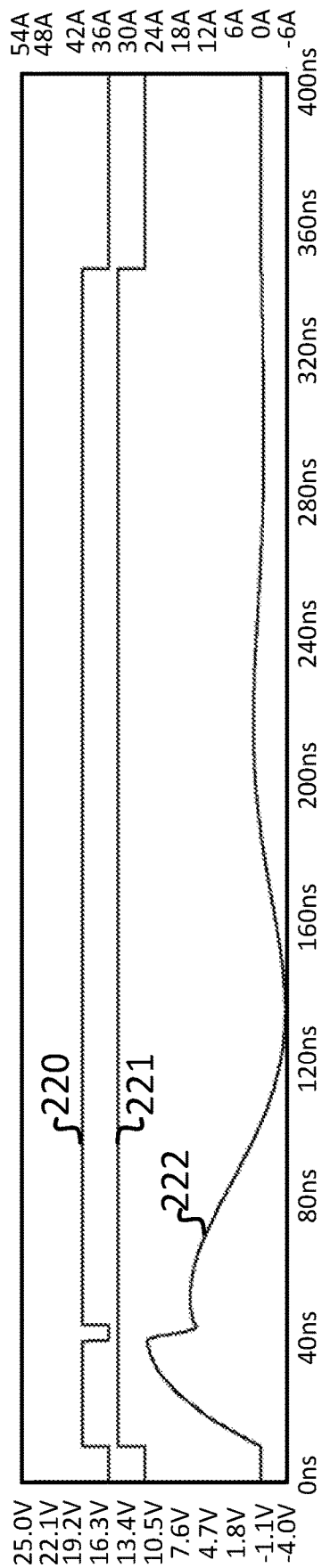
Figure 2B:
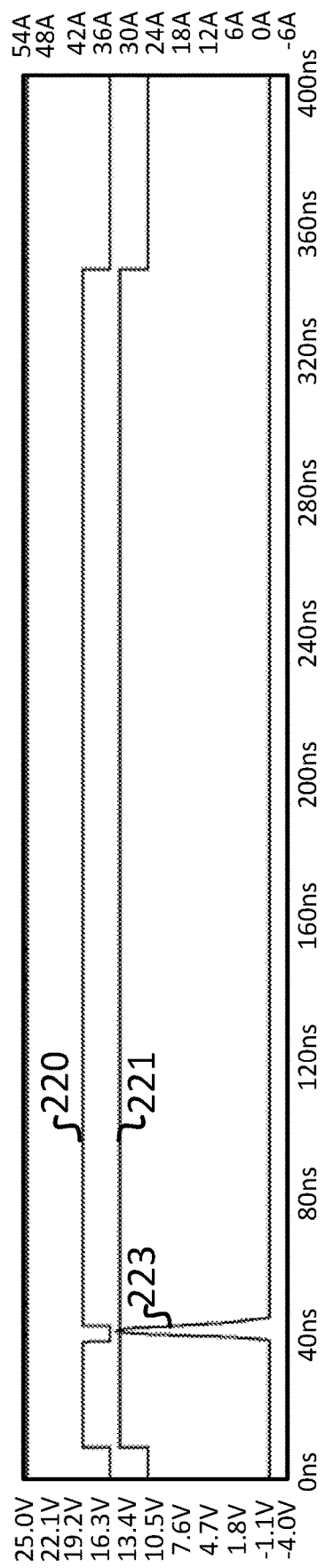
Figure 2B:
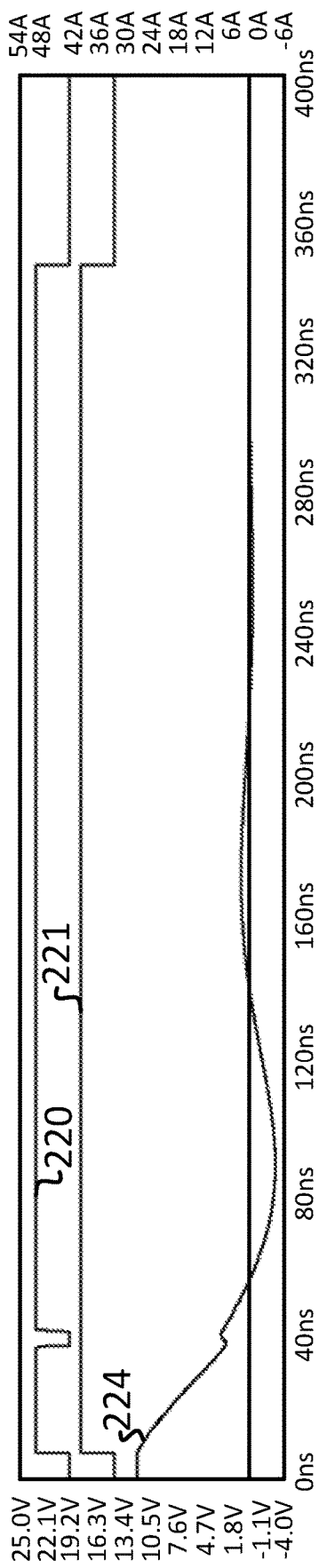
Figure 2C:
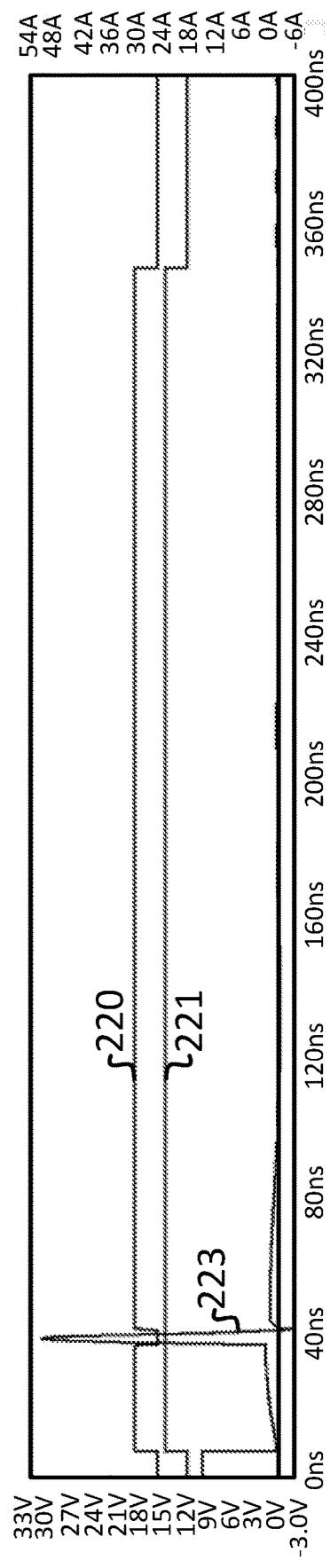
Figure 2C:
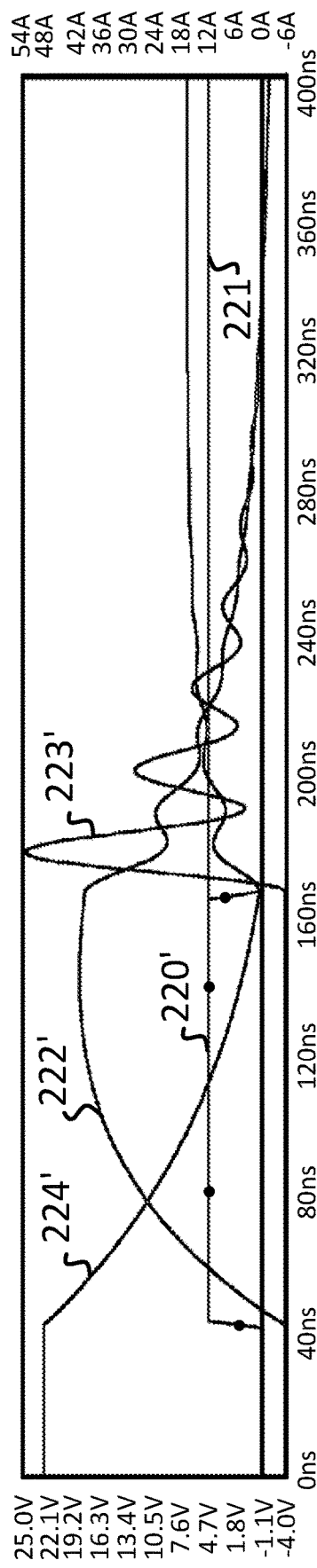
Figure 2D:
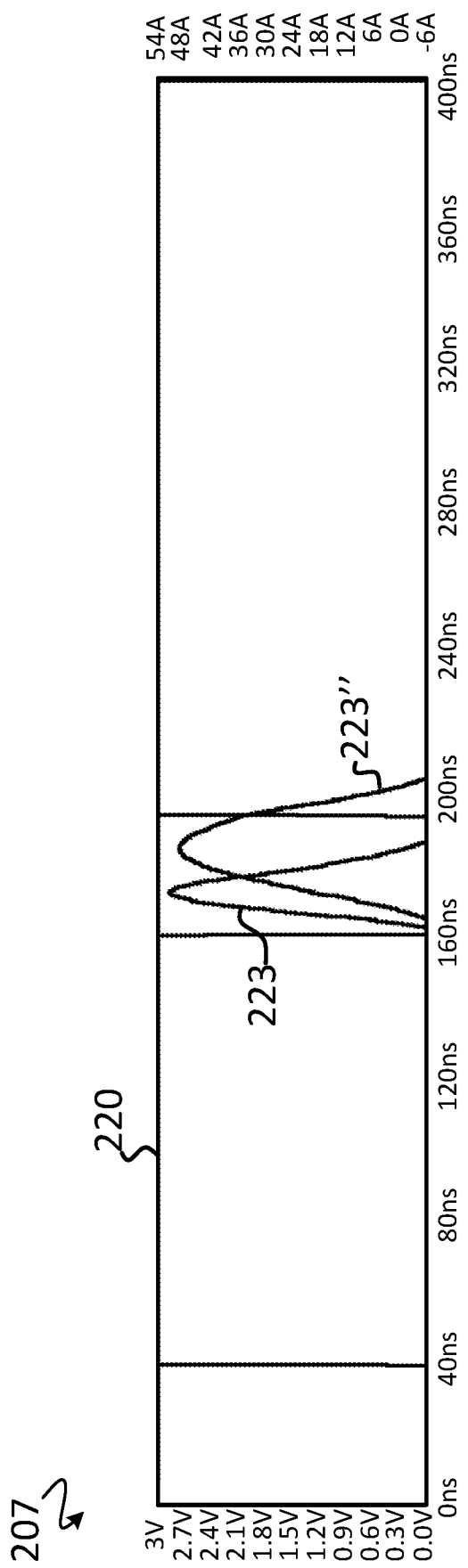

FIG. 3 illustrates a portion of an example switching sequence 300 for operation of the pulsed laser diode drivers 101-103 shown in FIG. 1A-B, in accordance with some embodiments, and as was described with reference to FIGS. 2A-C. However, the switching sequence 300 is similar to, or the same as, respective switching sequences related to the operation of other embodiments of the pulsed laser diode drivers disclosed herein.

At a precharge step 301, the bypass switch $M_{BP}$ and the laser diode switch $M_{DL}$ are off (i.e., not conducting). During the precharge step 301, the clkp signal generated by the controller 120 and received by the refresh circuit 105 is asserted and the source capacitor $C_S$ is thereby charged by the refresh current $i_{Refresh}$ generated by the refresh circuit 105. At a preflux step 302, the bypass switch $M_{BP}$ and the laser diode switch $M_{DL}$ are transitioned to an ON-state, thereby allowing the current $i_{LS}$ to flow through the inductor $L_S$ to store energy in the form of magnetic flux at the inductor $L_S$. Even though both of the switches ($M_{DL}$, $M_{BP}$) are in an ON-state at the preflux step 302, the bypass path through the bypass switch $M_{BP}$ will carry all of the current $i_{LS}$ because a bandgap voltage of the laser diode $D_L$ needs to be overcome to allow current to flow through the laser diode $D_L$.

In some embodiments, the laser diode switch $M_{DL}$ is transitioned to an ON-state after the bypass switch $M_{BP}$ is transitioned to an ON-state. At a pulse generation step 303, the bypass switch $M_{BP}$ is transitioned to an OFF-state while the laser diode switch $M_{DL}$ is maintained in an ON-state, thereby generating the high-current pulse through the laser diode $D_L$. During the pulse generation step 303, the clkp signal is de-asserted and the refresh current $i_{Refresh}$ is not generated by the refresh circuit 105. When the bypass switch $M_{BP}$ is transitioned to the OFF-state, voltage at the anode of the laser diode $D_L$ rises quickly, until the bandgap voltage of the laser diode $D_L$ is overcome and the laser diode $D_L$ begins to conduct current. Because of a resonant circuit formed by the bypass capacitor $C_{BP}$ and the parasitic inductance $L_{DL}$ of the laser diode $D_L$, the voltage formed at the anode of the laser diode $D_L$ will advantageously rise as high as necessary to overcome the bandgap voltage of the laser diode $D_L$ and will generally be higher than the source voltage $V_S$.

At a discharge step 304, the bypass switch $M_{BP}$ and the laser diode switch $M_{DL}$ are maintained in an ON-state to drain charge stored at the source capacitor $C_S$, thereby reducing the current $i_{DL}$ through the parasitic inductance $L_{DL}$ to advantageously eliminate a high voltage spike at the anode of the laser diode $D_L$ when the laser diode switch $M_{DL}$ is transitioned to an OFF-state. During the discharge step 304, the clkp signal remains de-asserted and the refresh current $i_{Refresh}$ is not generated by the refresh circuit 105. In embodiments that include the optional discharge switch $M_{DAMP}$ that is shown in FIG. 1A, the discharge switch $M_{DAMP}$ is enabled via the discharge switch gate driver signal $GATE_{DAMP}$ during the discharge step 304 to rapidly discharge the source capacitor $C_S$. The discharge switch $M_{DAMP}$ is disabled during steps 301, 302, 303, and 305.

At step 305, the bypass switch $M_{BP}$ and the laser diode switch $M_{DL}$ are transitioned to an OFF-state and clkp is asserted, thereby returning to the precharge state at step 301. Because the source voltage $V_S$ at the source capacitor $C_S$ is completely discharged at the end of the discharge step 304, there is very little current through the laser diode $D_L$. Thus, there is advantageously very little overshoot when the switches $M_{DL}$, $M_{BP}$ are transitioned to the OFF-state at step 305, thereby preventing damage to the laser diode $D_L$ and the switches $M_{DL}$, $M_{BP}$. The time interval of the overall pulse and bypass signals is selected, in some embodiments, such that the source capacitor $C_S$ is fully discharged before the switches $M_{DL}$, $M_{BP}$ are transitioned to the OFF-state at step 305.

Other topologies of pulsed laser drivers, having the same or similar advantages and having similar operation as that of the pulsed laser diode drivers 101-103, are disclosed below. The example topologies disclosed herein are not an exhaustive list of possible topologies that have the same or similar advantages and similar operation as that of the pulsed laser diode drivers 101-103. For example, one of skill in the art will appreciate that some modifications can be made while still adhering to the general principle of operation disclosed herein. Such modifications include placement of the bypass capacitor $C_{BP}$, component values, and the addition of serially connected components that provide a DC current path.

Figure 4A:
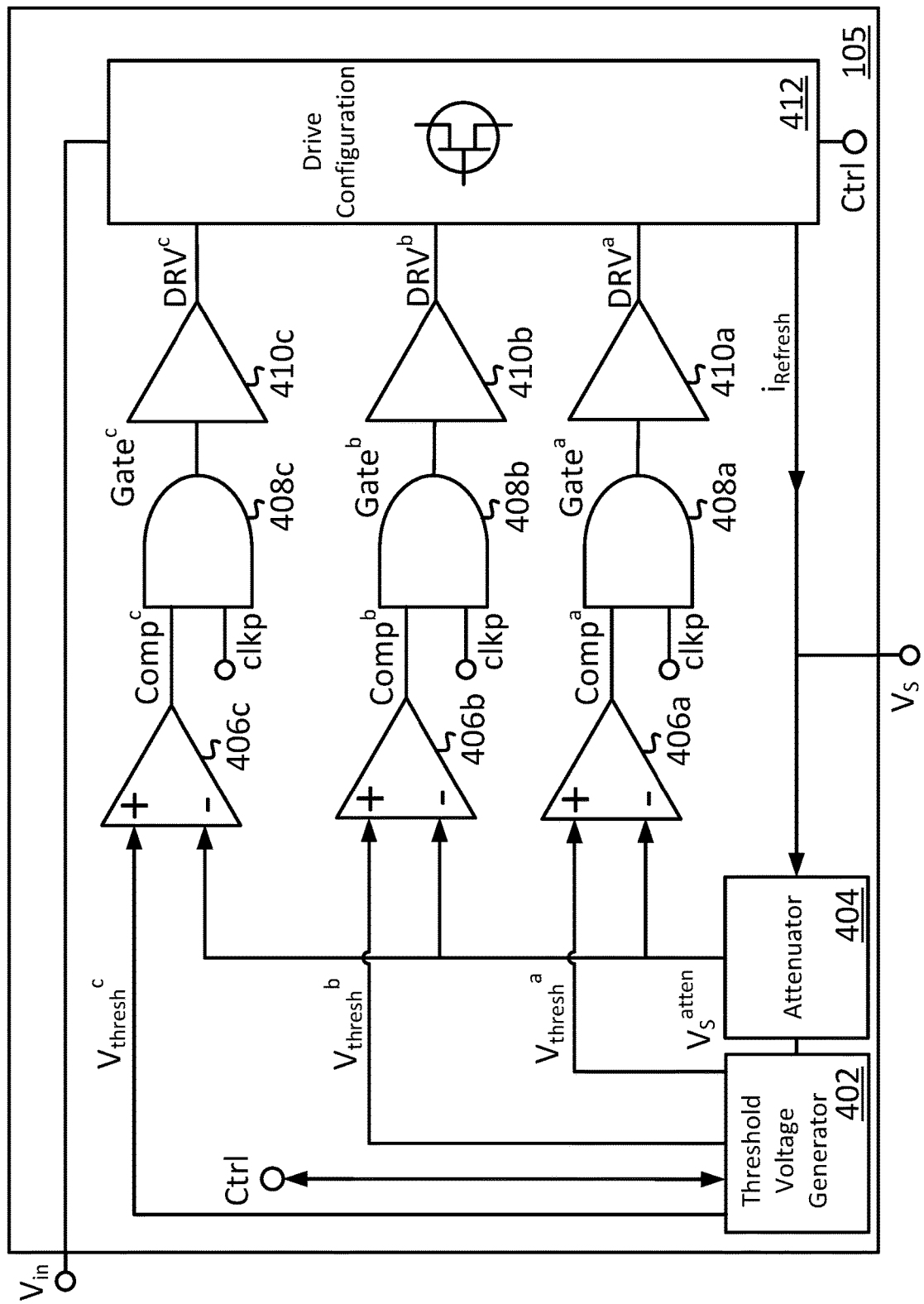
FIGS. 4A-4B are simplified circuit schematics of a refresh circuit for use with the pulsed laser diode drivers disclosed herein, in accordance with some embodiments.

FIG. 4A is a simplified circuit schematic of the refresh circuit 105 that was introduced in FIG. 1A, in accordance with some embodiments. In general, the refresh circuit 105 includes a configurable threshold voltage generator circuit 402, an attenuator circuit 404, comparators 406a, 406b, and 406c, logic AND gates 408a, 408b, and 408c, gate driver circuits 410a, 410b, and 410c, and a drive configuration circuit 412, connected as shown. Some circuit elements have been omitted from the circuit schematic of the refresh circuit 105 to simplify the description thereof but are understood to be present.

Also shown in FIG. 4A is the DC input voltage $V_{in}$, the control signal Ctrl, the source voltage $V_S$, threshold voltage levels $V_{thresh}^a$, $V_{thresh}^b$, $V_{thresh}^c$, comparison signals $Comp^a$, $Comp^b$, $Comp^c$, gate signals $Gate^a$, $Gate^b$, $Gate^c$, drive signals $DRV^a$, $DRV^b$, and $DRV^c$, and the refresh current $i_{Refresh}$. In some embodiments, the control signal Ctrl includes a representation of a maximum target voltage $V_{max}$ that the source capacitor(s) $C_S$ of the associated pulsed laser diode driver circuit should be charged so as to achieve a desired laser pulse amplitude. For some applications, the maximum target voltage $V_{max}$ is equal to the fixed or variable DC input voltage $V_{in}$. For other applications, the maximum target voltage $V_{max}$ is equal to a voltage level that is less than the DC input voltage $V_{in}$. In some embodiments, the maximum target voltage $V_{max}$ is fixed during operation of the pulsed laser diode driver circuit. In other embodiments, the maximum target voltage $V_{max}$ may vary, even pulse-to-pulse, during operation of the pulsed laser diode driver circuit.

As shown, an indication of the source voltage $V_S$ developed at the source capacitor $C_S$ shown in FIGS. 1A-C is received at the attenuator circuit 404. The attenuator circuit 404 is operable to convert the source voltage $V_S$ into a signal $V_S^{atten}$ that is representative of the source voltage. In some embodiments, the attenuator circuit 404 may include a resistor divider circuit, a level shifter circuit, or another circuit that is operable to convert or scale the source voltage $V_S$ to a voltage level that is compliant with voltage requirements of at least the comparators 406a-c. For example, if the comparators 406a-c are implemented using CMOS technology, the attenuator circuit 404 may scale the source voltage $V_S$ such that the representative source voltage signal $V_S^{atten}$ has a minimum voltage of 0 volts and a maximum voltage of 3.3 volts or 5 volts. The representative source voltage signal $V_S^{atten}$ is received at a respective inverting input of the comparators 406a-c and optionally at the threshold voltage generator 402.

The threshold voltage generator circuit 402 is operable to generate three threshold voltages: $V_{thresh}^a$, $V_{thresh}^b$, and $V_{thresh}^c$. Each threshold voltage is received at a respective non-inverting input of the comparators 406a-c. A voltage amplitude of the threshold voltage $V_{thresh}^b$ is higher than that of $V_{thresh}^a$ and is lower than that of $V_{thresh}^c$. Respective voltage levels of the threshold voltage levels $V_{thresh}^a$, $V_{thresh}^b$, and $V_{thresh}^c$ are advantageously generated by the threshold voltage generator circuit 402 such that each represents a percentage of the maximum target voltage $V_{max}$ of the source capacitor(s) $C_S$. For example, in some embodiments, $V_{thresh}^a$ is equal to 80% to 90% of the maximum target voltage $V_{max}$, $V_{thresh}^b$ is equal to 90% to 95% of the maximum target voltage $V_{max}$, and $V_{thresh}^c$ is equal to 100% of the maximum target voltage $V_{max}$. As disclosed below, the respective voltage amplitudes of the threshold voltage levels $V_{thresh}^a$, $V_{thresh}^b$, and $V_{thresh}^c$ are advantageously configured by the threshold voltage generator circuit 402 and/or the controller 120 to meet charge timing requirements and charge level requirements of a pulsed laser diode driver circuit that includes the refresh circuit 105.

Each of the comparators 406a-c controls a level of its respective output signal $Comp^{a-c}$ according to a comparison of the representative source voltage signal $V_S^{atten}$ to a respective threshold voltage level $V_{thresh}^{a-c}$. For example, so long as the representative source voltage signal $V_S^{atten}$ is less than $V_{thresh}^a$, the comparator 406a emits an asserted comparison signal $Comp^a$. Similarly, so long as the representative source voltage signal $V_S^{atten}$ is less than $V_{thresh}^b$, the comparator 406b emits an asserted comparison signal $Comp^b$, and so long as the representative source voltage signal $V_S^{atten}$ is less than $V_{thresh}^c$, the comparator 406c emits an asserted comparison signal $Comp^c$.

Accordingly, all three comparators 406a-c emit asserted comparison signals when $V_S^{atten}$ is less than $V_{thresh}^a$, comparators 406b-c emit asserted comparison signals when $V_S^{atten}$ is greater than $V_{thresh}^a$ and less than $V_{thresh}^b$, and only the comparator 406c emits an asserted comparison signal when $V_S^{atten}$ is greater than $V_{thresh}^b$ and less than $V_{thresh}^c$. As such, each charging segment of the source capacitor $C_S$ by the refresh circuit 105 is rapidly controlled by the comparators 406a-c to prevent voltage overshoot at the source capacitor $C_S$.

Each of the comparator signals $Comp^{a-c}$ is received at a respective first terminal of one of the logic AND gates 408a-c. A clocking signal clkp generated by the controller 120 is received at a respective second terminal of each of the logic AND gates 408a-c. The clocking signal clkp functions as an enable signal for the refresh circuit 105 such that the refresh circuit 105 only charges the source capacitor $C_S$ during appropriate portions of a laser pulse emission cycle that was described above with reference to FIG. 3. In some embodiments, the clocking signal clkp is asserted by the controller 120 during stages 301, 302, and 305 that were described above with reference to FIG. 3. In some embodiments, the clocking signal clkp is de-asserted by the controller 120 during stages 303 and 304 that were described above with reference to FIG. 3. When the clocking signal clkp is asserted, each of the AND gates 408a-c emits a signal level of $Gate^{a-c}$ according to a respective signal level of $Comp^{a-c}$. Similarly, when the signal clkp is de-asserted, each of the AND gates 408a-c produces a de-asserted signal level of $Gate^{a-c}$ irrespective of a signal level of $Comp^{a-c}$.

The gate signals $Gate^{a-c}$ are received by the gate driver circuits 410a-c which are each operable to create an amplified, level-shifted, or otherwise conditioned drive signals $DRV^{a-c}$ that are each suitable to control conduction through one or more switches of the drive configuration circuit 412.

The drive configuration circuit 412 is configured to receive the drive signals $DRV^{a-c}$ and to supply the refresh current flow $i_{Refresh}$ to one or more source capacitors $C_S$ of the associated pulsed laser diode driver circuit. When all of the drive signals $DRV^{a-c}$ are asserted, $i_{Refresh}$ is generated by the drive configuration circuit 412 at a first current amplitude. When both of drive signals $DRV^{b-c}$ are asserted, $i_{Refresh}$ is generated by the drive configuration circuit 412 at a second current amplitude that is less than the first current amplitude. When just drive signal $DRV^c$ is asserted, $i_{Refresh}$ is generated by the drive configuration circuit 412 at a third current amplitude that is less than both the first current amplitude and the second current amplitude. The first current amplitude corresponds to a first charge segment of the source capacitor $C_S$, the second current amplitude corresponds to a second charge segment of the source capacitor $C_S$, and the third current amplitude corresponds to a third charge segment of the source capacitor $C_S$. By charging the source capacitor $C_S$ in accordance with such charge segments, the source capacitor can be rapidly charged during the first charge segment, but then be charged at slower rate during the final charge segment so as to avoid voltage overshoot.

Figure 4B:
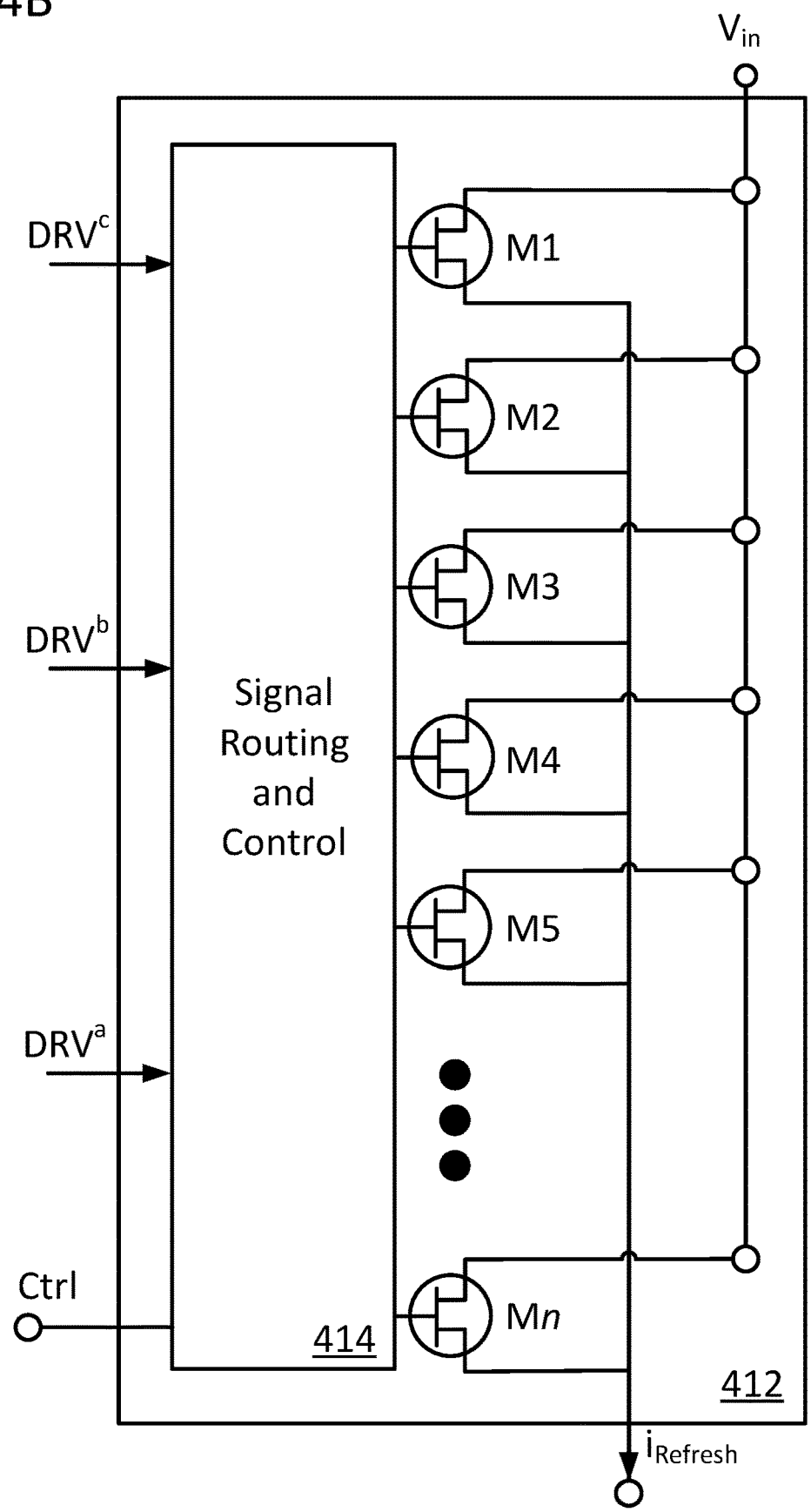

FIG. 4B is a simplified circuit schematic of the drive configuration circuit 412 that was introduced in FIG. 4A, in accordance with some embodiments. In general, the drive configuration circuit 412 includes a signal routing and control circuit 414 and three or more switches M1-Mn. Also shown are the drive signals $DRV^{a-c}$, the refresh current $i_{Refresh}$, and the control signal Ctrl.

In some embodiments, the switches M1-Mn are implemented as N-type switches, such as N-type FETS. In other embodiments, the switches M1-Mn are implemented as P-type switches, such as P-type FETS.

The signal routing and control circuit 414 controls which of the switches M1-Mn are controlled by each of the drive signals $DRV^{a-c}$. For example, in some embodiments, the signal routing and control circuit 414 is implemented as a multiplexer or other signal routing circuit. In some embodiments, routing of the drive signals $DRV^{a-c}$ by the signal routing and control circuit 414 is configurable (e.g., based on the control signal Ctrl, a switch setting, or a resistor setting). In other embodiments, the signal routing and control circuit 414 provides a fixed routing path for the drive signals $DRV^{a-c}$. For example, in such embodiments, the signal routing and control circuit 414 is implemented as direct electrical connections from the drive circuits 410a-c to respective sets of gate nodes of the switches M1-Mn. In such embodiments, reconfiguration of the switch groupings is not performed.

The signal routing and control circuit 414 advantageously controls a current amplitude of the refresh current $i_{Refresh}$ that is supplied to the associated source capacitor $C_S$ when each of the drive signals $DRV^{a-c}$ is enabled. That is, the signal routing and control circuit 414 is configured such that the drive signal $DRV^a$ is routed to a first set of gate terminals of the switches M1-Mn, the drive signal $DRV^b$ is routed to a second set of gate terminals of the switches M1-Mn, and the drive signal $DRV^c$ is routed to a third set of gate terminals of the switches M1-Mn. In some examples, the first, second, and third sets of gate terminals include the same number of gate terminals. In other examples, one or more of the first, second, and third sets of gate terminals include a different number of gate terminals. As described below, the number of gate terminals controlled by each respective drive signals $DRV^{a-c}$ may be advantageously configured using the signal routing and control circuit 414 such that a specified pulse repetition frequency of the pulsed laser diode driver circuit that includes the refresh circuit 105 is achieved.

As described below, in some embodiments, the groupings and number of switches controlled by the signal routing and control circuit 414 may be changed (i.e., "auto-tuned") during operation of the associated pulsed laser diode driver circuit in response to a measured pulse repetition frequency of the pulsed laser diode driver circuit.

In the examples shown and described herein, the refresh circuit 105 includes three "channels" or charge segments. That is, the threshold voltage generator 402 produces three threshold voltages $V_{thresh}^{a-c}$ that are received by three comparators 406a-c, the outputs of which are received by the logic AND gates 408a-c, which in turn control the three gate driver circuits 410a-c to produce drive signals $DRV^{a-c}$. Each of the three drive signals $DRV^{a-c}$ controls one of three sets of switches M1-Mn of the drive configuration circuit 412. However, in some embodiments, the refresh circuit 105 may include two, three, four, five, six, seven, eight, or more of such channels or charge segments.

Figure 5:
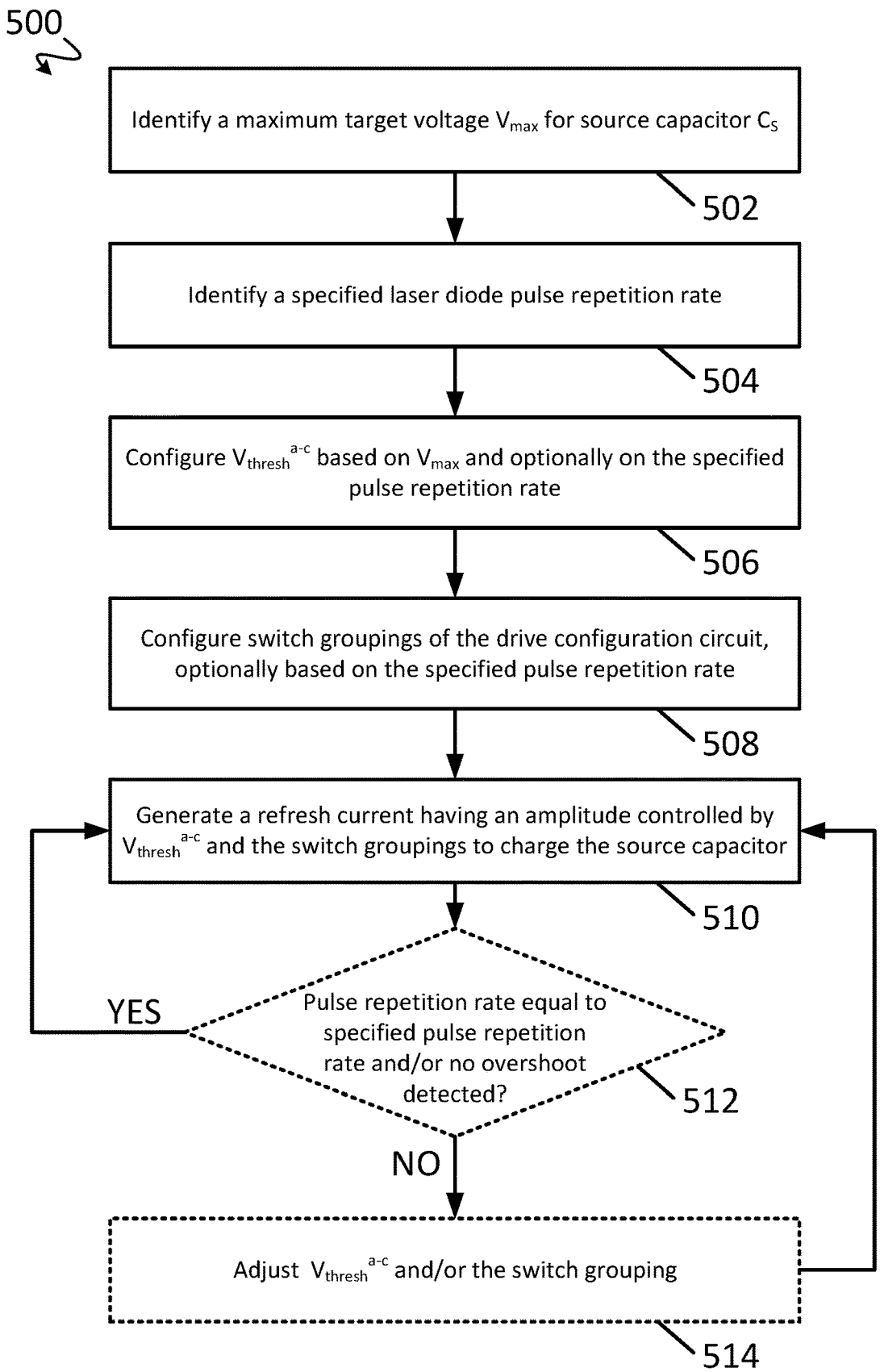
FIG. 5 shows a portion of a simplified process for operating the refresh circuit shown in FIGS. 4A-4B, in accordance with some embodiments.

FIG. 5 shows a portion of a process 500 for operation of the refresh circuit 105 disclosed herein, in accordance with some embodiments. The particular steps, the order of steps, and the combination of steps are shown for illustrative and explanatory purposes only. Other embodiments can implement different particular steps, orders of steps, and combinations of steps to achieve similar functions or results.

At step 502, the maximum target voltage $V_{max}$ that the source capacitor $C_S$ should be charged to by the refresh circuit 105 is identified. In some embodiments, the maximum target voltage $V_{max}$ is identified based on configuration data stored at, accessed by, or received by, the controller 120. For example, in some embodiments, the maximum target voltage $V_{max}$ is identified based on a switch setting and/or resistor setting read by the controller 120. In other embodiments, the maximum target voltage $V_{max}$ may be transmitted to the controller 120 by an external system (not shown). In some embodiments, the maximum target voltage $V_{max}$ is a static value that remains fixed during operation of the pulsed laser diode driver. In other embodiments, the maximum target voltage $V_{max}$ is updated as frequently as on a pulse-to-pulse basis according to laser pulse amplitude and/or power requirements of the pulsed laser diode driver. For example, if a first value of the maximum target voltage $V_{max}$ corresponds to a first pulse amplitude of a laser pulse emitted by a laser diode of the pulsed laser driver, then a second value of the maximum target voltage $V_{max}$ that is less than the first value would correspond to a second pulse amplitude that is less than the first pulse amplitude. Similarly, a third value of the maximum target voltage $V_{max}$ that is greater than the first value would correspond to a third pulse amplitude that is greater than the first pulse amplitude.

At step 504, a specified laser diode pulse repetition frequency is identified. In some embodiments, the specified laser diode pulse repetition frequency is identified based on configuration data stored at, accessed by, or received by, the controller 120. For example, in some embodiments, the specified laser diode pulse repetition frequency is identified based on a switch setting and/or resistor setting read by the controller 120. In other embodiments, the specified laser diode pulse repetition frequency may be transmitted to the controller 120 by an external system (not shown). In some embodiments, the specified laser diode pulse repetition frequency is a static value that remains fixed during operation of the pulsed laser diode driver. In other embodiments, laser pulses are only emitted by the laser diode driver circuit when triggered by an external system. In yet other embodiments, the specified laser diode pulse repetition frequency is updated during operation of the pulsed laser diode driver, based on, for example, a use case or power requirement thereof.

At step 506, voltage amplitudes of the threshold voltages $V_{thresh}^{a-c}$ produced by the threshold voltage generator circuit 402 of the refresh circuit 105 are configured based on the maximum target voltage $V_{max}$ and optionally based on the specified laser diode pulse repetition frequency. In some embodiments, the maximum target voltage $V_{max}$ is provided to the refresh circuit 105 by the controller 120 as part of the control signal Ctrl and the refresh circuit 105 generates the threshold voltages $V_{thresh}^{a-c}$ using the threshold voltage generator circuit 402 based on the received maximum target voltage $V_{max}$. For example, the threshold voltage $V_{thresh}^a$ may be set to 90% of $V_{max}$, $V_{thresh}^c$ may be set to $V_{max}$, and $V_{thresh}^b$ may be set to a value that is in between $V_{thresh}^a$ and $V_{thresh}^c$. In other embodiments, the controller 120 itself uses the maximum target voltage $V_{max}$ to determine voltage amplitudes for each of the threshold voltages $V_{thresh}^{a-c}$ and configures the threshold voltage generator circuit 402 of the refresh circuit 105 (e.g., using the control signal Ctrl) to generate the threshold voltages $V_{thresh}^{a-c}$.

In some embodiments, the specified pulse repetition frequency is received by the refresh circuit 105 from the controller 120 as part of the control signal Ctrl and the refresh circuit 105 generates the threshold voltages $V_{thresh}^{a-c}$ using the threshold voltage generator circuit 402 based on the received specified pulse repetition frequency. For example, based on a specified or determined RC time constant of the source capacitor $C_S$, the controller 120 or the refresh circuit 105 can determine appropriate threshold voltage levels and/or switch groupings to achieve the specified pulse repetition frequency.

The threshold voltages $V_{thresh}^{a-c}$ used by the refresh circuit 105 are operable to control the pulse repetition frequency of the laser diode driver because each respective threshold voltage ultimately corresponds to a particular current amplitude of the refresh current $i_{Refresh}$ which in turn contributes to an achieved refresh rate of the one or more source capacitors $C_S$. For example, if $V_{thresh}{}^a$ were configured to represent 10% of the maximum target voltage $V_{max}$, then the amplitude of the refresh current $i_{Refresh}$ would only be at a maximum current amplitude until the source voltage $V_S$ exceeded 10% of the maximum target voltage $V_{max}$ and would be lower thereafter. As such, a refresh rate of the one or more source capacitors $C_S$ would be slower than if refresh circuit 105 generated the maximum current amplitude for a longer duration. For instance, if $V_{thresh}{}^a$ were instead configured to represent 90% of the maximum target voltage $V_{max}$, then the amplitude of the refresh current $i_{Refresh}$ would be at a maximum until the source voltage $V_S$ exceeded 90% of the maximum target voltage $V_{max}$ and would be lower thereafter. As such, a refresh rate of the one or more source capacitors would be faster than that of the previous example.

At step 508, the drive configuration circuit 412 configures groupings of the switches M1-Mn into sets to be controlled by each of the drive signals $DRV^{a-c}$. In some embodiments, each of the drive signals $DRV^{a-c}$ controls the same number of switches. That is, each set has the same number of switches. In other embodiments, one or more of the drive signals $DRV^{a-c}$ may control a different number of switches as compared to another of the drive signals $DRV^{a-c}$. That is, one or more of the sets may include a different number of switches as compared to the other sets. In some embodiments, the number of switches in each set is determined based on one or more of an amplitude requirement of the refresh current $i_{Refresh}$, an on-resistance of each of the switches M1-Mn, and/or a capacitance of the source capacitor(s) $C_S$.

In some embodiments, the drive configuration circuit 412 may optionally also receive the specified pulse repetition frequency as part of the control signal Ctrl and configure switch groupings of the drive configuration circuit 412 based on the received specified pulse repetition frequency. In such embodiments, the controller 120 may use the specified pulse repetition frequency to determine switch groupings of the drive configuration circuit 412 and configure the drive configuration circuit 412 (e.g., using the control signal Ctrl) according to the determined switch groupings. Similar to the threshold voltages, groupings of the switches M1-Mn controlled by the drive signals $DRV^{a-c}$ via the signal routing and control circuit 414 can advantageously adjust the pulse repetition frequency of the laser diode driver circuit. That is, the number of switches configured by the signal routing and control circuit 414 to be enabled based on each of the drive signals $DRV^{a-c}$ will adjust the amplitude of the refresh current $i_{Refresh}$, and will therefore advantageously adjust the pulse repetition frequency of the laser diode driver circuit when a capacitance of the source capacitor $C_S$ is constant. For example, if the signal routing and control circuit 414 is configured such that three of the switches M1-Mn are enabled in parallel when the drive signal $DRV^a$ is asserted, then the amplitude of the refresh current $i_{Refresh}$ will be greater, and the source capacitor $C_S$ will charge faster, than if the signal routing and control circuit 414 were configured such that only one of the switches M1-Mn is enabled when the drive signal $DRV^a$ is asserted. By adjusting voltage levels of the threshold voltages $V_{thresh}{}^{a-c}$ and/or grouping of the switches M1-Mn, the pulse repetition frequency of the laser diode driver circuit can be advantageously configured, updated, or adjusted.

At step 510, the refresh current $i_{Refresh}$ is generated by the refresh circuit 105 based on a comparison of the threshold voltages $V_{thresh}{}^{a-c}$ to the representative source voltage signal $V_S^{atten}$ and further based on the switch groupings of the drive configuration circuit 412. As the refresh current $i_{Refresh}$ charges the source capacitor $C_S$, the developed source voltage $V_S$ is received at the refresh circuit 105 which, as described above, controls an amplitude of the refresh current $i_{Refresh}$ according to a voltage level of the source voltage $V_S$.

In some embodiments, operation of the refresh circuit 105 remains at step 510 during operation of the laser diode driver. That is, once configured either by configuration data or a hardware setting (e.g., a switch or resistor), the refresh circuit 105 maintains the same threshold voltages $V_{thresh}{}^{a-c}$ and switch groupings of the switches M1-Mn. In such embodiments, flow of the process 500 returns to 502 at a power-on, reset, or initialization event. In other embodiments, flow continues to optional step 512. At optional step 512, it is determined if the pulse repetition frequency achieved by the laser diode driver is equal to the specified pulse repetition frequency and/or that no voltage overshoot of the source voltage $V_S$ was detected. Voltage overshoot of the source voltage $V_S$ occurs when the source voltage $V_S$ exceeds the maximum target voltage $V_{max}$ by more than a specified voltage amount (e.g., 0.1% of $V_{max}$, 1% of $V_{max}$, 2% of $V_{max}$, 5% of $V_{max}$, etc.) according to design parameters or device limitations. In some embodiments, the determination of step 512 is performed by the controller 120. In other embodiments, the determination of step 512 is performed by the refresh circuit 105 (e.g., using a controller within the threshold voltage generator 402 to make such determinations and to subsequently adjust the threshold voltages of the threshold voltage generator 402 and/or switch groupings of the drive configuration circuit 412).

To determine at step 512 that voltage overshoot has occurred, in some embodiments, the controller 120 may compare the voltage level of the source voltage $V_S$ to an overshoot threshold voltage that is either equal to the maximum target voltage $V_{max}$, or to the maximum target voltage $V_{max}$ plus an offset voltage according to design requirements or device limitations. If the source voltage $V_S$ surpasses the overshoot threshold voltage, then the controller 120 has determined that voltage overshoot has occurred and accordingly causes the refresh circuit 105 to adjust the threshold voltages $V_{thresh}{}^{a-c}$ and/or the switch groupings of the drive configuration circuit 412 to reduce or eliminate the voltage overshoot.

To determine at step 512 that the achieved pulse repetition rate does not equal the specified pulse repetition rate, the controller 120 may monitor a charge time for the source capacitor $C_S$ using timing circuits that are well known in the art to determine if the specified pulse repetition frequency is met. If it is determined at step 512 that the achieved pulse repetition frequency of the laser diode driver is equal to the specified pulse repetition frequency and/or that no voltage overshoot was detected, flow continues back to step 510. On the other hand, if it was determined at step 512 that the achieved pulse repetition frequency of the laser diode driver is not equal to the specified pulse repetition frequency and/or that voltage overshoot was detected, flow continues to step 514. At step 514 one or both of the threshold voltages $V_{thresh}{}^{a-c}$ and switch groupings of the switches M1-Mn are adjusted before flow returns to step 510. For example, if it is determined at step 512 that the achieved pulse repetition frequency is lower than the specified pulse repetition frequency, then $V_{thresh}{}^a$ may be increased from its previous value so that the amplitude of the refresh current $i_{Refresh}$ is higher than it was previously for a greater percentage of a charging cycle for the source capacitor $C_S$ to thereby charge the source capacitor $C_S$ faster as compared to the previous rate. Additionally, or alternatively, the number of switches M1-Mn controlled by one or more of the drive signals $DRV^{a-c}$ could be increased, thereby increasing an amplitude of the refresh current $i_{Refresh}$ controlled by one or more of the drive signals $DRV^{a-c}$ to charge the source capacitor $C_S$ at a correspondingly faster rate.

Similarly, if it is determined by the controller 120 that a voltage level of the source capacitor is overshooting, i.e., surpassing the maximum target voltage $V_{max}$, then $V_{thresh}^a$ and/or $V_{thresh}^b$ may be decreased from their previous values so that the amplitude of the refresh current $i_{Refresh}$ is lower than it was previously for a greater percentage of a charging cycle for the source capacitor $C_S$ to thereby charge the source capacitor $C_S$ more slowly as compared to the previous rate. Additionally, or alternatively, the number of switches M1-Mn controlled by one or more of the drive signals $DRV^{a-c}$ could be decreased, thereby decreasing an amplitude of the refresh current $i_{Refresh}$ controlled by one or more of the drive signals $DRV^{a-c}$ to charge the source capacitor $C_S$ at a correspondingly slower rate. In such embodiments, the controller 120 may determine that overshoot has occurred using a comparator, or other voltage sensing circuit as is known in the art.

Figure 6A:
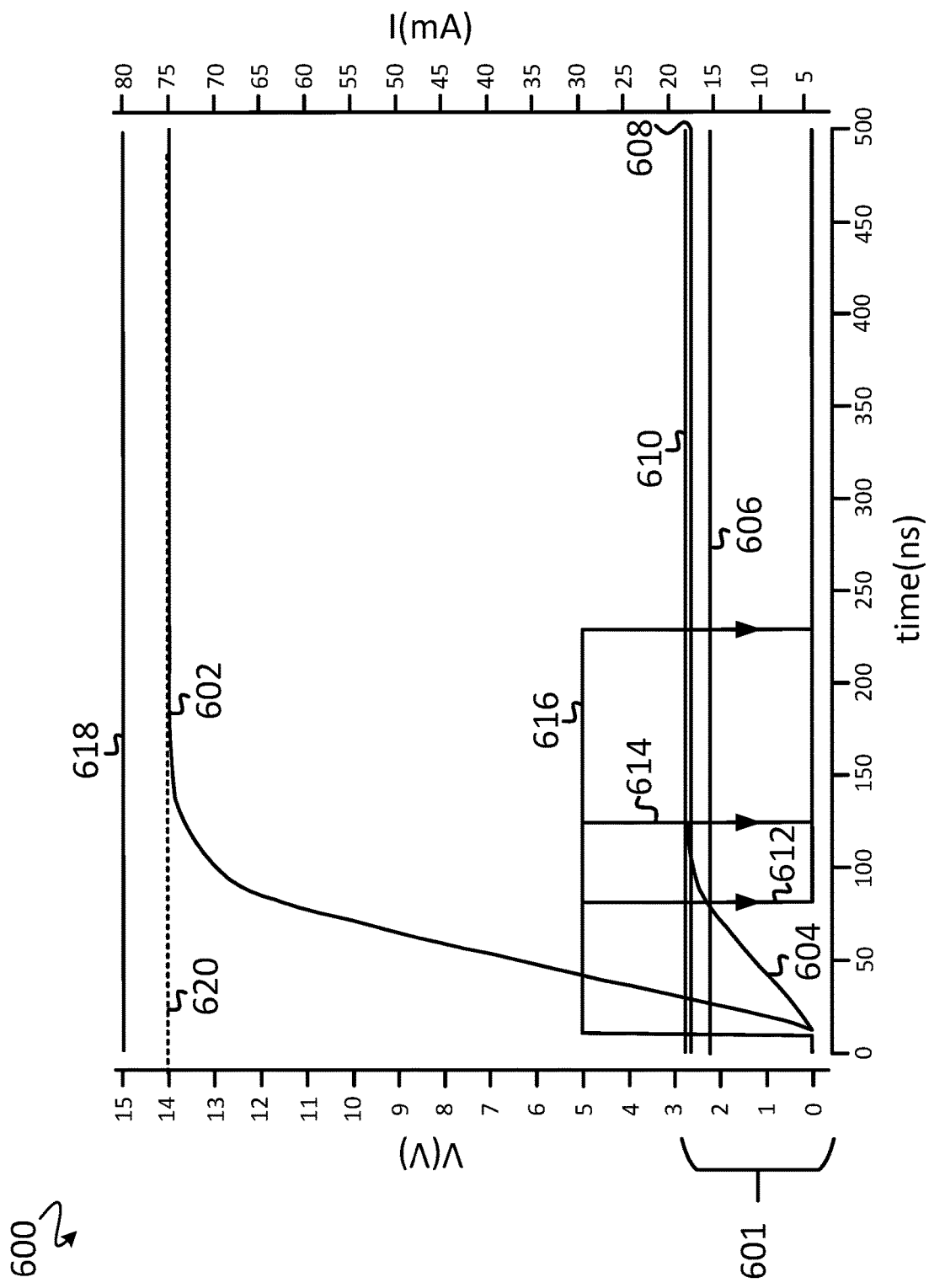

FIG. 6A shows a simplified graph 600 of signals related to the operation of the refresh circuit 105 shown in FIG. 4A, in accordance with some embodiments. The graph 600 includes, across time in nano seconds, a plot 602 of the source voltage $V_S$, a plot 604 of the representative source voltage signal $V_S^{atten}$, a plot 606 of the threshold voltage level $V_{thresh}^a$, a plot 608 of the threshold voltage level $V_{thresh}^b$, a plot 610 of the threshold voltage level $V_{thresh}^c$, a plot 612 of the drive signal $DRV^a$, a plot 614 of the drive signal $DRV^b$, a plot 616 of the drive signal $DRV^c$, a plot 618 of the DC input voltage Vin, and a dashed line 620 that represents the maximum target voltage $V_{max}$ that the refresh circuit 105 should charge the source capacitor $C_S$ to. As shown, as the amplitude of the representative source voltage signal $V_S^{atten}$ shown in the plot 604 exceeds each of the threshold voltage levels $V_{thresh}^{a-c}$ shown in the plots 606, 608, and 610, a respective one of the drive signals $DRV^{a-c}$ is disabled. Because of a fast response time of the comparators 406a-c, the source capacitor $C_S$ can advantageously be rapidly charged by the refresh circuit 105 to the maximum target voltage $V_{max}$ without exceeding the maximum target voltage $V_{max}$. A portion 601 of the simplified graph 600 is shown in FIG. 6B.

FIG. 6B shows an enlarged portion 601 of the simplified graph 600 of FIG. 6A, in accordance with some embodiments. The enlarged portion 601 shows the same duration of time as that of the simplified graph 600, but only includes the portion of the vertical axis of the simplified graph 600 ranging from 0V to 2.85V. The graph 601 includes the plot 604 of the representative source voltage signal $V_S^{atten}$, the plot 606 of the threshold voltage level $V_{thresh}^a$, the plot 608 of the threshold voltage level $V_{thresh}^b$, the plot 610 of the threshold voltage level $V_{thresh}^c$, the plot 612 of the drive signal $DRV^a$, the plot 614 of the drive signal $DRV^b$, and the plot 616 of the drive signal $DRV^c$. As shown by the plot 604 of the representative source voltage signal $V_S^{atten}$, the source capacitor $C_S$ is charged at a first rate when the drive signals $DRV^{a-c}$ are enabled from about time=0 until about time=90 ns. Then, the source capacitor $C_S$ is charged at a second, lower rate when the drive signals $DRV^{b-c}$ are enabled from about time=90 ns until about time=140 ns. Then, the source capacitor $C_S$ is charged at a third, still lower rate when the drive signal $DRV^c$ is enabled from about time=140 ns until about time=225 nS.

FIGS. 7A-D are simplified circuit schematics of pulsed laser diode drivers 701-704 of a second general topology that is configured to drive two or more laser diodes in a common anode arrangement, in accordance with some embodiments. The pulsed laser diode drivers 701-704 each generally include the controller 120, the refresh circuit 105, the source capacitor $C_S$, the damping resistor $R^{Damp}$, the inductor $L_S$, the bypass capacitor $C_{BP}$, two or more laser diodes $D_L^1$-$D_L^n$, and the bypass switch $M_{BP}$. The pulsed laser diode drivers 701-702 each include two or more laser diode switches $M_{DL}^1$-$M_{DL}^n$, whereas the pulsed laser diode drivers 703-704 include a single laser diode switch $M_{DL}^1$.

Also shown are nodes 710, 712, respective parasitic inductances $L_{DL}^1$-$L_{DL}^n$ of the laser diodes $D_L^1$-$D_L^n$, the DC input voltage $V_{in}$, the source voltage $V_S$ at the source capacitor $C_S$, the refresh current $i_{Refresh}$, the current $i_{LS}$ through the inductor $L_S$, respective currents $i_{DL}^1$-$i_{DL}^n$ through the laser diodes $D_L^1$-$D_L^n$, and the bypass switch gate driver signal $GATE_{BP}$. The pulsed laser diode drivers 701-702 each utilize respective laser diode switch gate driver signals $GATE_{DL}^1$-$GATE_{DL}^n$, whereas the pulsed laser diode drivers 703-704 use a single laser diode switch gate driver signal $GATE_{DL}^1$. Electrical connections of the pulsed laser diode drivers 701-704 are similar to, or the same as, those described with respect to the pulsed laser diode drivers 101-103. Topologies of the pulsed laser diode drivers 701-704 vary with respect to the placement of the bypass capacitor $C_{BP}$.

Figure 7A:
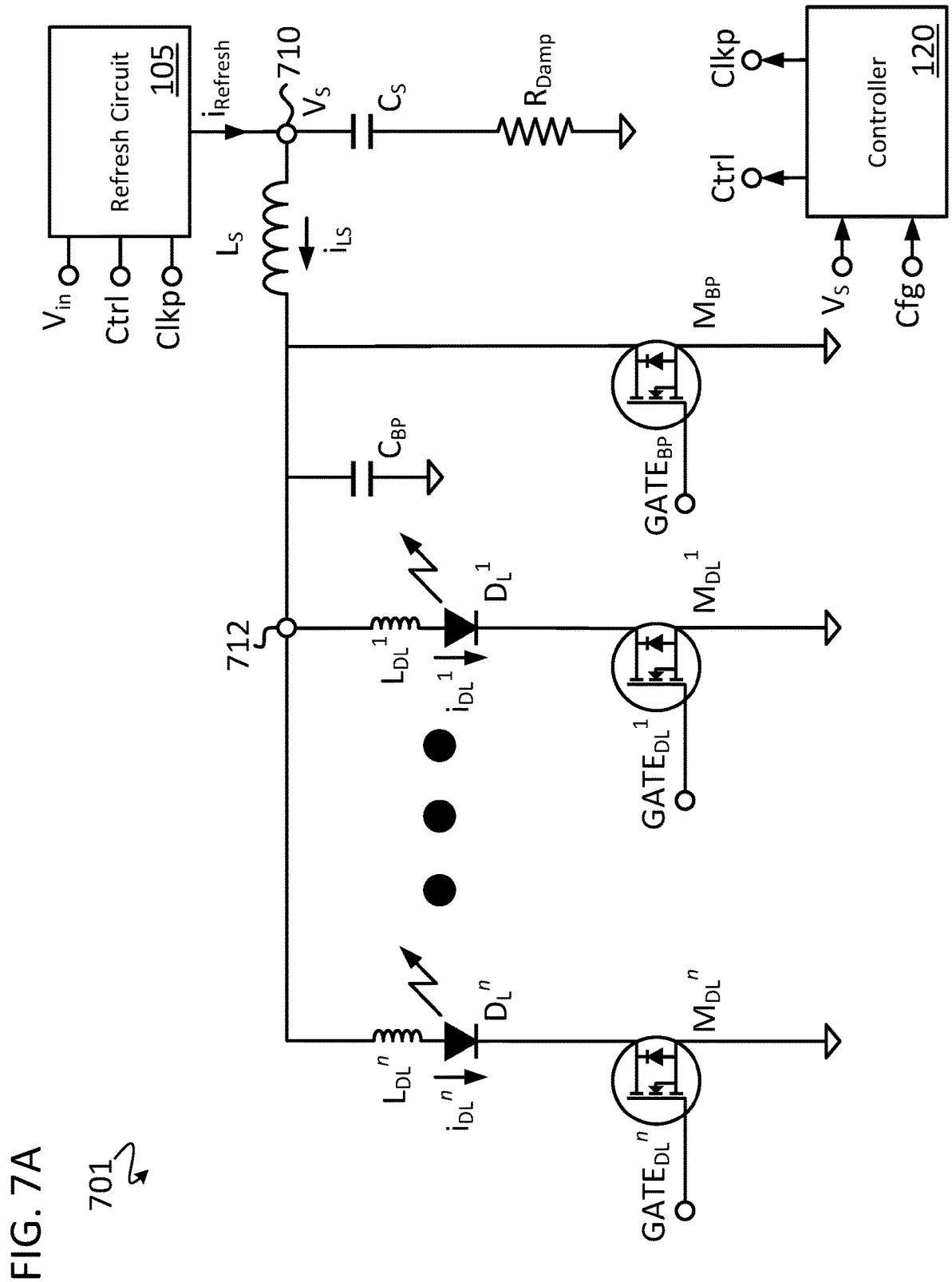
FIGS. 7A-7D are simplified circuit schematics of pulsed laser diode drivers of a second general topology, in accordance with some embodiments.
Figure 7B:
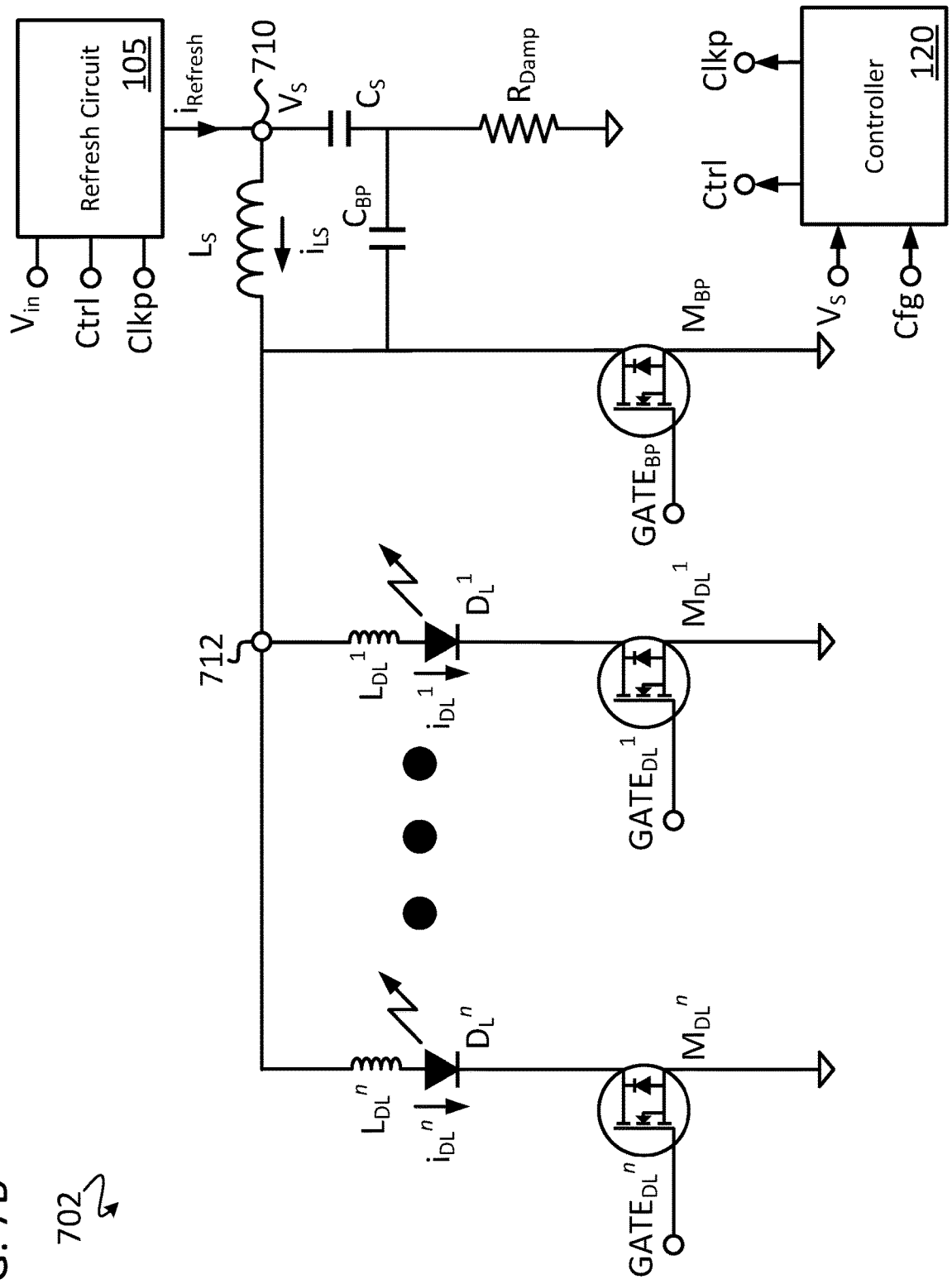
Figure 7C:
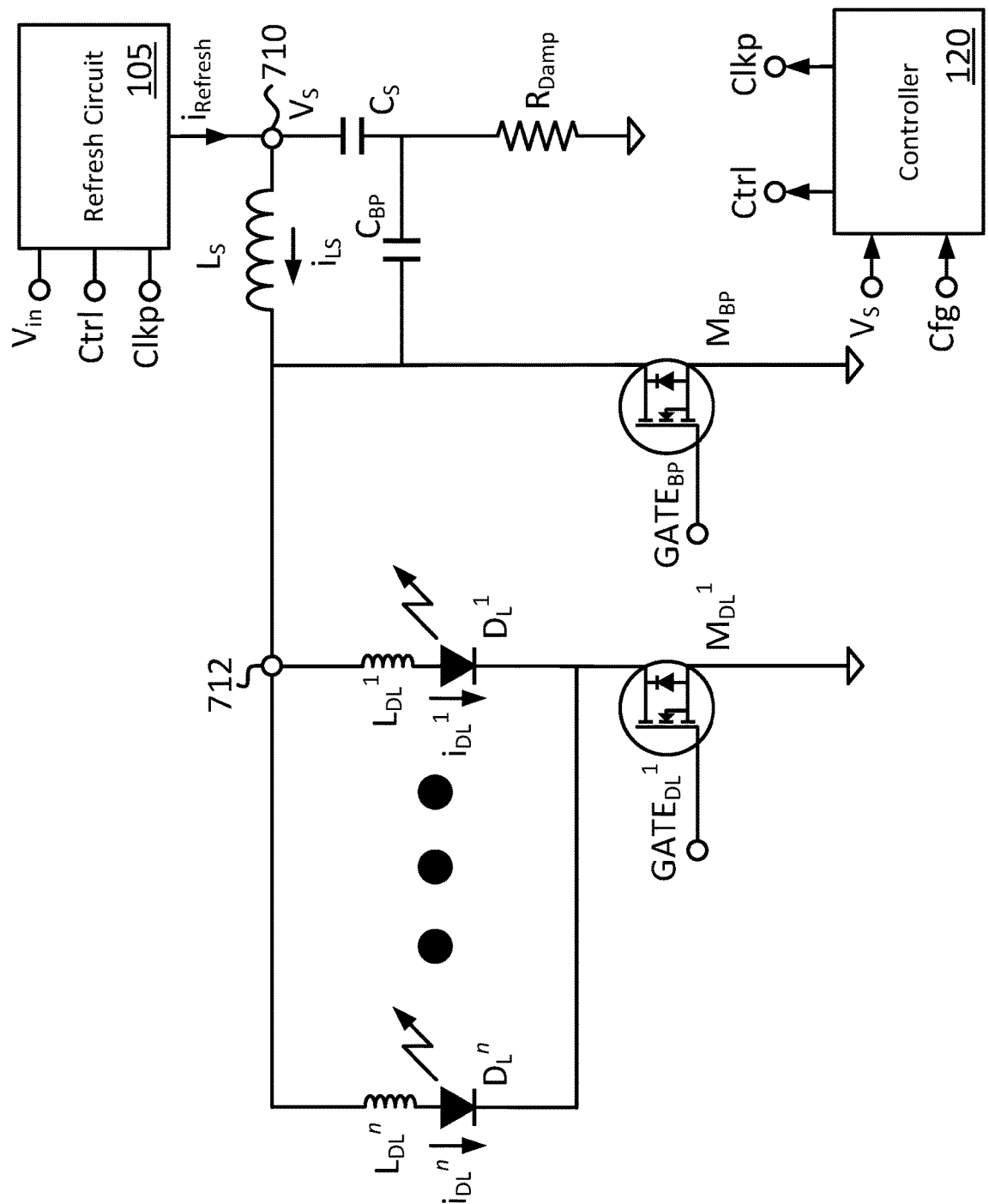
Figure 7D:
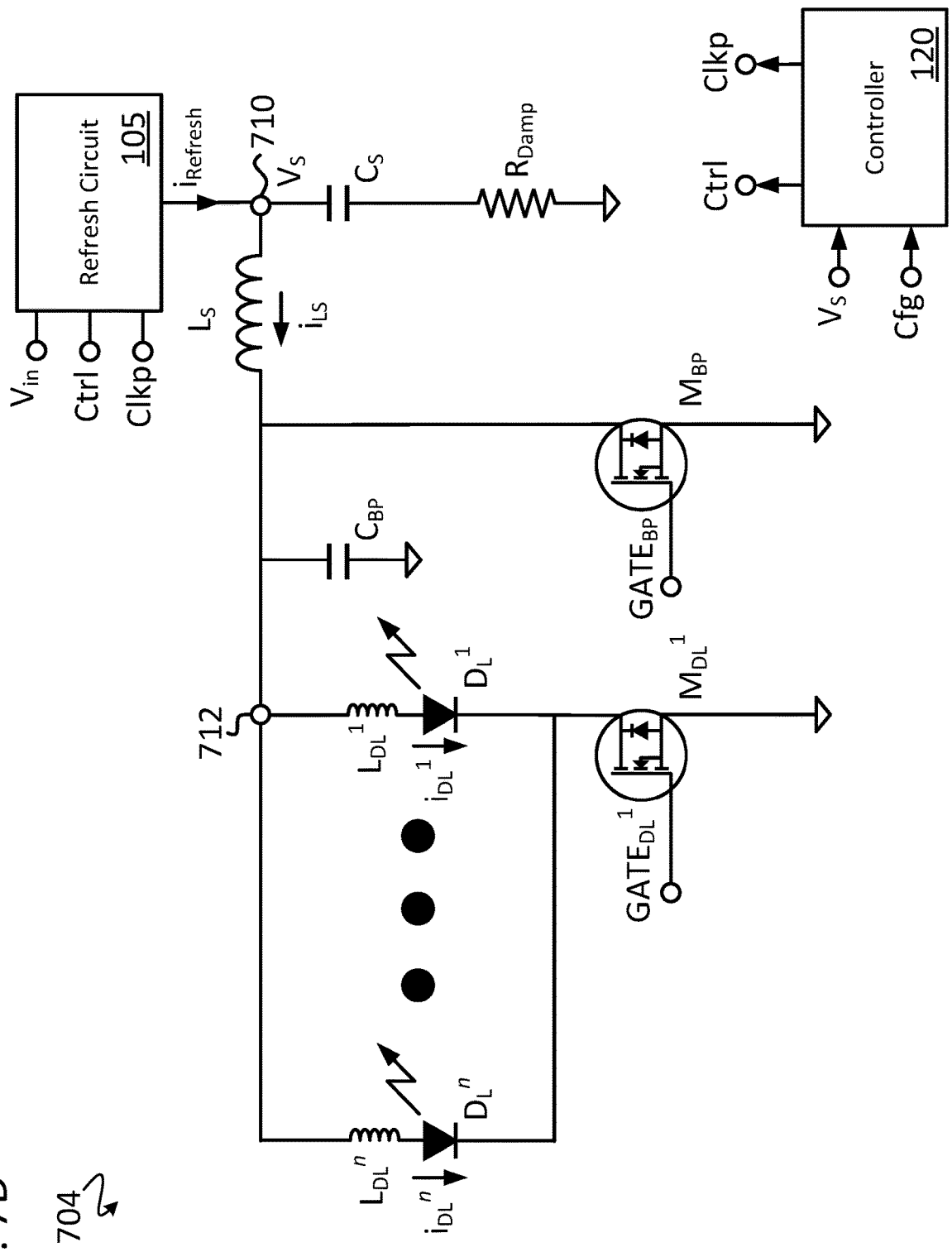

As shown in the simplified circuit schematics of the pulsed laser diode driver 701 of FIG. 7A and the pulsed laser diode driver 704 of FIG. 7D, in some embodiments the first terminal of the bypass capacitor $C_{BP}$ is directly electrically connected to the second terminal of the inductor $L_S$ and to the anodes of the laser diodes $D_L^1$-$D_L^n$. In such embodiments, the second terminal of the bypass capacitor $C_{BP}$ is directly electrically connected to the bias voltage node. As shown in the simplified circuit schematic of the pulsed laser diode drivers 702-703 of FIGS. 7B-C, in some embodiments the first terminal of the bypass capacitor $C_{BP}$ is directly electrically connected to the second terminal of the inductor $L_S$ and to the respective anodes of the laser diodes $D_L^1$-$D_L^n$. In such embodiments, the second terminal of the bypass capacitor $C_{BP}$ is directly electrically connected to the second terminal of the source capacitor $C_S$ and to the first terminal of the damping resistor $R_{Damp}$. In some embodiments, values of the DC input voltage $V_{in}$, inductance of the inductor $L_S$, capacitance of the source capacitor $C_S$, resistance of the damping resistor $R_{Damp}$, and capacitance of the bypass capacitor $C_{BP}$ are similar to, or the same as, those respective values as described with reference to the pulsed laser diode drivers 101-103. However, the values of the DC input voltage $V_{in}$, inductance of the inductor $L_S$, capacitance of the source capacitor $C_S$, resistance of the damping resistor $R_{Damp}$, and capacitance of the bypass capacitor $C_{BP}$ can advantageously be selected to achieve desired operation of the pulsed laser diode drivers 701-704 (e.g., a charge time, a pulse width, a pulse voltage, a pulse current level). Operation of the pulsed laser diode drivers 701-704 is similar to, or the same as, operation of the pulsed laser diode drivers 101-103 as explained in detail with respect to the simplified plots 201-206 of FIGS. 2A-D, as well as the example switching sequence 300 shown in FIG. 3.

In some embodiments, the controller 120 is configured to determine how many of the laser diodes $D_L^1$-$D_L^n$ are enabled simultaneously and to adjust a voltage level of the DC input voltage $V_{in}$ in accordance with that determination to supply a required amount of current (e.g., using a digitally adjustable voltage source controlled by a digital control signal from the controller 120).

FIGS. 8A-D are simplified circuit schematics of pulsed laser diode drivers 801-804 of a third general topology that is configured to drive a laser diode using a high-side switch, in accordance with some embodiments. The pulsed laser diode drivers 801-804 each generally include the controller 120, the refresh circuit 105, the source capacitor $C_S$, the damping resistor $R_{Damp}$, the inductor $L_S$, the bypass capacitor $C_{BP}$, the laser diode $D_L$, the bypass switch $M_{BP}$, and the laser diode switch $M_{DL}$. The laser diode switch $M_{DL}$ is configured as a high-side switch.

Also shown are nodes 810, 812, the parasitic inductance $L_{DL}$ of the laser diode $D_L$, the DC input voltage $V_{in}$, the refresh current $i_{Refresh}$, the source voltage $V_S$ at the source capacitor $C_S$, the current $i_{LS}$ through the inductor $L_S$, the current $i_{DL}$ through the laser diode $D_L$, the bypass switch gate driver signal $GATE_{BP}$, and the laser diode switch gate driver signal $GATE_{DL}$. Most of the electrical connections of the pulsed laser diode drivers 801-804 are similar to, or are the same as, those described with respect to the pulsed laser diode drivers 101-103. However, in contrast to the low-side configuration of the pulsed laser diode drivers 101-103, the drain node of the laser diode switch $M_{DL}$ is directly electrically connected to the second terminal of the inductor $L_S$ and to the drain node of the bypass switch $M_{BP}$. The source node of the laser diode switch $M_{DL}$ is directly electrically connected to the anode of the laser diode $D_L$, and the cathode of the laser diode $D_L$ is directly electrically connected to the bias voltage node. Topologies of the pulsed laser diode drivers 801-804 vary with respect to placement of the bypass capacitor $C_{BP}$.

Figure 8A:
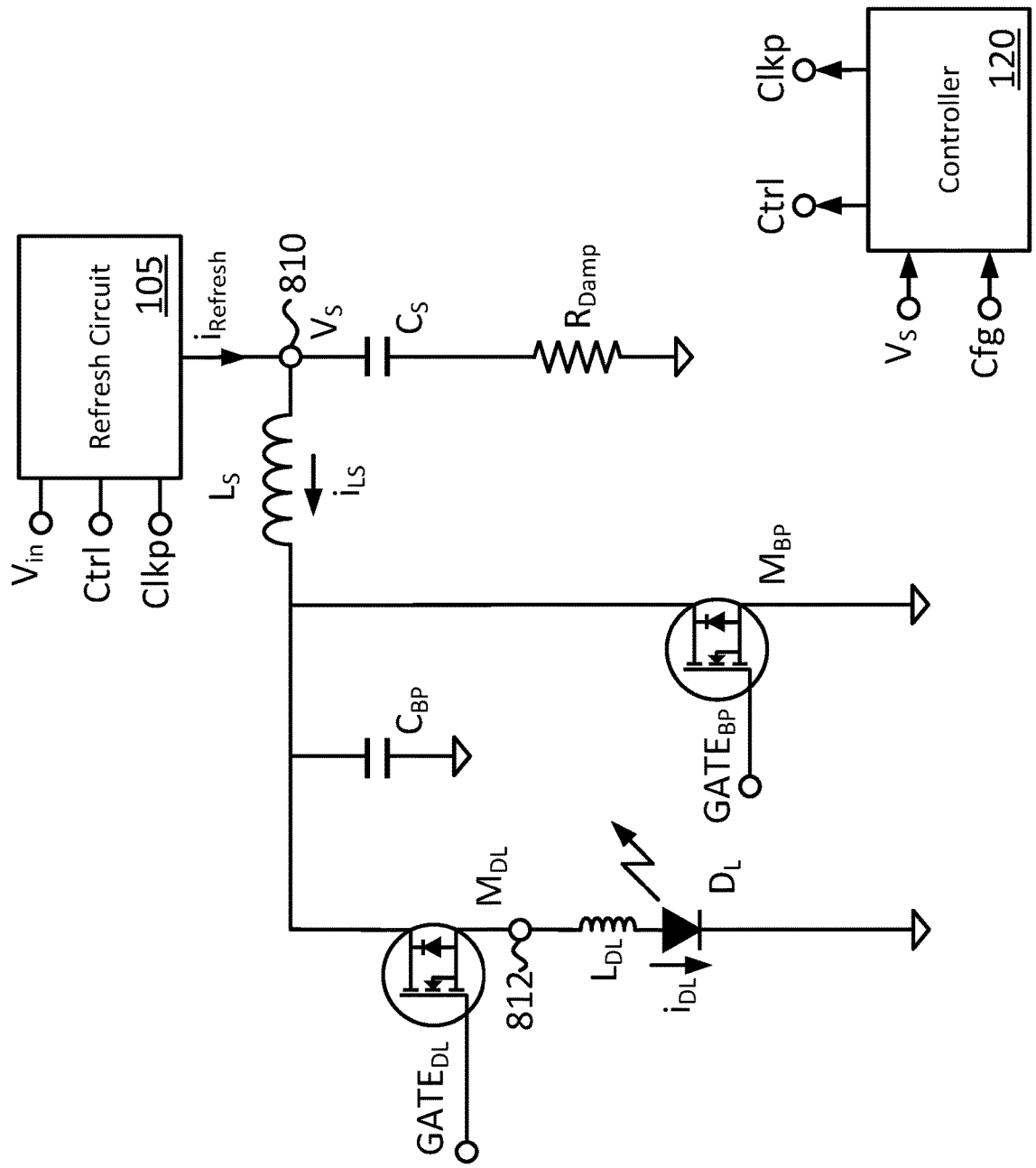
FIGS. 8A-8D are simplified circuit schematics of pulsed laser diode drivers of a third general topology, in accordance with some embodiments.
Figure 8B:
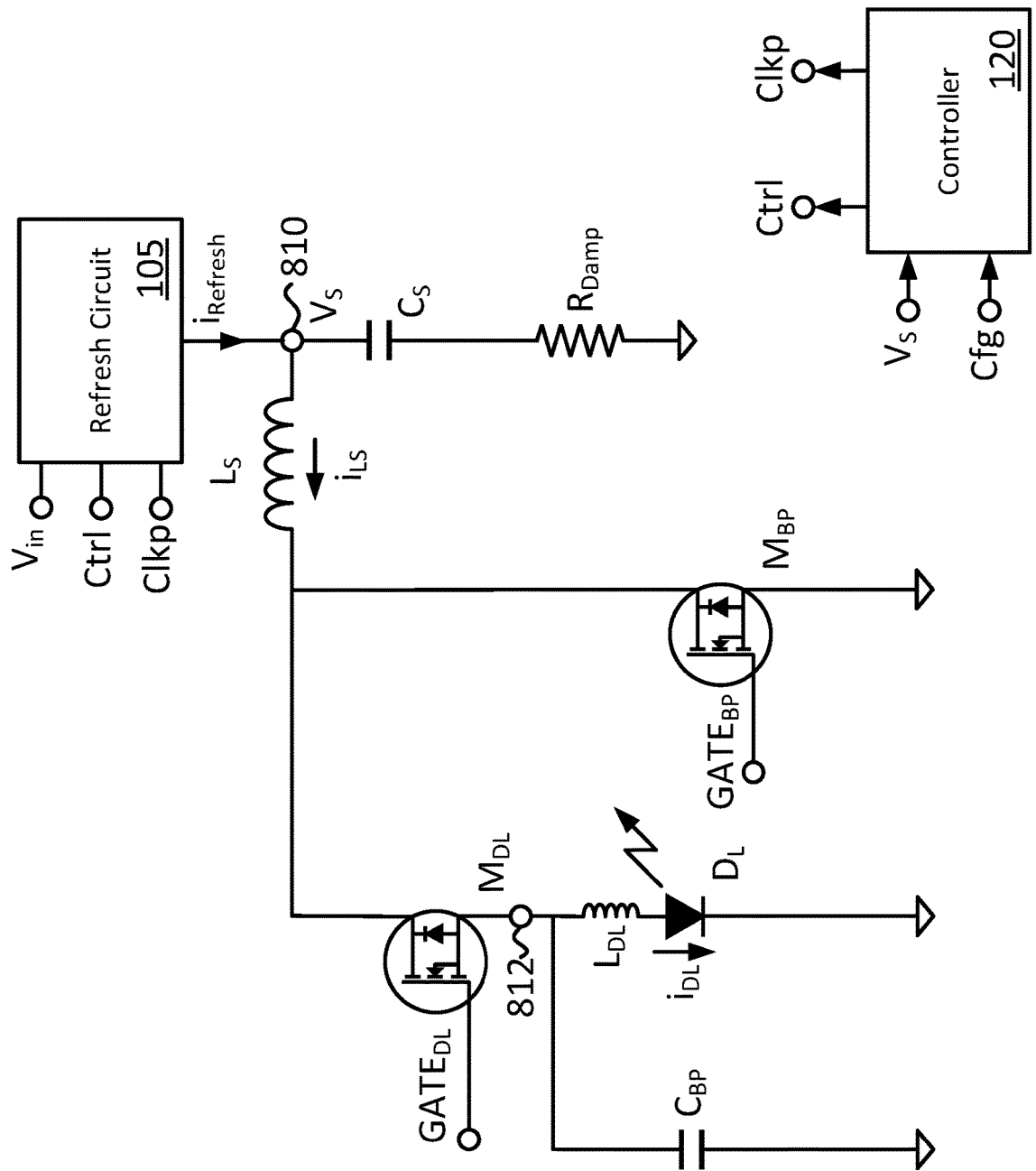
Figure 8C:
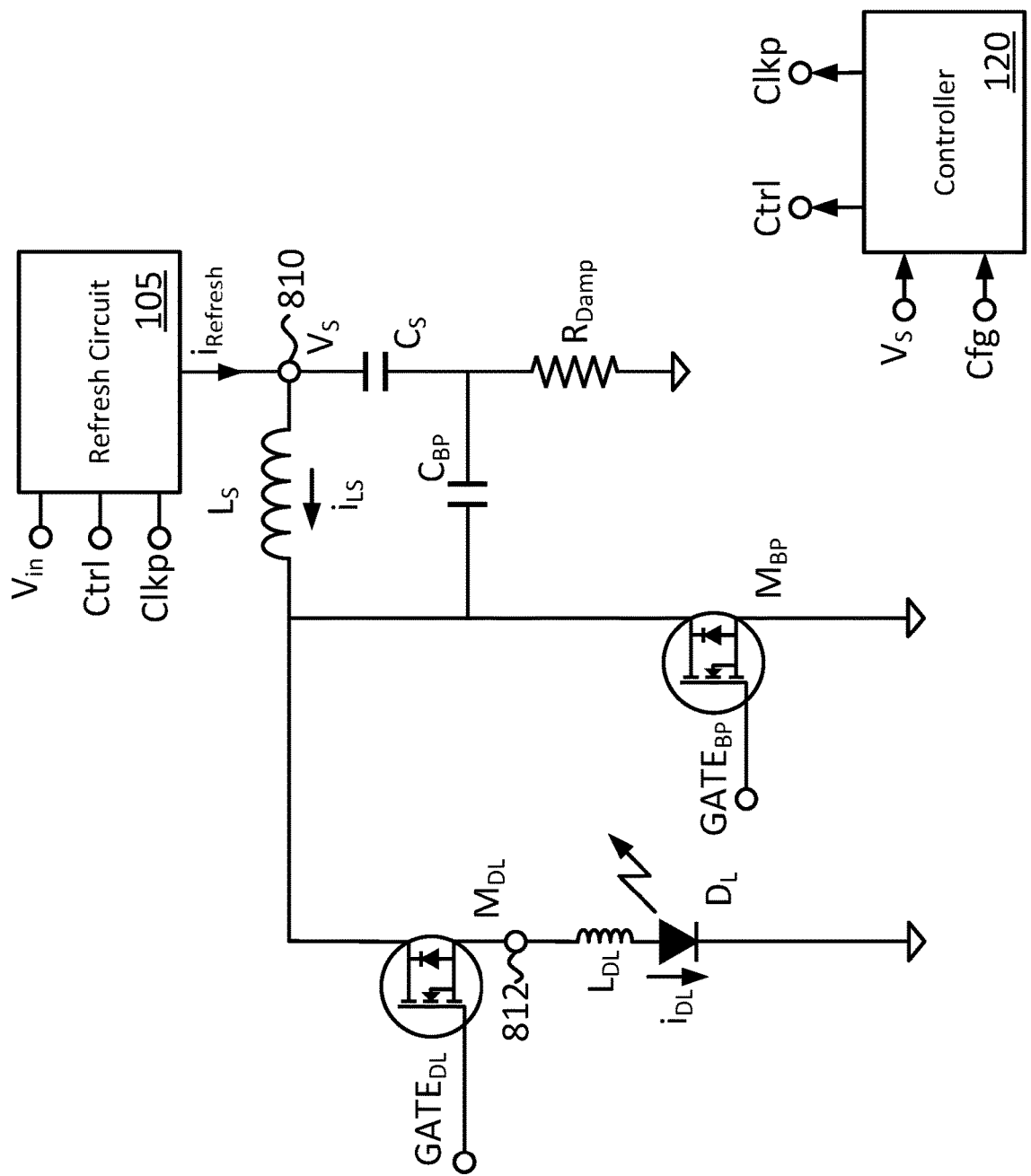
Figure 8D:
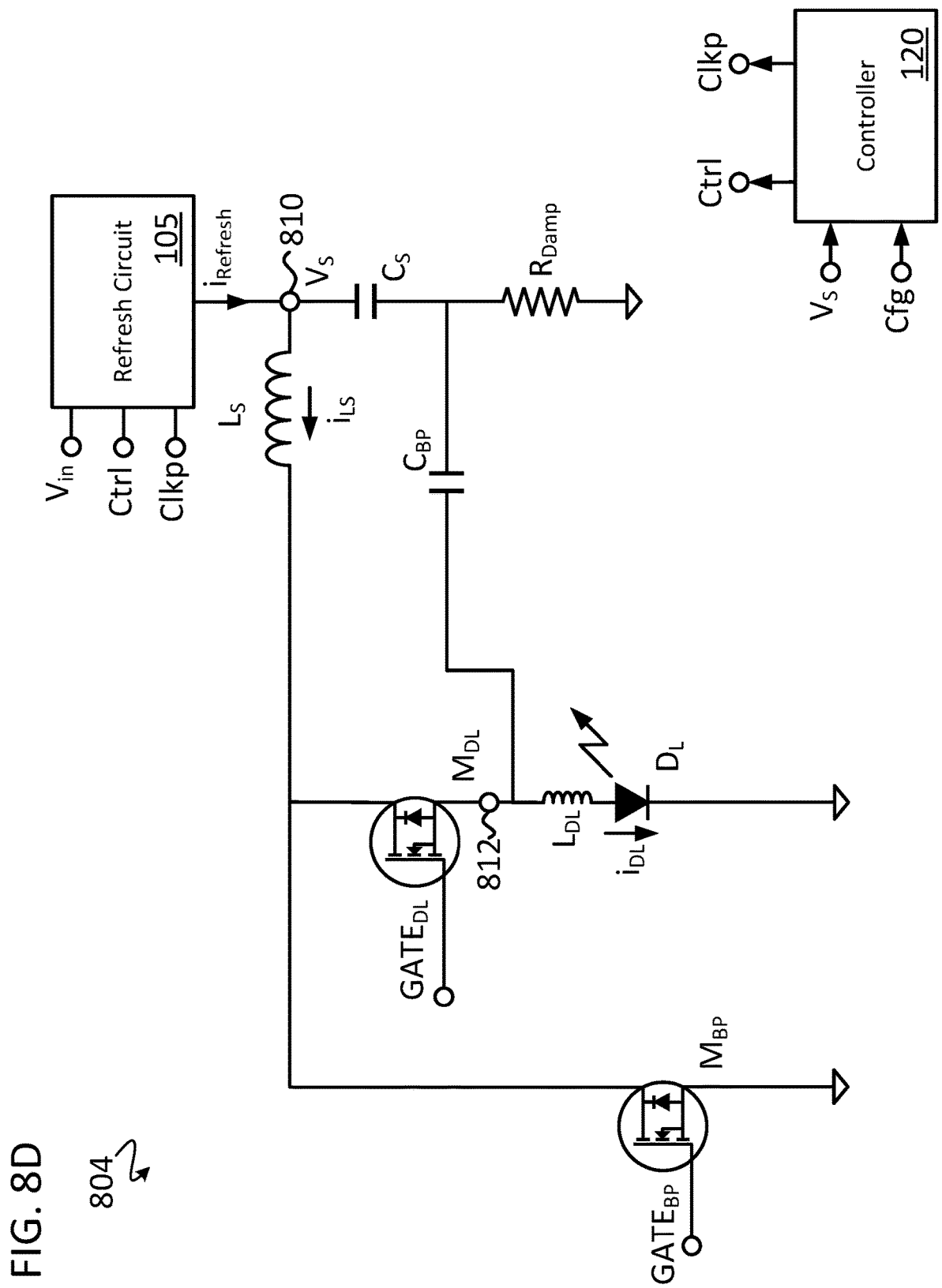

As shown in the simplified circuit schematic of the pulsed laser diode driver 801 of FIG. 8A, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is directly electrically connected to the bias voltage node. As shown in the simplified circuit schematic of the pulsed laser diode driver 802 of FIG. 8B, in some embodiments the first terminal of the bypass capacitor $C_{BP}$ is directly electrically connected to the source node of the laser diode switch $M_{DL}$ and to the anode of the laser diode $D_L$. In such embodiments, the second terminal of the bypass capacitor $C_{BP}$ is directly electrically connected to the bias voltage node. As shown in the simplified circuit schematic of the pulsed laser diode driver 803 of FIG. 8C, in some embodiments the first terminal of the bypass capacitor $C_{BP}$ is directly electrically connected to the second terminal of the inductor $L_S$, to the drain node of the bypass switch $M_{BP}$, and to the drain node of the laser diode switch $M_{DL}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 804 of FIG. 8D, in some embodiments the first terminal of the bypass capacitor $C_{BP}$ is directly electrically connected to the source node of the laser diode switch $M_{DL}$ and the anode of the laser diode $D_L$. In such embodiments, the second terminal of the bypass capacitor $C_{BP}$ is directly electrically connected to the second terminal of the source capacitor $C_S$ and to the first terminal of the damping resistor $R_{Damp}$.

FIGS. 9A-D are simplified circuit schematics of pulsed laser diode drivers 901-904 of a fourth general topology that is configured to drive two or more laser diodes in a common cathode configuration using a high-side switch, in accordance with some embodiments. The pulsed laser diode drivers 901-904 each generally include the controller 120, the refresh circuit 105, the source capacitor $C_S$, the damping resistor $R_{Damp}$, the inductor $L_S$, the bypass capacitor $C_{BP}$, the bypass switch $M_{BP}$, two or more laser diodes $D_L^1$-$D_L^n$, and two or more respective laser diode switches $M_{DL}^1$-$M_{DL}^n$.

Also shown are nodes 910, 912, 914, respective parasitic inductances $L_{DL}^1$-$L_{DL}^n$ of the laser diodes $D_L^1$-$D_L^n$, the DC input voltage $V_{in}$, the refresh current $i_{Refresh}$, the source voltage $V_S$ at the source capacitor $C_S$, the current $i_{LS}$ through the inductor $L_S$, respective currents $i_{DL}^1$-$i_{DL}^n$ through the laser diodes $D_L^1$-$D_L^n$, the bypass switch gate driver signal $GATE_{BP}$, and respective laser diode switch gate driver signals $GATE_{DL}^1$-$GATE_{DL}^n$ of the laser diode switches $M_{DL}^1$-$M_{DL}^n$.

Most of the electrical connections of the pulsed laser diode drivers 901-904 are similar to, or are the same as, those described with respect to the pulsed laser diode drivers 801-804. However, topologies of the pulsed laser diode drivers 901-904 vary from one another with respect to placement of the bypass capacitor $C_{BP}$.

Figure 9A:
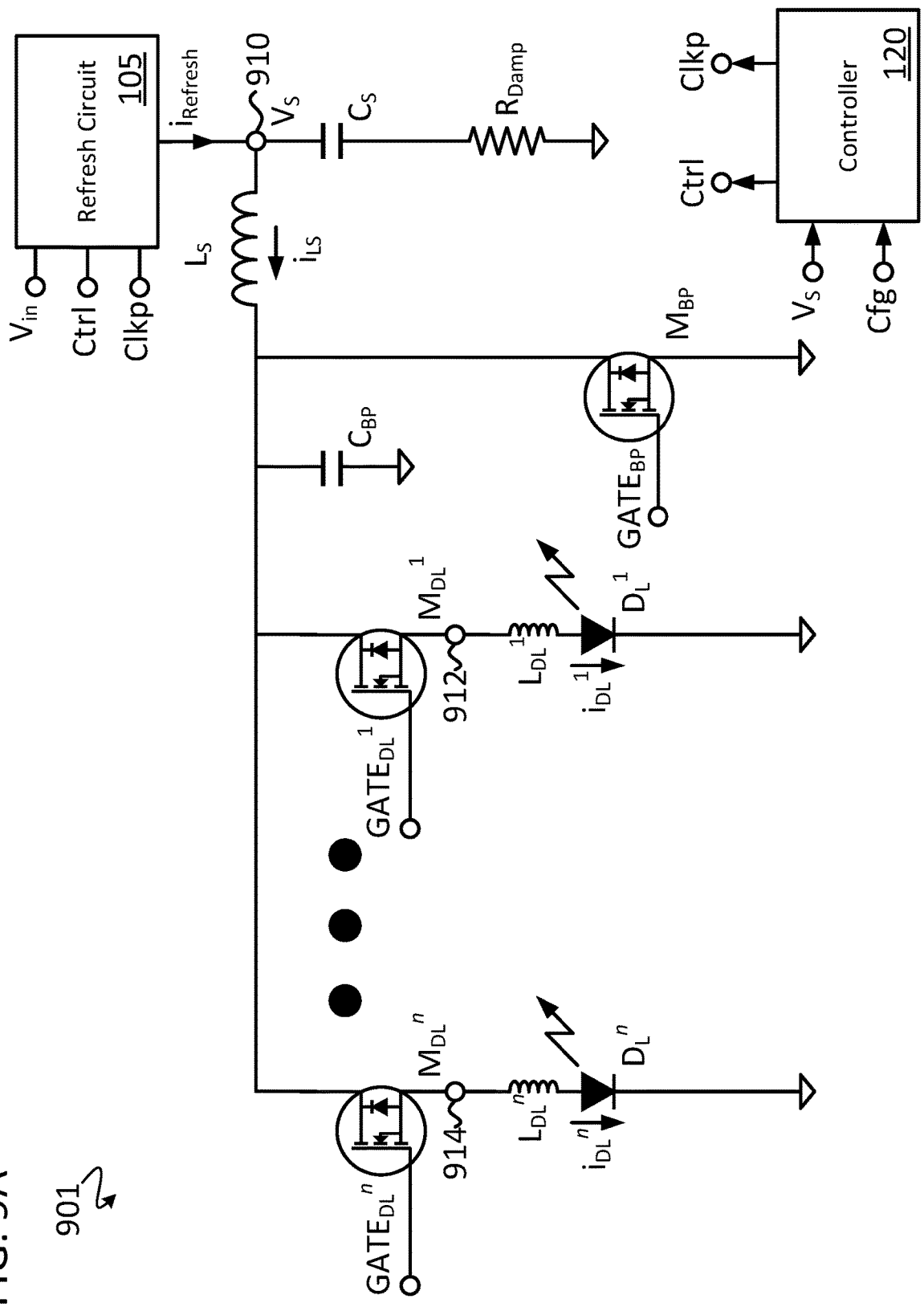
FIGS. 9A-9D are simplified circuit schematics of pulsed laser diode drivers of a fourth general topology, in accordance with some embodiments.
Figure 9B:
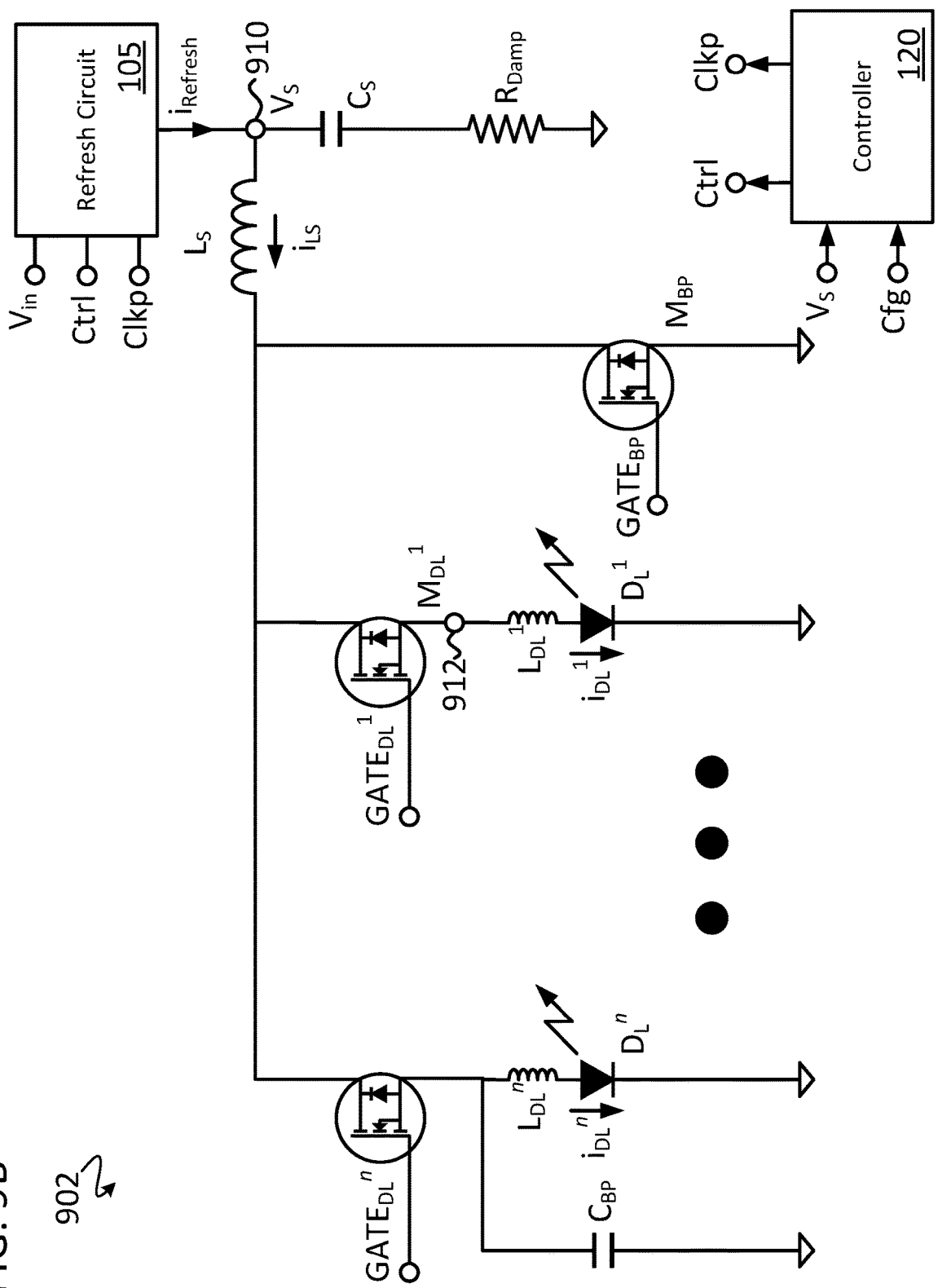
Figure 9C:
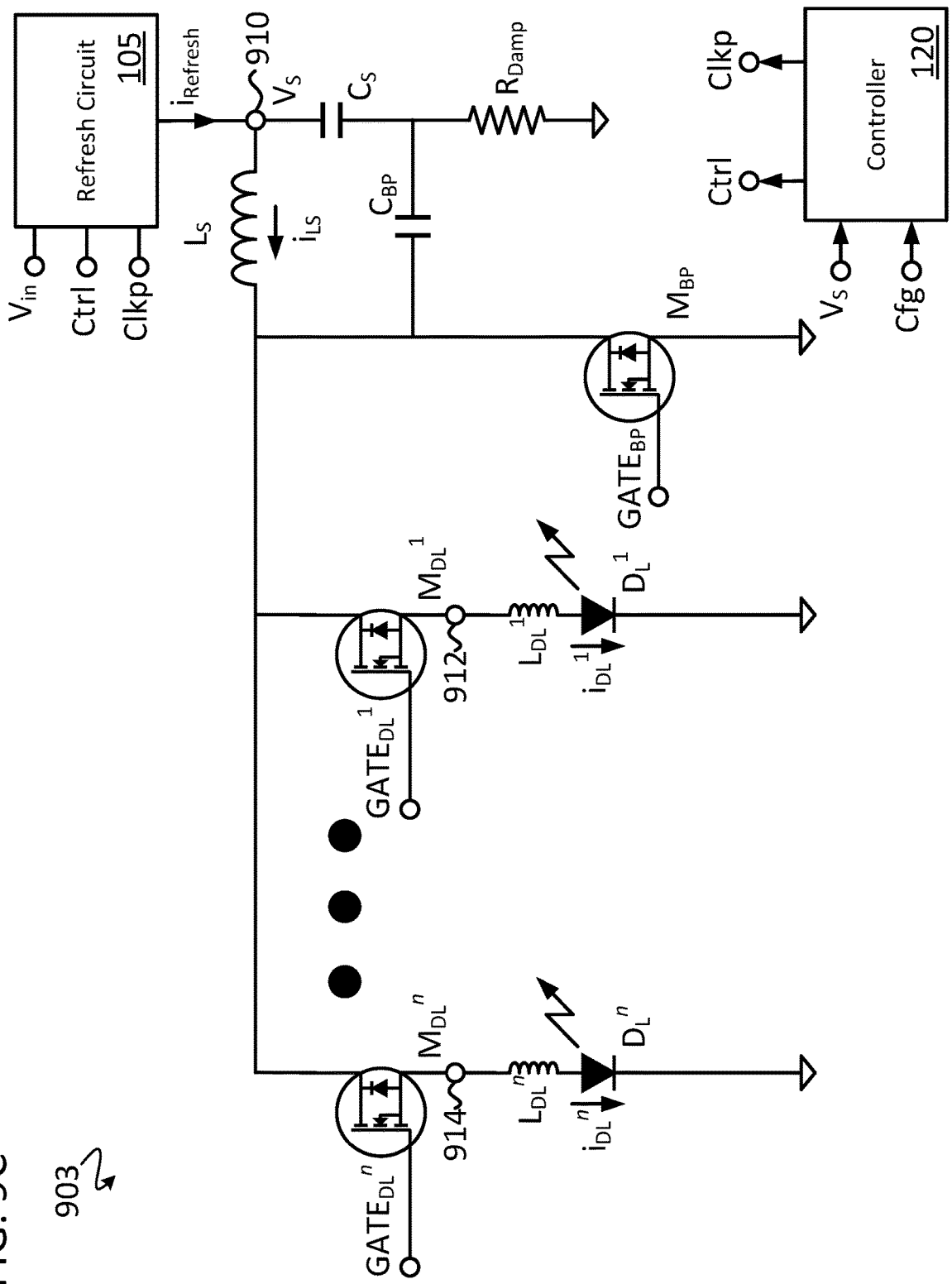
Figure 9D:
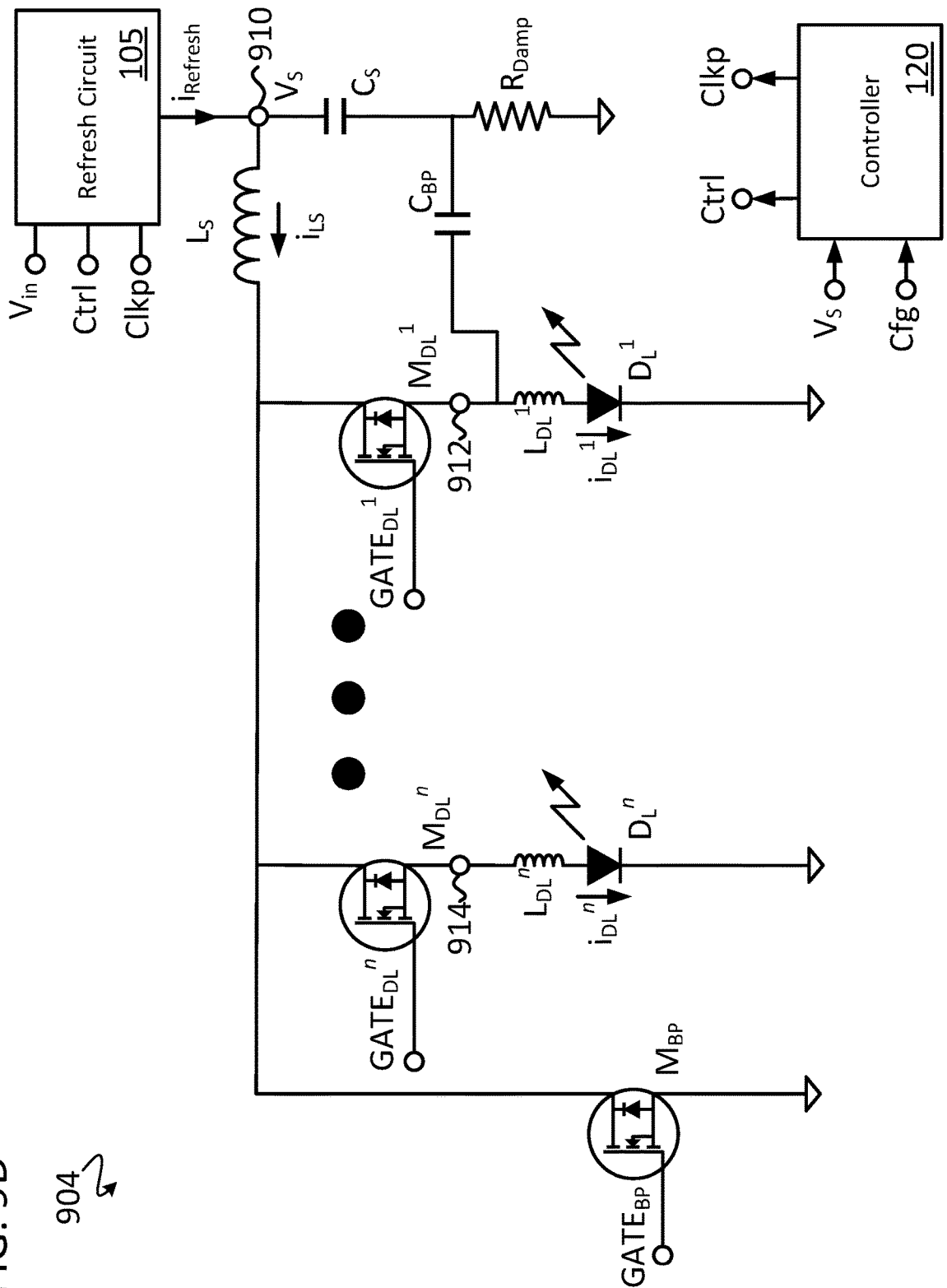

As shown in the simplified circuit schematic of the pulsed laser diode driver 901 of FIG. 9A, in some embodiments the first terminal of the bypass capacitor $C_{BP}$ is directly electrically connected to the second terminal of the inductor $L_S$ and to respective drain nodes of the laser diode switches $M_{DL}^1$-$M_{DL}^n$ and the bypass switch $M_{BP}$. In such embodiments, the second terminal of the bypass capacitor $C_{BP}$ is directly electrically connected to the bias voltage node. As shown in the simplified circuit schematic of the pulsed laser diode driver 902 of FIG. 9B, in some embodiments the first terminal of the bypass capacitor $C_{BP}$ is directly electrically connected to the source node of any of the laser diode switches ($M_{DL}^n$ is shown) and to the anode of the laser diode coupled to that laser diode switch ($D_L^n$ is shown). In such embodiments, the second terminal of the bypass capacitor $C_{BP}$ is directly electrically connected to the bias voltage node. In some embodiments, multiple bypass capacitors $C_{BP}$ are be used, each of the bypass capacitors being connected across a respective laser diode. As shown in the simplified circuit schematic of the pulsed laser diode driver 903 of FIG. 9C, in some embodiments the first terminal of the bypass capacitor $C_{BP}$ is directly electrically connected to the second terminal of the inductor $L_S$ and to respective drain nodes of the laser diode switches $M_{DL}^1$-$M_{DL}^n$ and the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 904 of FIG. 9D, in some embodiments the first terminal of the bypass capacitor $C_{BP}$ is directly electrically connected to the source node of any of the laser diode switches ($M_{DL}^1$ is shown) and to the anode of the laser diode coupled to that laser diode switch ($D_L^1$ is shown). In such embodiments, the second terminal of the bypass capacitor $C_{BP}$ is directly electrically connected to the second terminal of the source capacitor $C_S$ and to the first terminal of the damping resistor $R_{Damp}$. In some embodiments, multiple bypass capacitors $C_{BP}$ are be used, each of the bypass capacitors $C_{BP}$ having a first terminal that is directly electrically connected to a respective anode of each laser diode and a second terminal that is directly electrically connected to the second terminal of the source capacitor $C_S$ and to the first terminal of the damping resistor $R_S$.

In some embodiments, the controller 120 is operable to determine how many of the laser diodes $D_L^1$-$D_L^n$ are enabled simultaneously and to adjust a voltage level of the DC input voltage $V_{in}$ in accordance with that determination to supply a required amount of current (e.g., using a digitally adjustable voltage source controlled by a digital control signal from the controller 120).

FIGS. 10A-E are simplified circuit schematics of pulsed laser diode drivers 1001-1005 of a fifth general topology that is configured to drive a laser diode using a half-bridge configuration, in accordance with some embodiments. The pulsed laser diode drivers 1001-1004 each generally include the controller 120, the refresh circuit 105, the source capacitor $C_S$, the damping resistor $R_{Damp}$, the inductor $L_S$, the bypass capacitor $C_{BP}$, the bypass switch $M_{BP}$, the laser diode $D_L$, and the laser diode switch $M_{DL}$. The pulsed laser diode driver 1005 additionally includes two or more laser diodes $D_L^1$-$D_L^n$, rather than the single laser diode $D_L$, each of the two or more laser diodes $D_L^1$-$D_L^n$ having a respective parasitic inductance $L_{DL}^1$-$L_{DL}^n$, and respective current representation $i_{DL}^1$-$i_{DL}^n$. However, the pulsed laser diode driver 1005 lacks independent control of the two or more laser diodes $D_L^1$-$D_L^n$.

Also shown are the nodes 1010, 1012, the parasitic inductance $L_{DL}$ of the laser diode $D_L$, the DC input voltage $V_{in}$, the source voltage $V_S$ at the source capacitor $C_S$, the refresh current $i_{Refresh}$, the current $i_{LS}$ through the inductor $L_S$, the current $i_{DL}$ through the laser diode $D_L$, the currents $i_{DL}^1$-$i_{DL}^n$ through the two or more laser diodes $D_L^1$-$D_L^n$, the bypass switch gate driver signal $GATE_{BP}$, and the laser diode switch gate driver signal $GATE_{DL}$ of the laser diode switch $M_{DL}$.

Most of the electrical connections of the pulsed laser diode drivers 1001-1004 are similar to, or the same as those described with respect to the pulsed laser diode drivers 801-803. However, in contrast to the high-side configuration of the pulsed laser diode drivers 801-803, the drain node of the bypass switch $M_{BP}$ is directly electrically connected to the source node of the laser diode switch $M_{DL}$ and to the anode of the laser diode $D_L$. The source node of the bypass switch $M_{BP}$ is directly electrically connected to the bias voltage node. Thus, as shown in the simplified circuit schematics of the pulsed laser diode drivers 1001-1004, the laser diode $D_L$ may be driven by the half-bridge configuration of the bypass switch $M_{BP}$ and the laser diode switch $M_{DL}$. Topologies of the pulsed laser diode drivers 1001-1004 vary with respect to placement of the bypass capacitor $C_{BP}$.

Figure 10A:
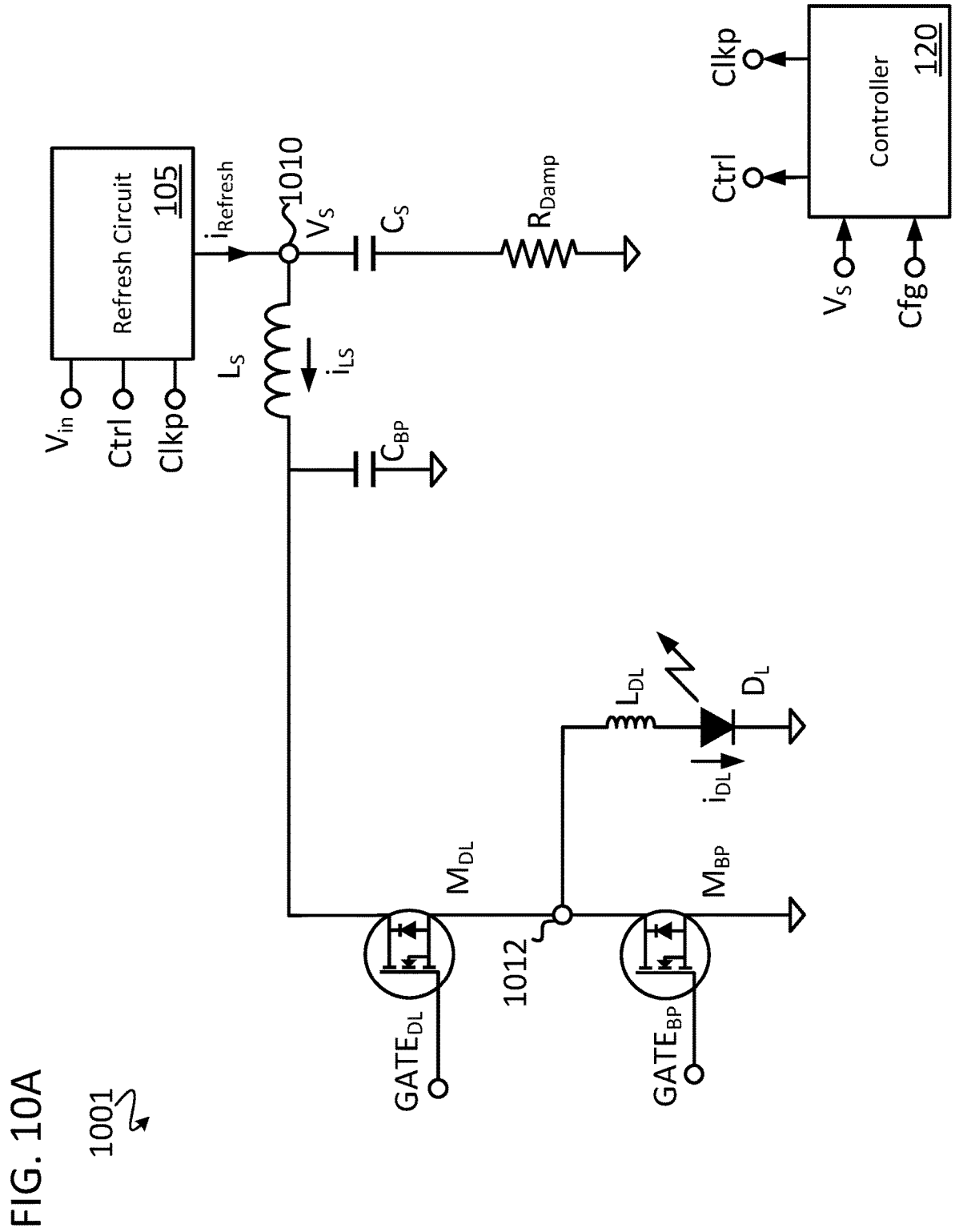
FIGS. 10A-10E are simplified circuit schematics of pulsed laser diode drivers of a fifth general topology, in accordance with some embodiments.
Figure 10B:
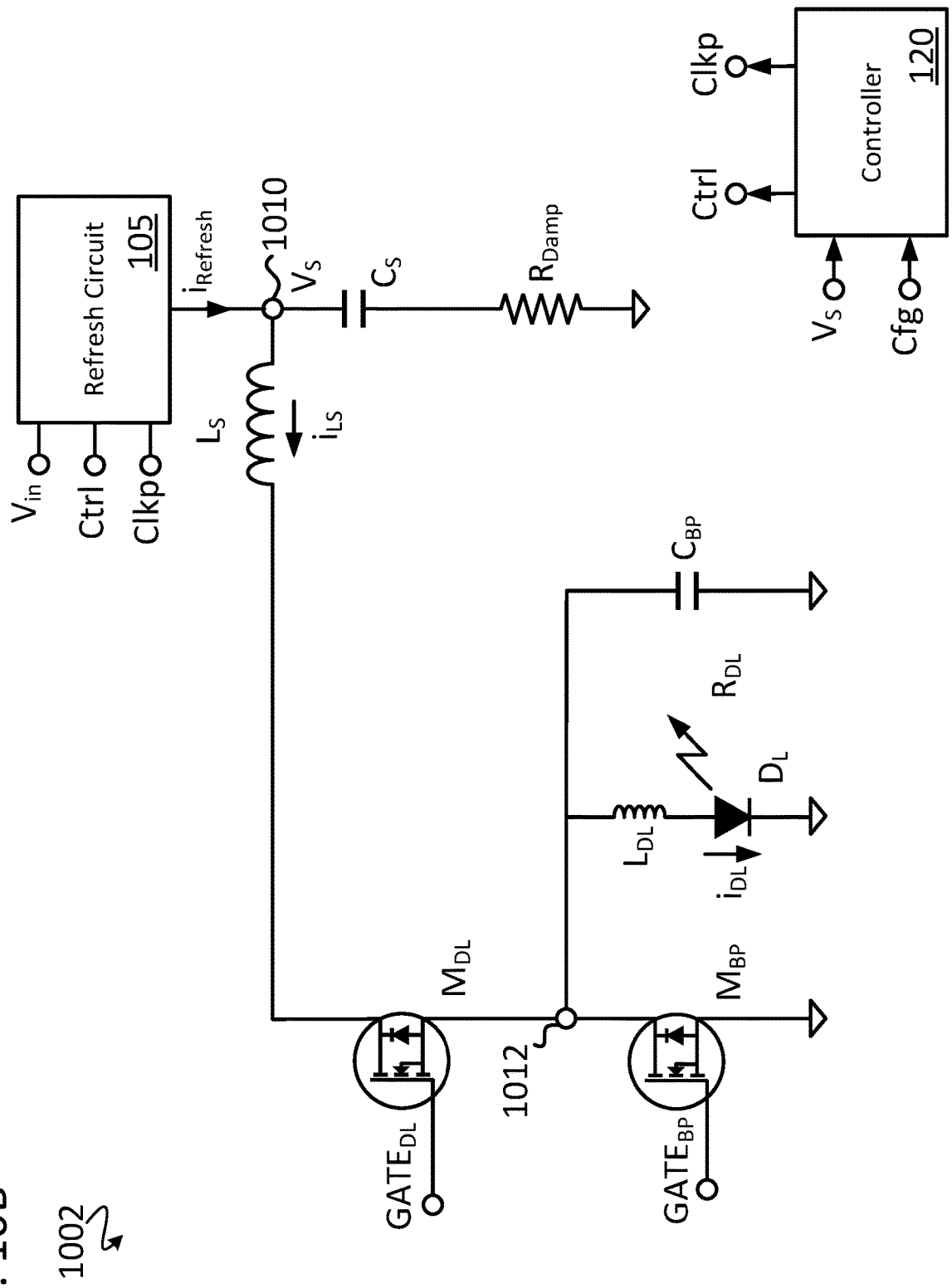
Figure 10C:
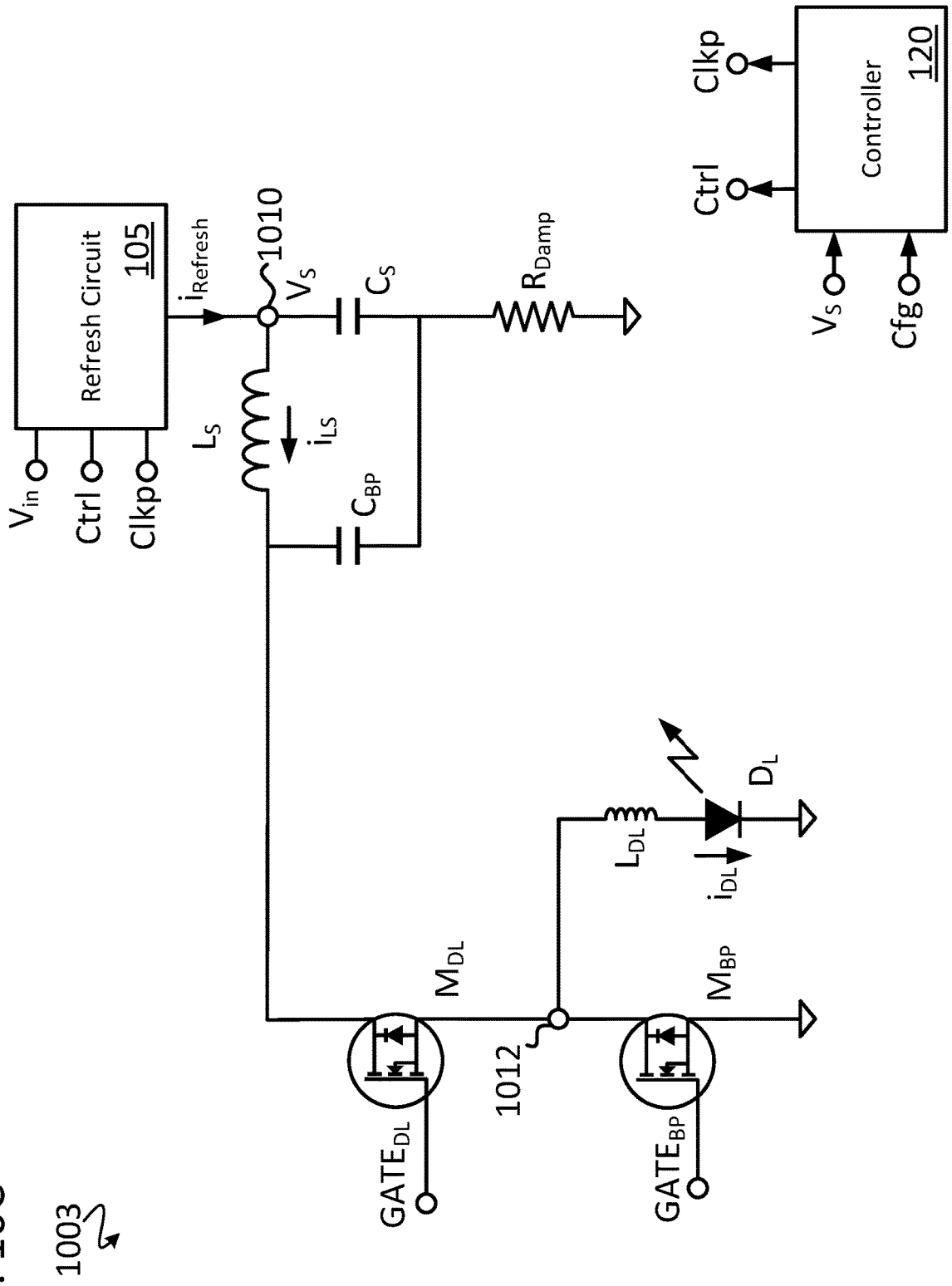
Figure 10D:
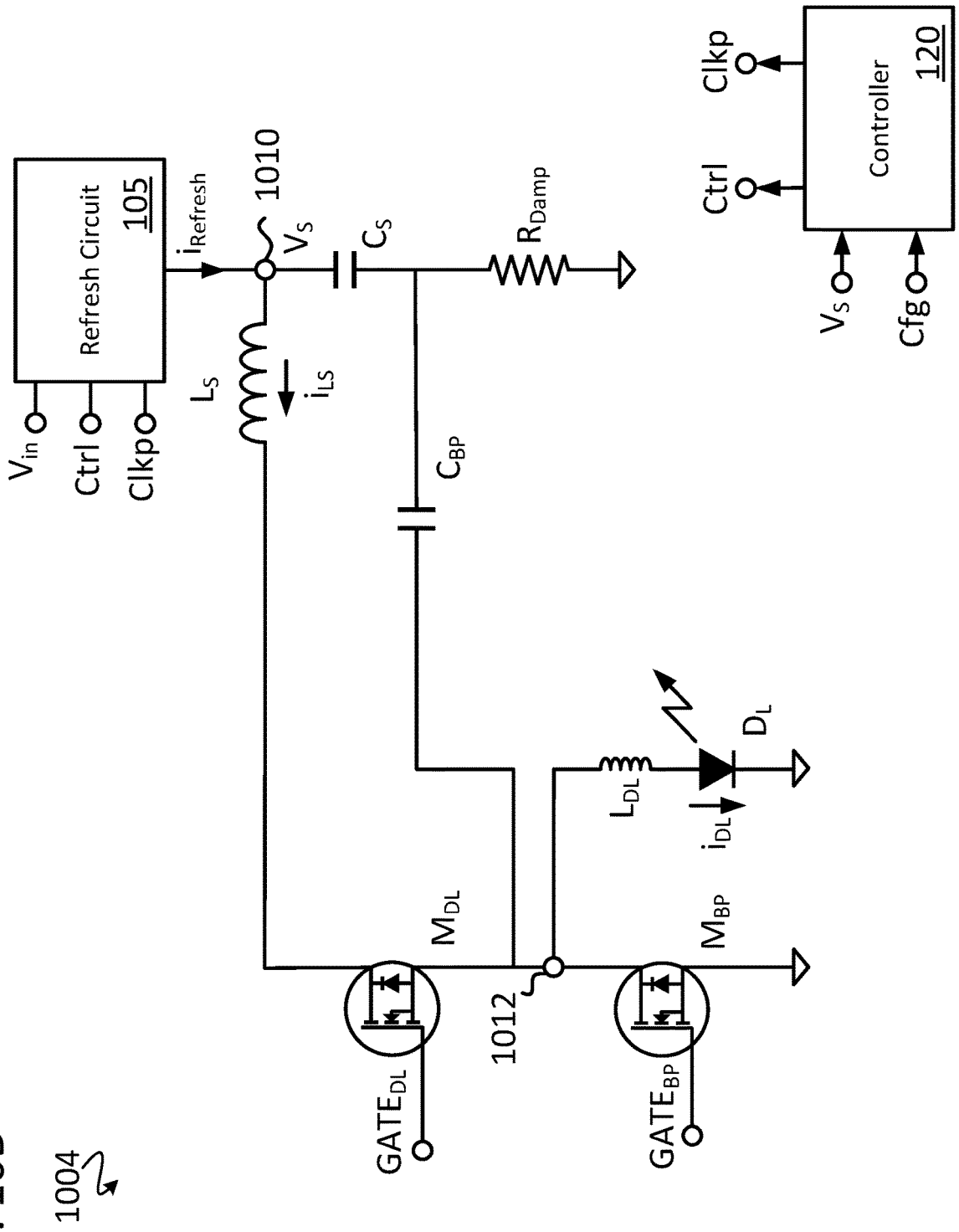

As shown in the simplified circuit schematic of the pulsed laser diode driver 1001 of FIG. 10A, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is electrically connected to the bias voltage node. As shown in the simplified circuit schematic of the pulsed laser diode driver 1002 of FIG. 10B, in some embodiments the first terminal of the bypass capacitor $C_{BP}$ is directly electrically connected to the source node of the laser diode switch $M_{DL}$, to the drain node of the bypass switch $M_{BP}$, and to the anode of the laser diode $D_L$. In such embodiments, the second terminal of the bypass capacitor $C_{BP}$ is directly electrically connected to the bias voltage node. As shown in the simplified circuit schematic of the pulsed laser diode driver 1003 of FIG. 10C, in some embodiments the first terminal of the bypass capacitor $C_{BP}$ is directly electrically connected to the second terminal of the inductor $L_S$ and to the drain node of the laser diode switch $M_{DL}$. In such embodiments, the second terminal of the bypass capacitor $C_{BP}$ is directly electrically connected to the second terminal of the source capacitor $C_S$ and to the first terminal of the damping resistor $R_{Damp}$. As shown in the simplified circuit schematic of the pulsed laser diode driver 1004 of FIG. 10D, in some embodiments the first terminal of the bypass capacitor $C_{BP}$ is directly electrically connected to the source node of the laser diode switch $M_{DL}$, the drain node of the bypass switch $M_{BP}$, and the anode of the laser diode $D_L$. In such embodiments, the second terminal of the bypass capacitor $C_{BP}$ is directly electrically connected to the second terminal of the source capacitor $C_S$ and to the first terminal of the damping resistor $R_{Damp}$.

Figure 10E:
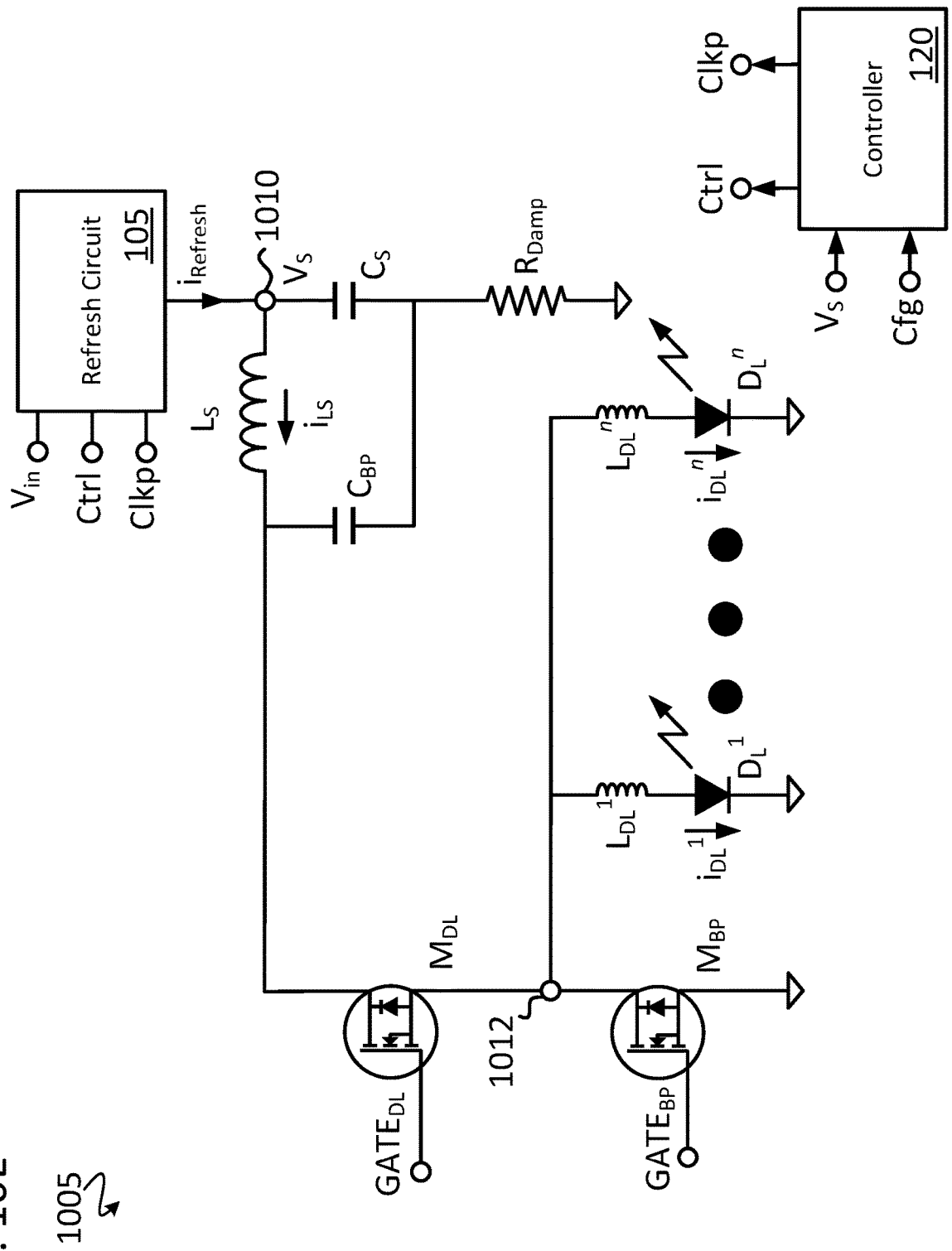

As shown in the simplified circuit schematic of the pulsed laser diode driver 1005 of FIG. 10E, two or more laser diodes $D_L^1$-$D_L^n$ may be driven simultaneously by the half-bridge configuration of the bypass switch $M_{BP}$ and the laser diode switch $M_{DL}$. In the example shown, the first terminal of the bypass capacitor $C_{BP}$ is directly electrically connected to the second terminal of the inductor $L_S$ and the second terminal of the bypass capacitor $C_{BP}$ is directly electrically connected to the second terminal of the source capacitor $C_S$ and to the first terminal of the damping resistor $R_{Damp}$. However, other configurations of the bypass capacitor $C_{BP}$, such as those described with reference to FIGS. 10A-D may be used.

Figure 11A:
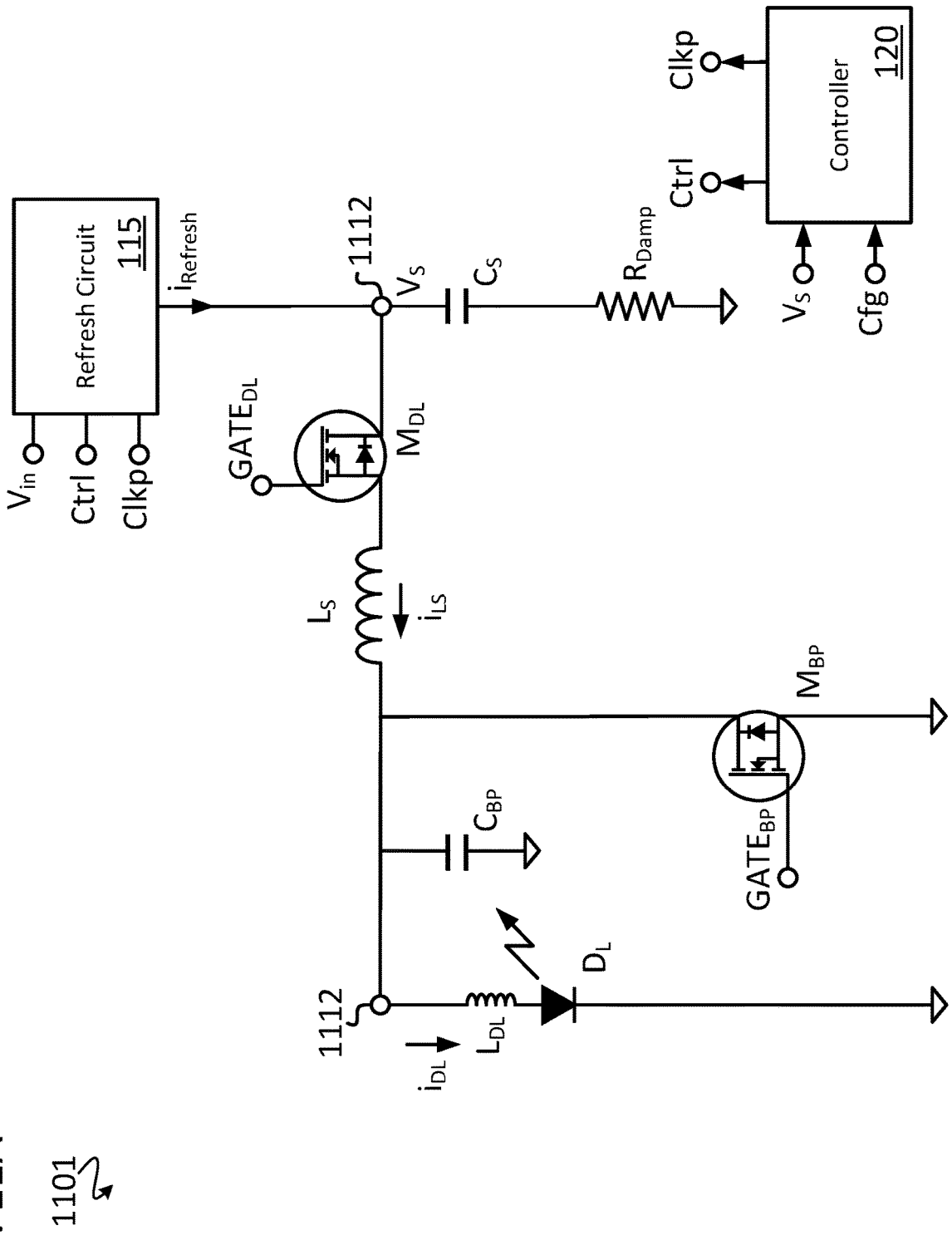
FIGS. 11A-11B are simplified circuit schematics of pulsed laser diode drivers of a sixth general topology, in accordance with some embodiments.
Figure 11B:
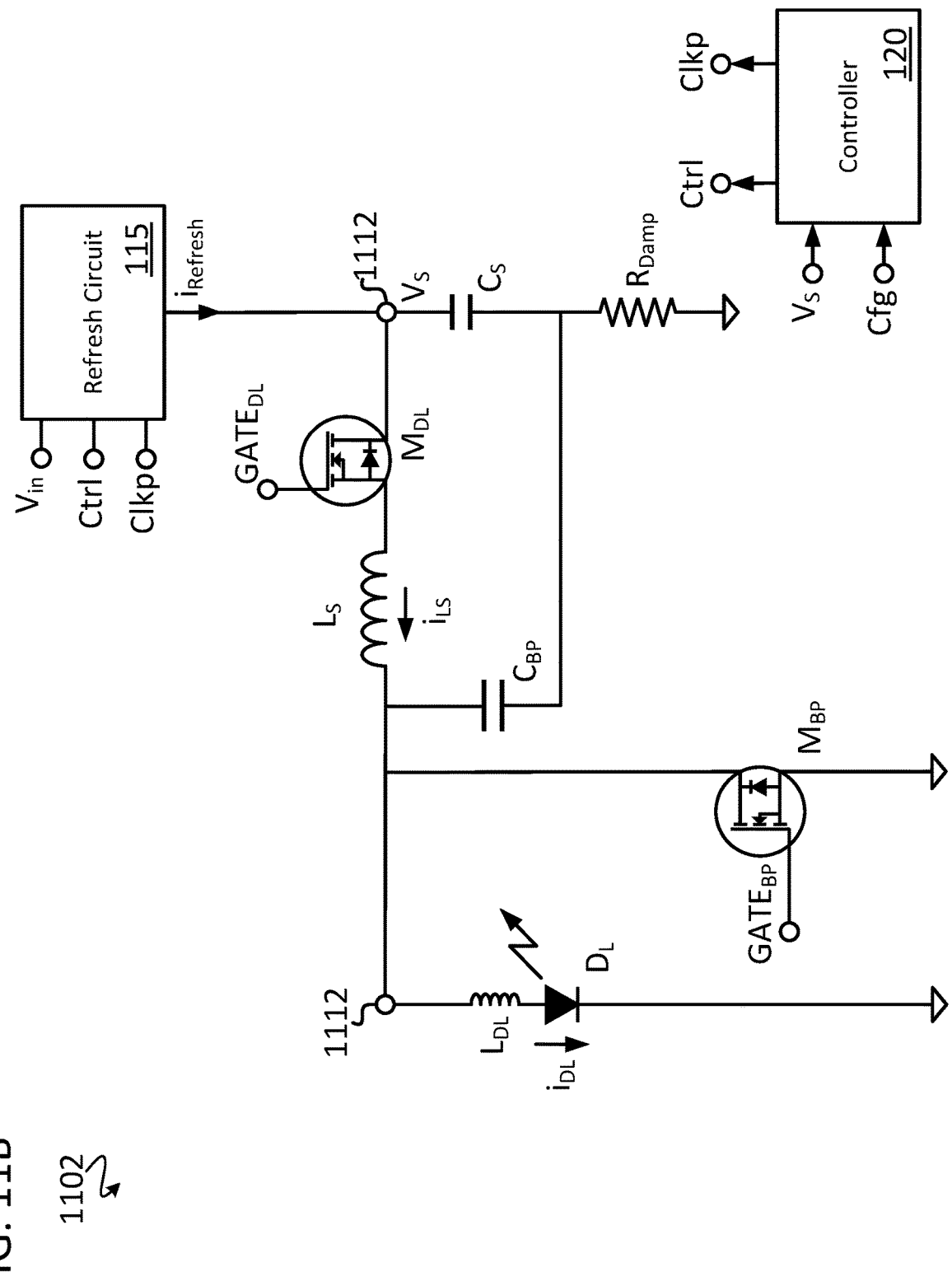

FIGS. 11A-B are simplified circuit schematics of pulsed laser diode drivers 1101-1102 of a sixth general topology that is configured to drive a laser diode using a high-side switch, in accordance with some embodiments. The pulsed laser diode drivers 1101-1102 generally include the controller 120, the refresh circuit 105, the source capacitor $C_S$, the damping resistor $R_{Damp}$, the inductor $L_S$, the bypass capacitor $C_{BP}$, the laser diode $D_L$, the bypass switch $M_{BP}$, and the laser diode switch $M_{DL}$. Also shown are the nodes 1110, 1112, the respective parasitic inductances $L_{DL}$ of the laser diode $D_L$, the DC input voltage $V_{in}$, the source voltage $V_S$ at the source capacitor $C_S$, the refresh current $i_{Refresh}$, the current $i_{LS}$ through the inductor $L_S$, the current $i_{DL}$ through the laser diodes $D_L$, the bypass switch gate driver signal $GATE_{BP}$, and the laser diode switch gate driver signal $GATE_{DL}$. Electrical connections of the pulsed laser diode driver 1101 are similar to, or the same as those described with respect to the pulsed laser diode driver 101. The pulsed laser diode drivers 1101-1102 differ in that the drain node of the laser diode switch $M_{DL}$ is directly electrically connected to the refresh circuit 105 and to the first terminal of the source capacitor $C_S$. The source node of the laser diode switch $M_{DL}$ is directly electrically connected to the first terminal of the inductor $L_S$. The anode of the laser diode $D_L$ is directly electrically connected to the second terminal of the inductor $L_S$ and the cathode of the laser diode $D_L$ is directly electrically connected to the bias voltage node. As shown, the pulsed laser diode drivers 1101-1102 are advantageously configured such that the laser diode switch $M_{DL}$ is electrically connected between the inductor $L_S$ and the source capacitor $C_S$. As a result, the drain node of the laser diode switch $M_{DL}$ does not receive a high voltage spike developed at the second terminal of the inductor $L_S$ when the bypass switch $M_{BP}$ is disabled to generate the high-current pulse through the laser diode $D_L$.

The pulsed laser diode drivers 1101-1102 differ in placement of the bypass capacitor $C_{BP}$. As shown in FIG. 11A, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the bias voltage node. As shown in FIG. 11B, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$.

In other embodiments, the respective positions of the inductor $L_S$ and the laser diode switch $M_{DL}$ in either of the pulsed laser diode drivers 1101-1102, can be exchanged such that the first terminal of the inductor $L_S$ is directly electrically connected to the first terminal of the source capacitor $C_S$, and the drain terminal of the laser diode switch $M_{DL}$ is directly electrically connected to the second terminal of the inductor $L_S$.

Figure 12A:
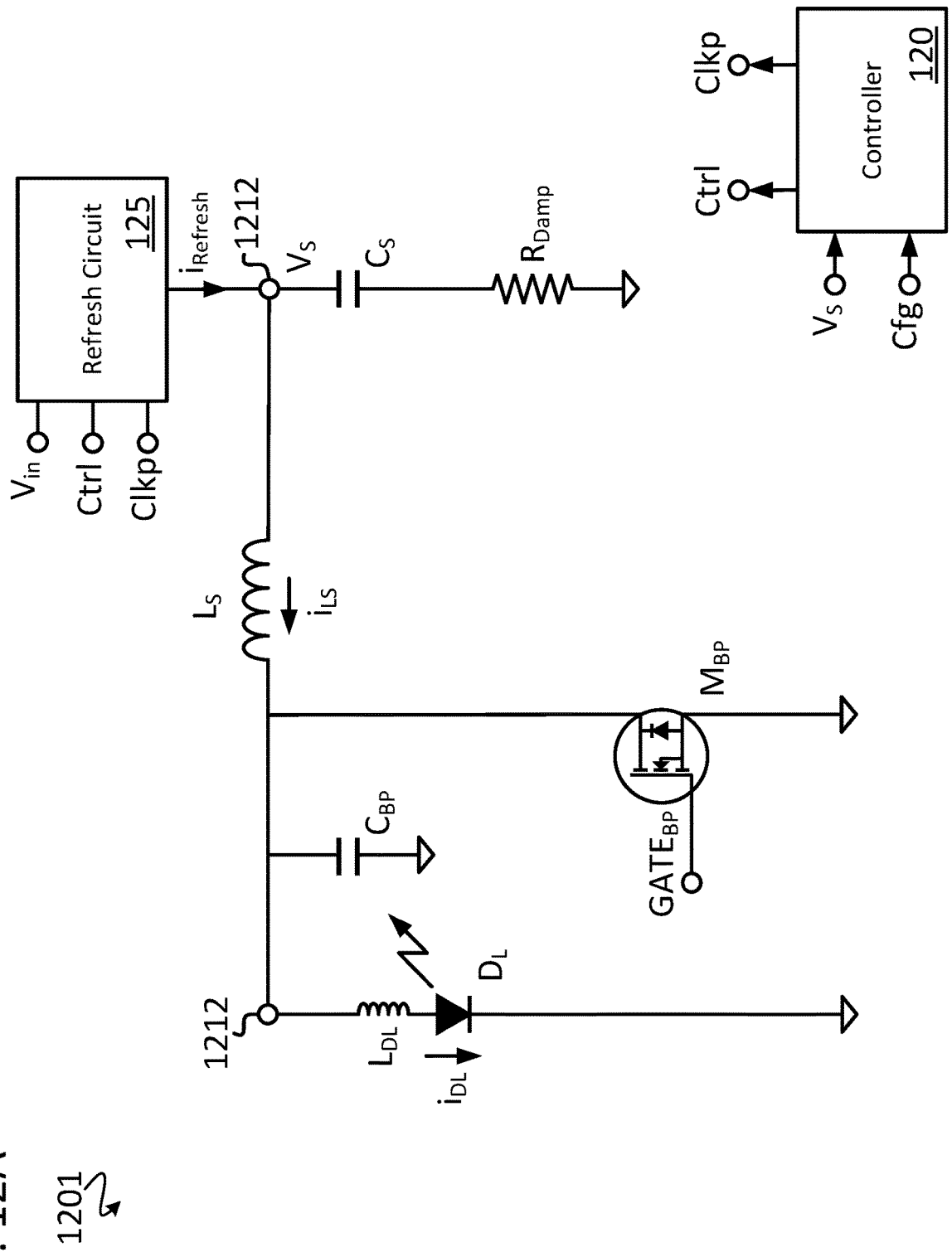
FIGS. 12A-12B are simplified circuit schematics of pulsed laser diode drivers of a seventh general topology, in accordance with some embodiments.
Figure 12B:
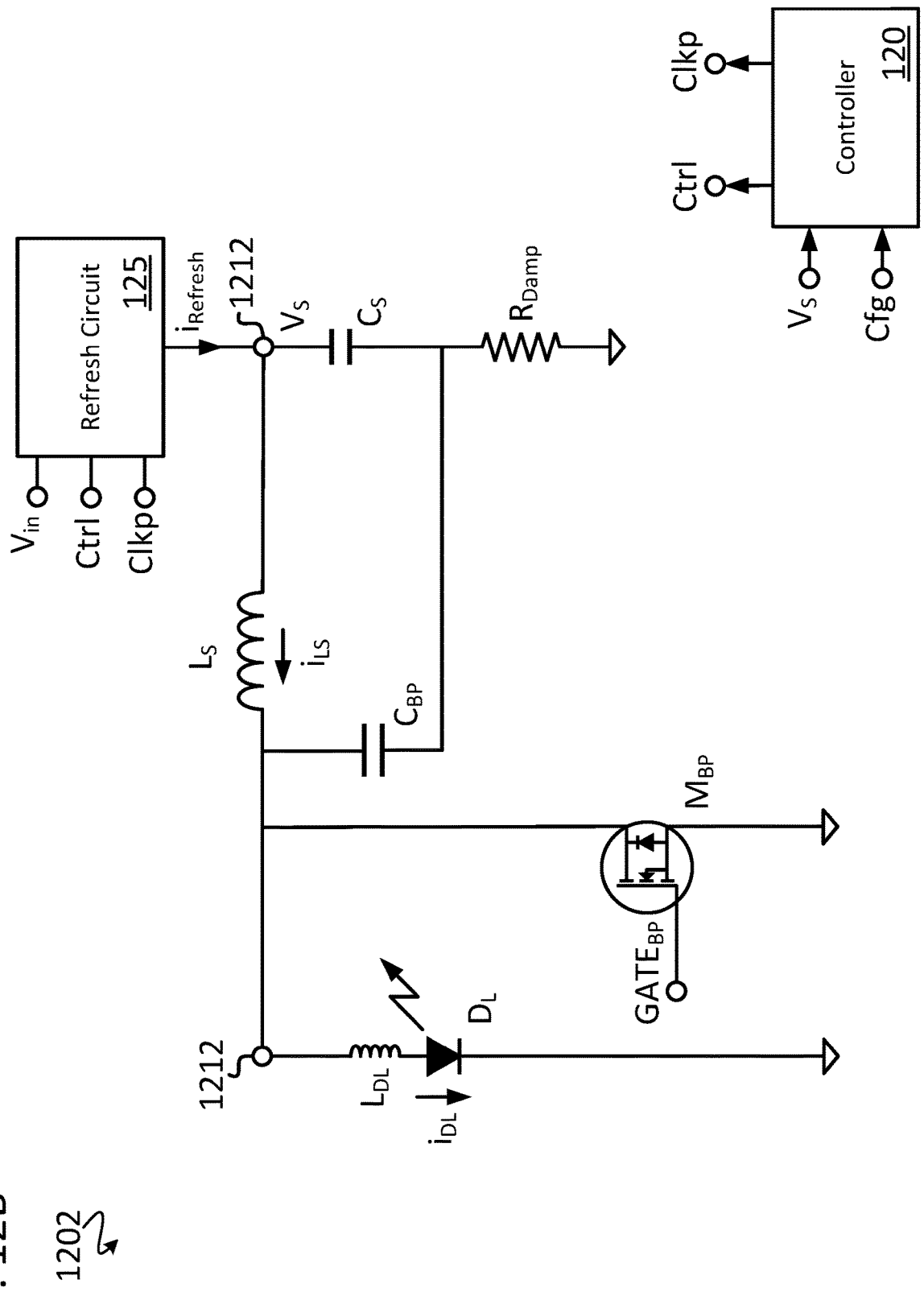

FIGS. 12A-B are simplified circuit schematics of pulsed laser diode drivers 1201-1202 of a seventh general topology that is configured to drive a laser diode using only a bypass switch, in accordance with some embodiments. The pulsed laser diode drivers 1201-1202 generally include the controller 120, the refresh circuit 105, the source capacitor $C_S$, the damping resistor $R_{Damp}$, the inductor $L_S$, the bypass capacitor $C_{BP}$, the laser diode $D_L$, and the bypass switch $M_{BP}$. Also shown are nodes 1210, 1212, the respective parasitic inductances $L_{DL}$ of the laser diode $D_L$, the DC input voltage $V_{in}$, the source voltage $V_S$ at the source capacitor $C_S$, the refresh current $i_{Refresh}$, the current $i_{LS}$ through the inductor $L_S$, the current $i_{DL}$ through the laser diodes $D_L$, and the bypass switch gate driver signal $GATE_{BP}$. Electrical connections of the pulsed laser diode drivers 1201-1202 are similar to, or the same as, those described with respect to the pulsed laser diode driver 101. The pulsed laser diode drivers 1201-1202 differ in that the laser diode switch $M_{DL}$ is eliminated. The anode of the laser diode $D_L$ is directly electrically connected to the second terminal of the inductor $L_S$ and the cathode of the laser diode $D_L$ is directly electrically connected to the bias voltage node. In such embodiments, the voltage level of the DC input voltage $V_{in}$ is restricted to a voltage level that does not surpass the forward bias voltage of the laser diode $D_L$, thereby maintaining the laser diode $D_L$ in an OFF-state (i.e., not conducting) until a voltage higher than the forward bias voltage is developed at the second terminal of the inductor $L_S$ when current flow through the bypass switch is momentarily disabled.

The pulsed laser diode drivers 1201-1202 differ in placement of the bypass capacitor $C_{BP}$. As shown in FIG. 12A, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the bias voltage node. As shown in FIG. 12B, in some embodiments, the first terminal of the bypass capacitor $C_{BP}$ is directly electrically connected to the second terminal of the inductor $L_S$, to the anode of the laser diode $D_L$, and to the drain node of the bypass switch $M_{BP}$. In such embodiments, the second terminal of the bypass capacitor $C_{BP}$ is directly electrically connected to the second terminal of the source capacitor $C_S$ and to the first terminal of the damping resistor $R_{Damp}$.

Embodiments of the pulsed laser diode drivers disclosed herein are additionally or alternatively operable to provide current pulses to devices other than laser diodes. For instance, embodiments of the pulsed laser diode drivers disclosed herein are operable to provide a current pulse to a light-emitting diode (i.e., a non-laser LED). Additionally, embodiments of the pulsed laser diode drivers disclosed herein are operable to provide a current pulse to another circuit or device, having no laser diode, that is configured to receive a current pulse for a purpose other than emitting light.

In some embodiments, two or more instances of the laser diode drivers disclosed herein are configured to drive respective laser diodes. For example, four instances of the pulsed laser diode driver 101 may be used to drive a laser diode package that includes four laser diodes. In such an embodiment, each of the laser diodes in the laser diode package is driven by an instance of the pulsed laser diode driver 101.

Figure 13A:
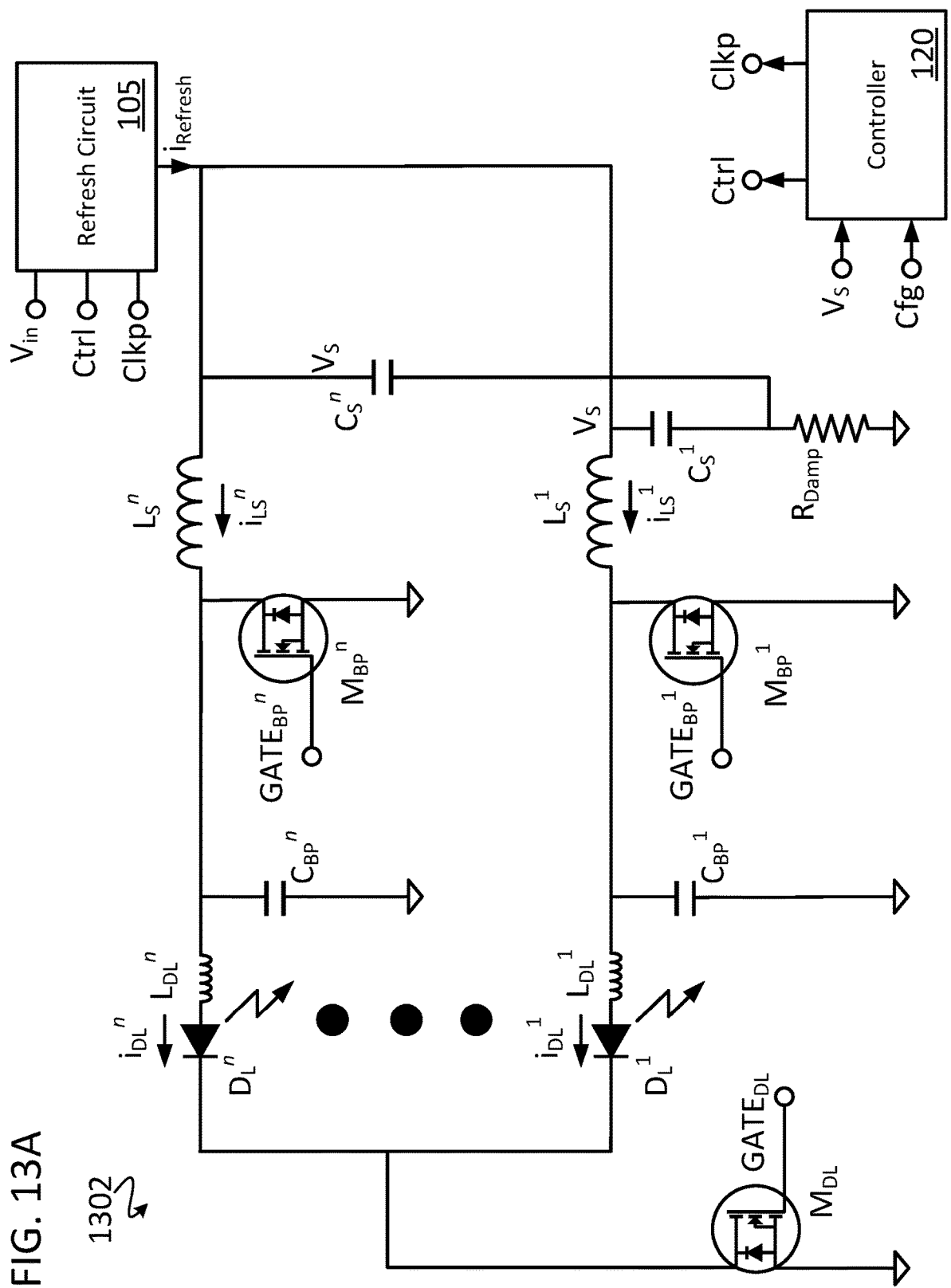
FIGS. 13A-13B are simplified circuit schematics of pulsed laser diode drivers of an eighth general topology, in accordance with some embodiments.
Figure 13B:
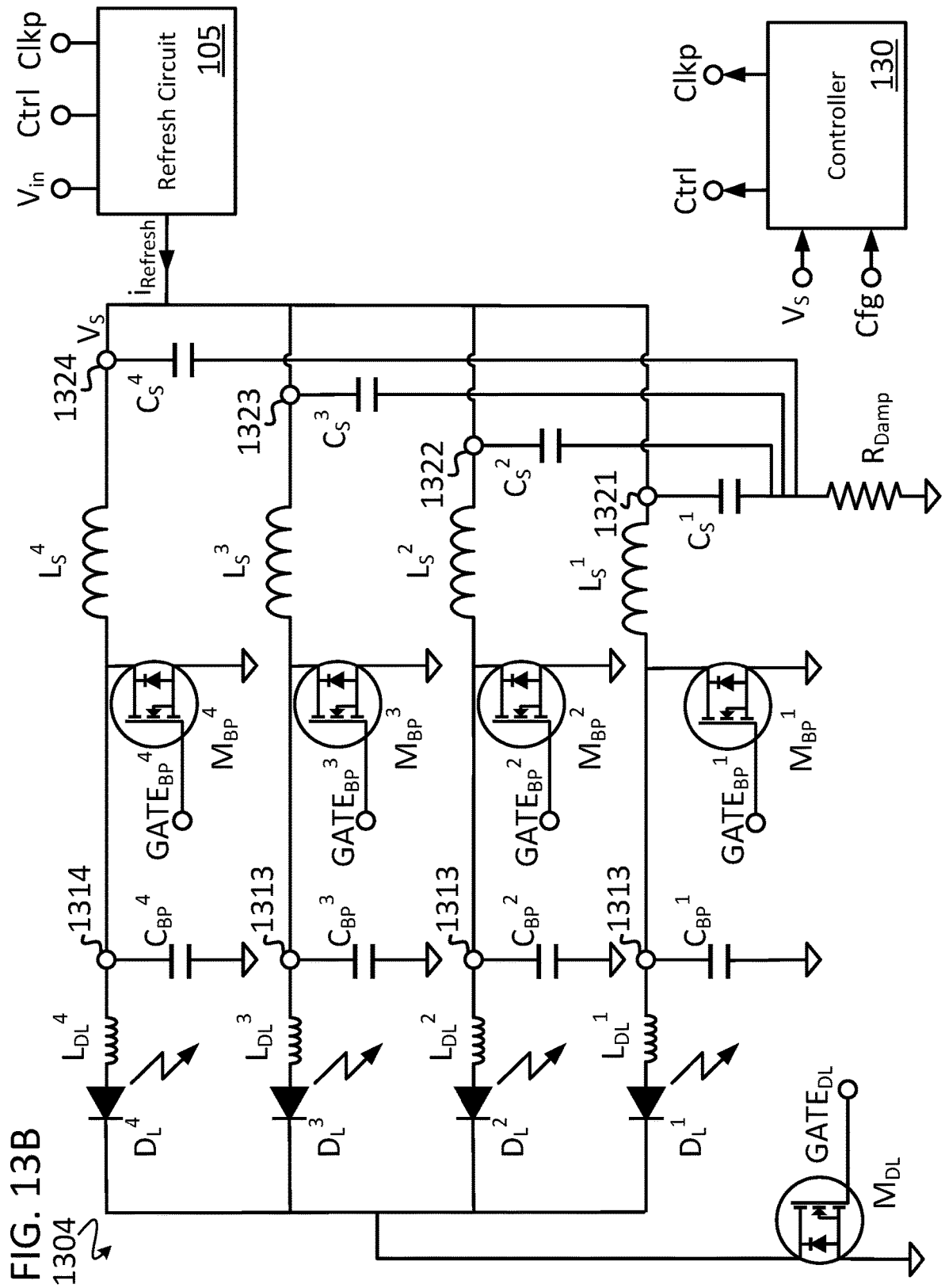

FIGS. 13A-13B are simplified circuit schematics of pulsed laser diode drivers 1302, 1304 of an eighth general topology that is configured for multi-channel, individual control of multiple laser diodes, in accordance with some embodiments. The multi-channel pulsed laser diode driver 1302 shown in FIG. 13A is configured to independently drive n laser diodes where n is a number ranging from two to 128 or more. The multi-channel pulsed laser diode driver 1302 is operable to cause a pulse to be emitted from any individual laser diode of the multi-channel pulsed laser diode driver 1302 in isolation, or combined with one or more other pulses emitted from other laser diodes of the multi-channel pulsed laser diode driver 1302. The multi-channel pulsed laser diode driver 1302 generally includes the controller 120, the refresh circuit 105, n source capacitors $C_S^1$ through $C_S^n$, an optional damping resistor $R_{Damp}$, n inductors $L_S^1$ through $L_S^n$, n bypass switches $M_{BP}^1$ through $M_{BP}^n$, n bypass capacitors $C_{BP}^1$ through $C_{BP}^n$, n laser diodes $D_L^1$ through $D_L^n$, and a laser diode switch $M_{DL}$, coupled as shown. Also shown are is the refresh current $i_{Refresh}$, respective parasitic inductances $L_{DL}^1$ through $L_{DL}^n$ of the laser diodes $D_L^1$ through $D_L^n$, respective currents $i_{LS}^1$ through $i_{LS}^n$ of the inductors $L_S^1$ through $L_S^n$, respective currents $i_{DL}^1$ through ice of the laser diodes $D_L^1$ through $D_L^n$, and the DC input voltage $V_{in}$. The damping resistor $R_{Damp}$ is used in some embodiments for current measurement purposes and can be omitted by connecting each of the source capacitors $C_S^1$ through $C_S^n$ to ground. In some embodiments, the bypass switches $M_{BP}^1$ through $M_{BP}^n$ and the laser diode switch $M_{DL}$ are each N-type FET switches and advantageously do not require bootstrap circuitry to drive the respective gates of those switches because of their respective low-side configurations.

The source capacitor $C_S^1$, the inductor $L_S^1$, the bypass switch $M_{BP}^1$, the bypass capacitor $C_{BP}^1$, and the laser diode $D_L^1$ are associated with a first channel of the multi-channel pulsed laser diode driver 1302. Similarly, the source capacitor $C_S^n$, the inductor $L_S^n$, the bypass switch $M_{BP}^n$, the bypass capacitor $C_{BP}^n$, and the laser diode $D_L^n$ are associated with an $n^{th}$ channel of the multi-channel pulsed laser diode driver 1302, where n is a number greater than one (e.g., two, three, four, eight, 16, 32, 64, 128, etc.). By controlling (e.g., by the controller 120) respective switch timings (i.e., an on/off duration) of the bypass switches $M_{BP}^1$ through $M_{BP}^n$ in conjunction with controlling a switch timing of the laser diode switch $M_{DL}$ each of the laser diodes $D_L^1$ through $D_L^n$ are advantageously independently controlled. Operation of each channel of the multi-channel pulsed laser diode driver 1302 is similar to, or the same as, operation of the pulsed laser diode driver 101 described with reference to FIG. 1A and the switching sequence 300 shown in FIG. 3. Because each of the bypass switches $M_{BP}^1$ through $M_{BP}^n$ and the laser diode switch $M_{DL}$ are configured as low-side switches (i.e., a source node of each aforementioned switch is directly electrically connected to ground), a gate control signal of those switches does not need to be level-shifted by bootstrap circuitry, thereby advantageously simplifying the design and reducing the cost of the multi-channel pulsed laser diode driver 1302 as compared to a laser diode driver circuit that requires bootstrap circuitry.

An example embodiment of a four-channel (i.e., n=4) multi-channel pulsed laser diode driver 1304 is shown in FIG. 13B. The multi-channel pulsed laser diode driver 1304 is operable to independently drive four laser diodes. That is, the multi-channel pulsed laser diode driver 1304 is operable to cause a pulse to be emitted from any individual laser diode of the multi-channel pulsed laser diode driver 1304 in isolation, or combined with one or more other pulses emitted from other laser diodes of the multi-channel pulsed laser diode driver 1304. The multi-channel pulsed laser diode driver 1304 generally includes four source capacitors $C_S^1$ through $C_S^4$, the optional damping resistor $R_{Damp}$, four inductors $L_S^1$ through $L_S^4$, four bypass switches $M_{BP}^1$ through $M_{BP}^4$, four bypass capacitors $C_{BP}^1$ through $C_{BP}^4$, four laser diodes $D_L^1$ through $D_L^4$, and the laser diode switch $M_{DL}$, directly electrically connected as shown. Also shown is the refresh circuit 105, the controller 120, respective parasitic inductances $L_{DL}^1$ through $L_{DL}^4$ of the laser diodes $D_L^1$ through $D_L^4$, the DC input voltage $V_{in}$, the refresh current $i_{Refresh}$, nodes 1311 through 1314, and nodes 1321 through 1324. The damping resistor $R_{Damp}$ is used in some embodiments for current measurement purposes and can be omitted by connecting each of the source capacitors $C_S^1$ through $C_S^4$ to ground. In some embodiments, the bypass capacitors $C_{BP}^1$ through $C_{BP}^4$ are connected to the cathodes of the laser diodes $D_L^1$ through $D_L^4$. In some embodiments, the bypass switches $M_{BP}^1$ through $M_{BP}^4$ and the laser diode switch $M_{DL}$ are each N-type FET switches and advantageously do not require boot-strap circuitry to drive the respective gates of those switches as described above.

The source capacitor $C_S^1$, the inductor $L_S^1$, the bypass switch $M_{BP}^1$, the bypass capacitor $C_{BP}^1$, and the laser diode $D_L^1$ are associated with a first channel of the multi-channel pulsed laser diode driver 1304; the source capacitor $C_S^2$, the inductor $L_S^2$, the bypass switch $M_{BP}^2$, the bypass capacitor $C_{BP}^2$, and the laser diode $D_L^2$ are associated with a second channel of the multi-channel pulsed laser diode driver 1304; the source capacitor $C_S^3$, the inductor $L_S^3$, the bypass switch $M_{BP}^3$, the bypass capacitor $C_{BP}^3$, and the laser diode $D_L^3$ are associated with a third channel of the multi-channel pulsed laser diode driver 1304, and the source capacitor $C_S^4$, the inductor $L_S^4$, the bypass switch $M_{BP}^4$, the bypass capacitor $C_{BP}^4$, and the laser diode $D_L^4$ are associated with a fourth channel of the multi-channel pulsed laser diode driver 1304. The laser diode switch $M_{DL}$ is associated with each of the channels of the multi-channel pulsed laser diode driver 1304.

As described above, each channel of the multi-channel pulsed laser diode driver 1304 has an associated source capacitor, inductor, bypass switch, bypass capacitor, and laser diode. By controlling (e.g., by the controller 120) respective switch timings (i.e., an on/off duration) of the bypass switches $M_{BP}^1$ through $M_{BP}^4$ in conjunction with controlling a switch timing of the laser diode switch $M_{DL}$, each of the laser diodes $D_L^1$ through $D_L^4$ is advantageously independently controlled.

Operation of each channel of the multi-channel pulsed laser diode driver 1304 is similar to, or the same as operation of the pulsed laser diode driver 101 described with reference to FIG. 1A and the switching sequence 300 shown in FIG. 3. A channel of the multi-channel pulsed laser diode driver 1304 is selected for output by turning that channel's bypass switch off (e.g., by the controller 120) while the laser diode switch $M_{DL}$ is off such that the refresh circuit 105 charges that channel's source capacitor to a desired voltage level to store energy in that source capacitor (e.g., step 301 of FIG. 3). After the desired voltage level is reached at the source capacitor, a selected channel's bypass switch is turned on (e.g., by the controller 120), such that current builds in that channel's inductor between that channel's bypass switch and that channel's source capacitor (e.g., step 302 of FIG. 3). If that channel's bypass switch is thereafter turned off for a short time and the laser diode switch $M_{DL}$ is turned on, that channel's inductor current will resonate with the anode capacitance of that channel's laser diode, thereby creating a voltage across that channel's laser diode that is higher than the DC input voltage $V_{in}$ and the developed current will be forced to flow through that channel's laser diode (e.g., step 303 of FIG. 3) to emit a laser pulse. In some embodiments, a discharge sequence similar to step 304 of FIG. 3 is performed, whereby both that channel's bypass switch and the laser diode switch $M_{DL}$ are turned on may then follow. By sequentially selecting each channel of the multi-channel pulsed laser diode driver 1304, that channel's laser diode can be independently pulsed. A channel of the multi-channel pulsed laser diode driver 1304 is unselected for output by leaving that channel's bypass switch on (e.g., by the controller 120) through each of the steps 301 through 305 shown in FIG. 3, thereby preventing the refresh circuit 105 from charging that channel's source capacitor.

Figure 14:
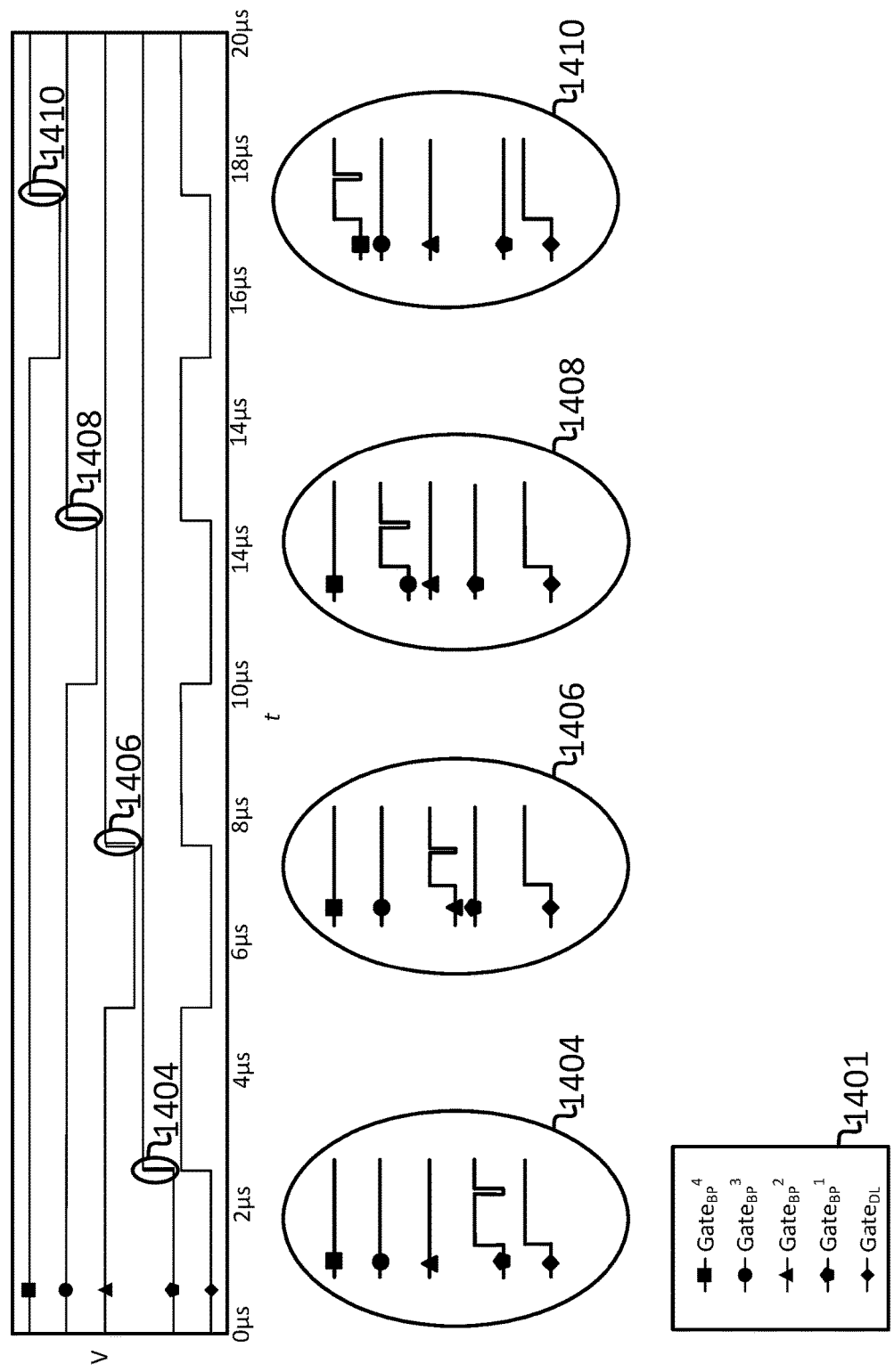
FIG. 14 shows simplified plots of signals related to operation of the pulsed laser diode driver shown in FIG. 13B, in accordance with some embodiments.

Simplified example waveforms 1402 of signals related to the operation of the multi-channel pulsed laser diode driver 1304 are shown in FIG. 14, in accordance with some embodiments. Also shown is a legend 1401 and expanded regions of interest 1404, 1406, 1408, and 1410 of the waveforms 1402.

As indicated by the legend 1401, the simplified waveforms 1402 of FIG. 14 include a laser diode switch gate driver signal $Gate_{DL}$, a first bypass switch gate driver signal $Gate_{BP}^1$, a second bypass switch gate driver signal $Gate_{BP}^2$, a third bypass switch gate driver signal $Gate_{BP}^3$ and a fourth bypass switch gate driver signal $Gate_{BP}^4$ over a 20 μs duration. With reference to FIG. 13B, the laser diode switch gate driver signal $Gate_{DL}$ is operable to control the laser diode switch $M_{DL}$, the first bypass switch gate driver signal $Gate_{BP}^1$ is operable to control the bypass switch $M_{BP}^1$, the second bypass switch gate driver signal $Gate_{BP}^2$ is operable to control the bypass switch $M_{BP}^2$, the third bypass switch gate driver signal $Gate_{BP}^3$ is operable to control the bypass switch $M_{BP}^3$, and the fourth bypass switch gate driver signal $Gate_{BP}^4$ is operable to control the bypass switch $M_{BP}^4$.

Each of the expanded regions of interest 1404, 1406, 1408, and 1410 illustrate a pre-flux interval of a selected channel during which an inductor current of that channel's inductor is ramping up, a very short pulse interval during which current through that channel's inductor is directed through that channel's laser diode, and a discharge interval in accordance with steps 301 through 305 described with reference to FIG. 3. Per the description above, the region of interest 1404 illustrates pulse generation for the first channel (i.e., laser diode $D_L^1$) of the multi-channel pulsed laser diode driver 1304, the region of interest 1406 illustrates pulse generation for the second channel (i.e., laser diode $D_L^2$) of the multi-channel pulsed laser diode driver 1304, the region of interest 1408 illustrates pulse generation for the third channel (i.e., laser diode $D_L^3$) of the multi-channel pulsed laser diode driver 1304, and the region of interest 1410 illustrates pulse generation for the fourth channel (i.e., laser diode $D_L^2$) of the multi-channel pulsed laser diode driver 1304.

Figure 15:
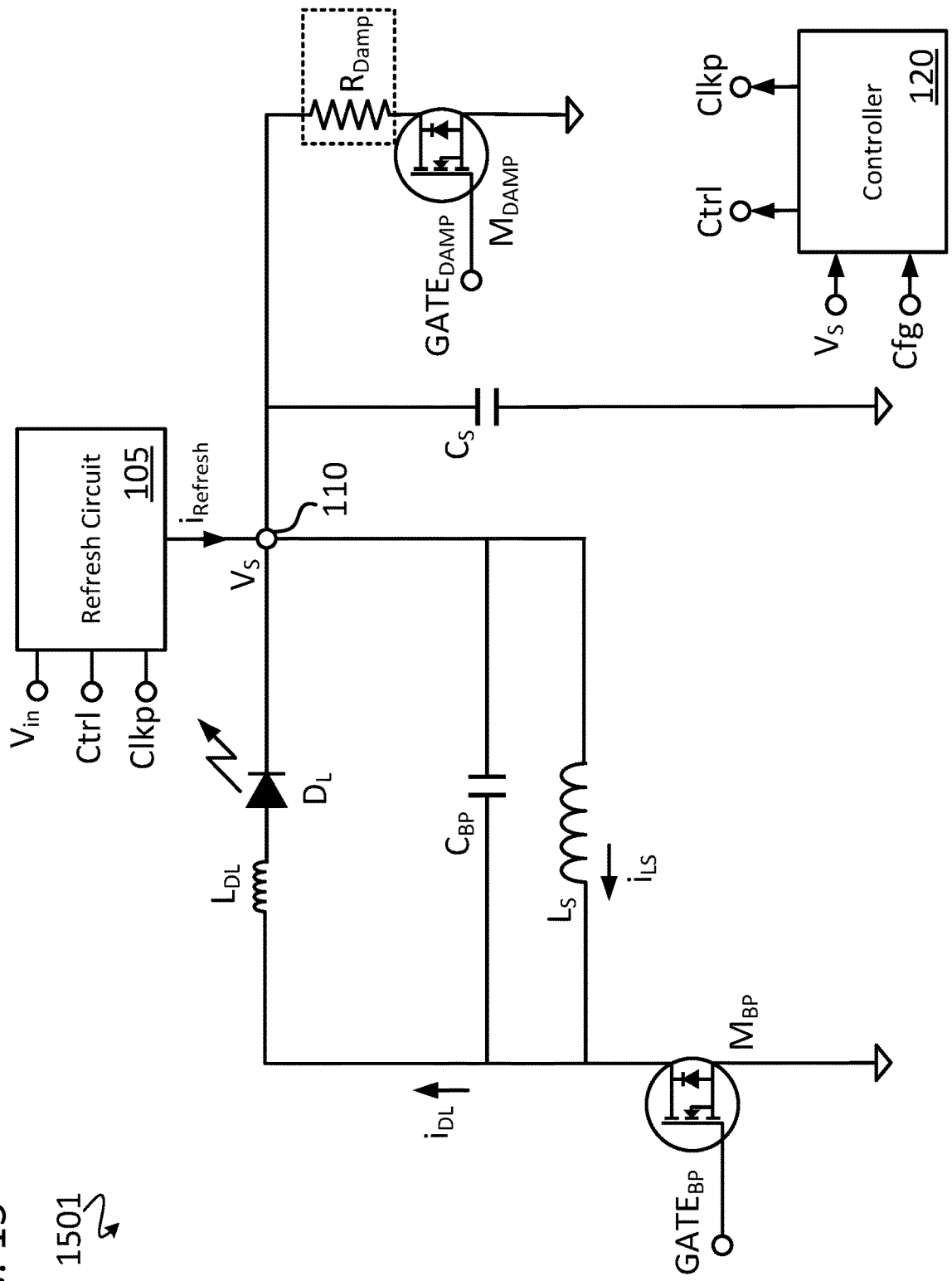
FIG. 15 shows a simplified circuit schematic of a pulsed laser diode driver of a ninth general topology, in accordance with some embodiments.

FIG. 15 shows a simplified circuit schematic of a pulsed laser diode driver 1501 of a ninth general topology, in accordance with some embodiments. The pulsed laser diode driver 1501 generally includes the refresh circuit 105, the controller 120, a source capacitor $C_S$, a damping resistor $R_{Damp}$, an inductor $L_S$, a bypass capacitor $C_{BP}$, a laser diode $D_L$, a bypass switch $M_{BP}$, and a damping switch $M_{DAMP}$. The damping switch $M_{DAMP}$ is configured as a low-side switch. Also shown is the refresh current $i_{Refresh}$, the node 110, a parasitic inductance $L_{DL}$ of the laser diode $D_L$, a DC input voltage $V_{in}$, a source voltage $V_s$ at the source capacitor $C_S$, the refresh current $i_{Refresh}$, a current $i_{LS}$ through the inductor $L_S$, a current $i_{DL}$ through the laser diode $D_L$, a bypass switch gate driver signal $GATE_{BP}$, and a damping switch gate driver signal $GATE_{DAMP}$.

As shown in FIG. 15, a first terminal of the source capacitor $C_S$ is configured to receive the refresh current $i_{Refresh}$ from the refresh circuit 105 described above. The first terminal of the source capacitor $C_S$ is directly electrically connected to a cathode of the laser diode $D_L$, a first terminal of the damping resistor $R_{Damp}$, a first terminal of the bypass capacitor $C_{BP}$, and a first terminal of the inductor $L_S$. A second terminal of the source capacitor $C_S$ is directly electrically connected to a bias voltage node such as ground. A second terminal of the damping resistor $R_{Damp}$ is directly electrically connected to a first terminal of the damping switch $M_{DAMP}$, and a second terminal of the damping switch $M_{DAMP}$ is directly electrically connected to a bias voltage node such as ground. An anode of the laser diode $D_L$ is directly electrically connected to a second terminal of the bypass capacitor $C_{BP}$, a second terminal of the inductor $L_S$, and to a first terminal of the bypass switch $M_{BP}$. A second terminal of the bypass switch $M_{BP}$ is directly electrically connected to a bias voltage node such as ground.

The bypass switch $M_{BP}$ is configured to receive the bypass switch gate driver signal $GATE_{BP}$ at a gate node (e.g., from the controller 120), the bypass switch gate driver signal $GATE_{BP}$ being operable to turn the bypass switch $M_{BP}$ on or off based on a voltage level of the bypass switch gate driver signal $GATE_{BP}$. Similarly, the damping switch $M_{DAMP}$ is configured to receive the damping switch gate driver signal $GATE_{DAMP}$ at a gate node (e.g., from the controller 120), the damping switch gate driver signal $GATE_{DAMP}$ being operable to turn the damping switch $M_{DAMP}$ on or off based on a voltage level of the damping switch gate driver signal $GATE_{DAMP}$. Either or both of the bypass switch $M_{BP}$ and/or the damping switch $M_{DAMP}$ can be implemented as N-type switches or P-type switches. In some embodiments, the bypass switch $M_{BP}$ and/or the damping switch $M_{DAMP}$ are implemented as Silicon-based or Silicon-Carbide-based field-effect transistors (FETs).

In some embodiments, the pulsed laser diode driver 1501 is configured to receive the DC input voltage $V_{in}$ having a voltage range from about 10V to 20V, which is advantageously lower than an input voltage used by many conventional pulsed laser diode drivers. The inductor $L_S$ is a physical component added to the pulsed laser diode driver 1501 (i.e., as opposed to a representation of a parasitic inductance caused by components or interconnections such as bond wires). Similarly, the bypass capacitor $C_{BP}$ is a physical component added to the pulsed laser diode driver 1501 (i.e., as opposed to a representation of a parasitic capacitance). One advantage of using physical inductor and capacitor components rather than using parasitic inductances and capacitances is that values of the inductor $L_S$ and the bypass capacitor $C_{BP}$ can be easily modified by a designer or even an end-user. By comparison, conventional designs that rely on parasitic reactances may require re-design and/or re-layout to change an operating parameter.

As disclosed herein, values of the DC input voltage $V_{in}$, the inductance of the inductor $L_S$, the capacitance of the source capacitor $C_S$, the resistance of the damping resistor $R_{Damp}$, and the capacitance of the bypass capacitor $C_{BP}$ can advantageously be selected ("tuned") to achieve a desired operation of the pulsed laser diode driver 1501 (e.g., a charge time, a pulse width, a pulse voltage, a pulse current). For example, a pulse width of the current $i_{DL}$ flowing through the laser diode $D_L$ can be tuned by adjusting the capacitance value of the bypass capacitor $C_{BP}$. A peak current level of the pulse of current $i_{DL}$ flowing through the laser diode $D_L$ can be tuned by adjusting the source voltage $V_s$ on the source capacitor $C_S$. A capacitance value of the source capacitor $C_S$ can be tuned to adjust a timing delay of the high-current pulse and an upper range of the current $i_{DL}$ through the laser diode $D_L$. Resistance values of the damping resistor $R_{Damp}$ are dependent on the capacitance value of the source capacitor $C_S$ and can be tuned within a range of values such that at a lower resistance, a lower frequency resonance of the pulsed laser diode drivers disclosed herein is underdamped (e.g., at about $R_{Damp}=0.1$ Ohm), or is critically damped (e.g., at about $R_{Damp}=0.4$ Ohm). The damping resistor $R_{Damp}$ is operable to prevent current of the generated resonant waveform from becoming negative which could thereby enable a body diode of the bypass switch $M_{BP}$ or the damping switch $M_{DAMP}$. Although a resulting maximum current level of the current $i_{DL}$ through the laser diode $D_L$ is lower for the critically damped case, the current level can be easily adjusted by raising the voltage level of the DC input voltage $V_{in}$.

In some embodiments, the DC input voltage $V_{in}$ is about 15V, the inductance of the inductor $L_S$ is about 6 nH, the capacitance of the source capacitor $C_S$ is about 100 nF, the resistance of the damping resistor $R_{Damp}$ is about 0.1 Ohm, and the capacitance of the bypass capacitor $C_{BP}$ is about 1 nF. In some embodiments, a voltage at the first terminal of the damping resistor $R_{Damp}$ is received by the controller 120 to provide an indication of a current flow through the damping resistor $R_{Damp}$. In some embodiments, as shown by the dashed box, the resistance of the damping resistor $R_{Damp}$ is zero-Ohms (i.e., shorted) so as to rapidly discharge the source capacitor $C_S$. In such embodiments, a drain terminal of the damping switch $M_{DAMP}$ is directly electrically connected to a first terminal of the source capacitor $C_S$.

Typical resonant driver designs often require a damping resistor to minimize ringing duration. However, the added damping resistor $R_{Damp}$ dissipates power which may lower the overall power efficiency of the design as compared to a resonant driver that does not have a damping resistor. Thus, in some embodiments, the pulsed laser diode driver 1501 advantageously allows current to flow through the damping resistor $R_{Damp}$ during portions of a switching sequence (e.g., the switching sequence 300) in which the damping resistor $R_{Damp}$ critically damps ringing, and prevents current from flowing through the damping resistor $R_{Damp}$ during portions of the switching sequence when the damping resistor $R_{Damp}$ is not needed to damp ringing. The pulsed laser diode driver 1501 allows current to flow through the damping resistor $R_{Damp}$ by enabling the damping switch $M_{DAMP}$ and prevents current from flowing through the damping resistor $R_{Damp}$ by disabling the damping switch $M_{DAMP}$. Such dynamic control of current flow through the damping resistor $R_{Damp}$ advantageously increases an overall power efficiency of the pulsed laser diode driver 1501 as compared to a pulsed laser diode driver circuit that allows current to flow through a damping resistor for the entirety of a switching sequence.

During operation, the source capacitor $C_S$ is discharged through the inductor $L_S$ by the bypass switch $M_{BP}$. This configuration provides a maximum peak current through the laser diode $L_{DL}$ but requires the series damping resistor $R_{Damp}$ to prevent the waveform from ringing for a long duration. Until the ringing stops and the voltage and current are zero, the bypass switch $M_{BP}$ cannot be turned off. Unfortunately, the damping resistor $R_{Damp}$ dissipates power as long as current flows through the damping resistor $R_{Damp}$. Thus, the pulsed laser diode driver 1501 advantageously provides an optimal power efficiency by preventing current from flowing through the damping resistor $R_{Damp}$ during an initial precharge step (e.g., step 301 of FIG. 3), a preflux step (e.g., step 302 of FIG. 3), and a pulse generation step (e.g., step 303 of FIG. 3) of a switching sequence (e.g., the switching sequence 300 of FIG. 3). However, current is allowed, by the damping switch $M_{DAMP}$, to flow through the damping resistor $R_{Damp}$ after the high-current pulse has been generated (e.g., at step 303 of FIG. 3) to remove remaining ringing by critically damping the RLC network of the pulsed laser diode driver 1501. In some embodiments, the damping resistor $R_{Damp}$ is zero-ohms, or is a shorted connection, thereby allowing the damping switch $M_{DAMP}$ to rapidly discharge the source capacitor $C_S$ after pulse emission.

During the precharge step (e.g., step 301 of FIG. 3), the preflux step (e.g., step 302 of FIG. 3), and the pulse generation step (e.g., step 303 of FIG. 3) of the switching sequence (e.g., the switching sequence 300 of FIG. 3), the damping switch $M_{DAMP}$ is disabled, thereby creating an undamped LC network. However, after pulse generation, the damping switch $M_{DAMP}$ is enabled and the damping resistor $R_{Damp}$ creates a parallel RLC network to critically damp ringing and thereby provide a maximum power efficiency and fast recovery of the pulsed laser diode driver 1501 to start a next switching sequence.

Figure 16A:
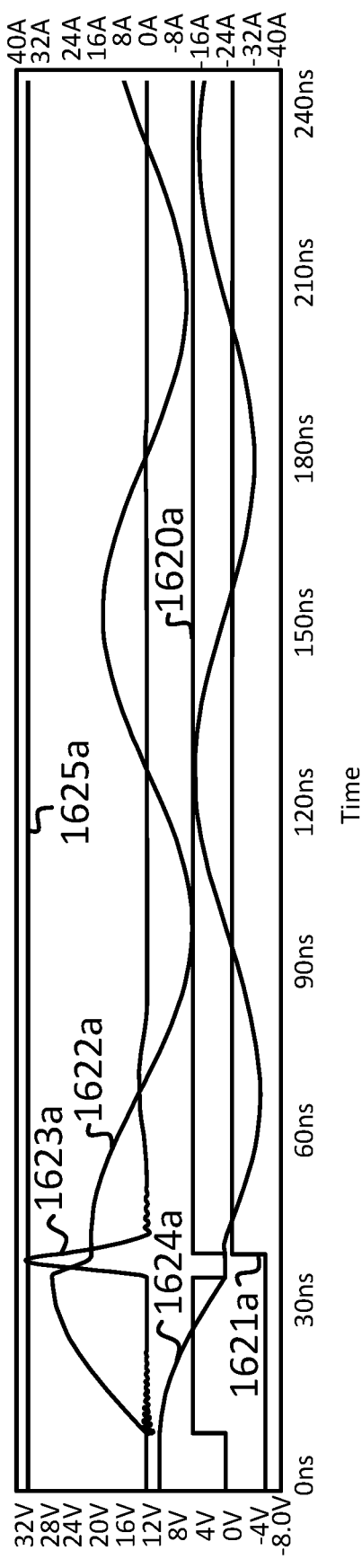
FIGS. 16A-16B show simplified plots of signals related to operation of the pulsed laser diode driver shown in FIG. 15, in accordance with some embodiments.
Figure 16B:
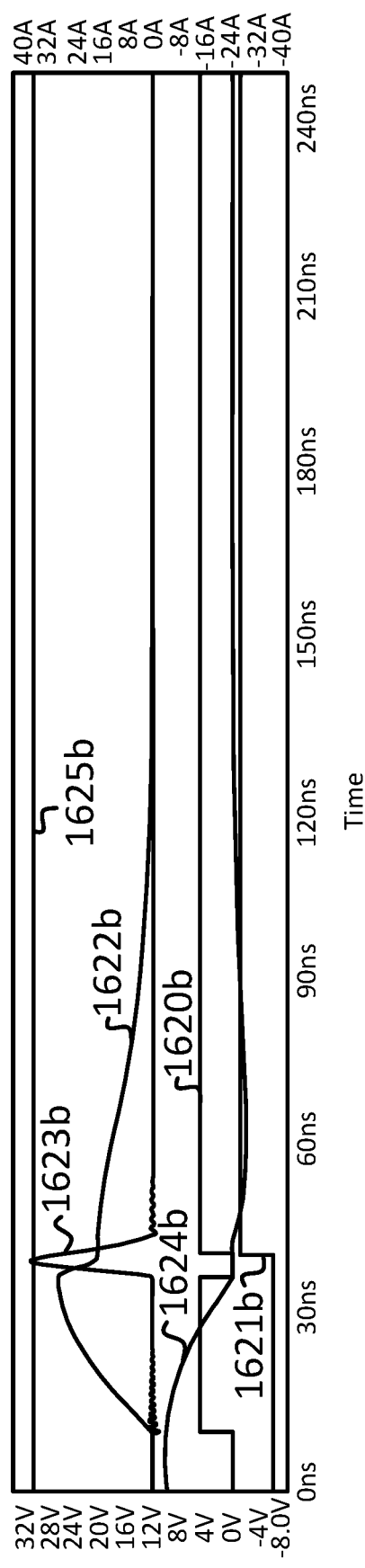

For example, FIGS. 16A-16B show simplified plots, 1620a-b, 1621a-b, 1622a-b, 1623a-b, 1624a-b, and 1625a-b, of signals related to operation of the pulsed laser diode driver 1501 shown in FIG. 15, in accordance with some embodiments. In particular, FIG. 16A illustrates operation of the pulsed laser diode driver 1501 when a damping resistor (i.e., the damping resistor $R_{Damp}$) underdamps ringing of the pulsed laser diode driver 1501. In comparison, FIG. 16B illustrates operation of the pulsed laser diode driver 1501 when a damping resistor (i.e., the damping resistor $R_{Damp}$) is used to critically damp ringing of the pulsed laser diode driver 1501.

With reference to FIGS. 16A-16B, the simplified plots illustrate voltage plots of the bypass switch gate driver signal $GATE_{BP}$ 1620a-b, voltage plots of the damping switch gate driver signal $GATE_{DAMP}$ 1621a-b, current plots of the current $i_{LS}$ through the inductor $L_S$ 1622a-b, current plots of the current $i_{DL}$ through the laser diode $D_L$ 1623a-b, voltage plots of the source voltage $V_S$ 1624a-b at the source capacitor $C_S$, and voltage and current plots 1625a-b of a voltage and current source used to establish a plot scale, all over the same duration of time. Details of these signals are described below. The voltage plots of the bypass switch gate driver signal $GATE_{BP}$ 1620a-b and the damping switch gate driver signal $GATE_{DAMP}$ 1621a-b have been level-shifted for readability, but are, in actuality, low voltage inputs. Additionally, the voltage plots of the bypass switch gate driver signal $GATE_{BP}$ 1620a-b and the damping switch gate driver signal $GATE_{DAMP}$ 1621a-b assume that the damping switch $M_{DAMP}$ and the bypass switch $M_{BP}$ are NFET devices. However, if PFET devices are used instead, the polarity of the bypass switch gate driver signal $GATE_{BP}$ 1620a-b and the damping switch gate driver signal $GATE_{DAMP}$ 1621a-b are inverted.

In the example shown in FIG. 16A, with reference to FIG. 15, a resistance value of 10 Ohms is used for the damping resistor $R_{Damp}$ of the pulsed laser diode driver 1501 in which $L_S$=6 nH, $C_{BP}$=1 nF, and $L_{DL}$ is about 1 nH. As expected, the waveforms 1622a and 1624a are very underdamped as shown by prolonged oscillations (i.e., "ringing"). As is known in the art, for a parallel RLC circuit, the damping coefficient d is expressed as:

$$d = \frac{1}{2R} \times \sqrt{\frac{L}{C}}. \quad \text{(Equation 1)}$$

Thus, if a critically damped waveform is desired, an optimal resistance R value of the damping resistor $R_{Damp}$ can be determined by setting the damping coefficient d in Equation 1 to a value of d=1 and solving Equation 1 for R using the values mentioned above. In the example shown in FIG. 16B, a resistance value of 0.175 Ohms is used for the damping resistor $R_{Damp}$ of the pulsed laser diode driver 1501. As expected, the waveforms 1622b and 1624b are thereby critically damped as shown by the absence of prolonged oscillations (i.e., "ringing").

In some embodiments, the damping resistor $R_{Damp}$ can be eliminated by using a weak switch having an on-resistance Rdson that is about the desired resistance value determined using Equation 1. In such embodiments, if adjustment of the resistance value is desired, a segmented FET can be used to thereby allow the on-resistance Rdson to be modified to match the damping resistance required.

Additionally, although it would initially appear that placing the source capacitor $C_S$ in series with the laser diode $D_L$ would raise the required anode voltage to pulse the laser diode $D_L$, the voltage and current of the source capacitor $C_S$ are 90-degrees out of phase with one another. As shown by waveforms 1624a-b, because the current pulse (i.e., 1623a-b) through the laser diode $D_L$ is advantageously aligned with a peak current amplitude, voltage at the source capacitor $C_S$ at that time is zero due to the 90-degree phase shift. In some embodiments, a beginning of the high-current pulse could be determined by sensing when the source voltage $V_S$ at the source capacitor $C_S$ is at zero, at which point the high-current pulse through the laser diode $D_L$ should begin.

For some applications, the amplitude of a high-current pulse delivered by a resonant circuit such as any of those disclosed herein may need to be adjusted in amplitude from pulse-to-pulse. Thus, in some embodiments, any of the pulsed laser drivers disclosed herein are advantageously operable to configure an amplitude of the high-current pulse delivered to one or more laser diodes on a pulse-to-pulse basis. In such embodiment, the DC input voltage $V_{in}$ is advantageously provided by an adjustable voltage supply (i.e., a digital-to-analog converter (DAC)). In some embodiments, an output voltage level of the adjustable voltage supply is set using the controller 120. Use of an adjustable voltage supply, such as a DAC, to provide the DC input voltage $V_{in}$ to the pulsed laser diode driver circuits disclosed herein is possible because of the advantageously low input voltage requirements for such embodiments. In some embodiments, the adjustable voltage supply is clocked such that the adjustable voltage supply charges the source capacitor $C_S$ described herein only during a first portion of a clock period (e.g., a positive portion). As such, the value of the DC input voltage $V_{in}$ and a current amplitude of the high-current pulse delivered to the laser diode(s) disclosed herein may be advantageously varied between consecutive high-current pulses through the laser diode(s).

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. An apparatus comprising:
    a refresh circuit configured to receive a DC input voltage and to provide a refresh current to a capacitor using the DC input voltage, wherein a current amplitude of the refresh current is controlled by the refresh circuit based on a voltage developed at the capacitor in response to the refresh current; and
    wherein the refresh circuit comprises:
    an attenuator circuit configured to generate a representative voltage signal based on the voltage developed at the capacitor;
    a threshold voltage generator circuit configured to generate a plurality of threshold voltages based on a specified maximum target voltage that the capacitor should be charged to;
    a plurality of comparators configured to generate a plurality of comparison signals based on respective comparisons of the representative voltage signal to the plurality of threshold voltages; and
    a drive configuration circuit configured to receive the plurality of comparison signals and to control the amplitude of the refresh current based on the plurality of comparison signals.

2. The apparatus of claim 1, wherein:
    the threshold voltage generator circuit generates the plurality of threshold voltages having respective voltage levels that are further based on a specified refresh repetition rate of the capacitor.

3. The apparatus of claim 2, wherein:
    a voltage level of one or more threshold voltages of the plurality of threshold voltages is adjusted by the threshold voltage generator circuit if an achieved refresh repetition rate for the capacitor is not equal to the specified refresh repetition rate.

4. The apparatus of claim 1, wherein:
    a voltage level of one or more threshold voltages of the plurality of threshold voltages is adjusted by the threshold voltage generator circuit if the voltage developed at the capacitor exceeds the specified maximum target voltage.

5. The apparatus of claim 1, wherein:
    a first threshold voltage of the plurality of threshold voltages is greater than 80% of the specified maximum target voltage;
    a second threshold voltage of the plurality of threshold voltages is greater than 90% of the specified maximum target voltage; and
    a third threshold voltage of the plurality of threshold voltages is about equal to the specified maximum target voltage.

6. The apparatus of claim 1, wherein:
    the drive configuration circuit comprises a plurality of switches; and
    each comparator of the plurality of comparators controls a respective set of switches of the plurality of switches.

7. The apparatus of claim 6, wherein:
    a number of switches in each set of switches is configured based on a specified refresh repetition rate of the capacitor.

8. The apparatus of claim 7, wherein:
    the number of switches in each set of switches is adjusted if an achieved refresh repetition rate of the capacitor is not equal to the specified refresh repetition rate.

9. The apparatus of claim 6, wherein:
    a number of switches in one or more sets of switches is changed from a previous number of switches if the voltage developed at the capacitor exceeds the specified maximum target voltage.

10. The apparatus of claim 6, wherein:
    a first comparator of the plurality of comparators controls a first set of switches of the plurality of switches; and
    a second comparator of the plurality of comparators controls a second set of switches of the plurality of switches, the second set of switches having fewer switches than the first set of switches.

11. The apparatus of claim 1, wherein the refresh circuit further comprises:
    a plurality of logic AND gates, each having i) a first terminal configured to receive a comparison signal from a respective comparator of the plurality of comparators, and ii) a second terminal to receive an enable signal from a control circuit;
    wherein the enable signal is operable to control when the refresh circuit generates the refresh current to charge the capacitor.

12. The apparatus of claim 1, wherein:
    the capacitor is a source capacitor having i) a first terminal directly electrically connected to the refresh circuit to receive the refresh current and to develop the voltage at the source capacitor therefrom, and ii) a second terminal electrically coupled to ground; and
    the apparatus further comprises:
    an inductor having a first terminal that is directly electrically connected to the first terminal of the source capacitor; and one or more switches configured to control a current flow through the inductor to produce a high-current pulse through a laser diode, the high-current pulse corresponding to a peak current of a resonant waveform developed at an anode of the laser diode.

* * * * *